(12) United States Patent
Hamaguchi et al.

(10) Patent No.: US 10,032,920 B2
(45) Date of Patent: Jul. 24, 2018

(54) THIN FILM TRANSISTOR AND MOS FIELD EFFECT TRANSISTOR THAT INCLUDE HYDROPHILIC/HYDROPHOBIC MATERIAL, AND METHODS FOR MANUFACTURING THE SAME

(71) Applicant: JSR Corporation, Tokyo (JP)

(72) Inventors: Hitoshi Hamaguchi, Tokyo (JP); Kenrou Tanaka, Tokyo (JP); Kenzou Ookita, Tokyo (JP); Keisuke Kuriyama, Tokyo (JP)

(73) Assignee: JSR Corporation, Tokyo (JP)

( * ) Notice: Subject to any disclaimer, the term of this patent is extended or adjusted under 35 U.S.C. 154(b) by 0 days.

(21) Appl. No.: 15/582,823

(22) Filed: May 1, 2017

(65) Prior Publication Data
US 2017/0243980 A1   Aug. 24, 2017

Related U.S. Application Data

(63) Continuation of application No. PCT/JP2015/080491, filed on Oct. 29, 2015.

(30) Foreign Application Priority Data

Oct. 31, 2014 (JP) .................................. 2014-223718

(51) Int. Cl.
*H01L 27/12* (2006.01)
*H01L 29/786* (2006.01)
(Continued)

(52) U.S. Cl.
CPC ...... *H01L 29/78636* (2013.01); *H01L 21/288* (2013.01); *H01L 29/66742* (2013.01)

(58) Field of Classification Search
CPC ......... H01L 29/78636; H01L 29/66742; H01L 29/42384; H01L 21/288; H01L 21/31051;
(Continued)

(56) References Cited

U.S. PATENT DOCUMENTS

| 2003/0122495 A1* | 7/2003 | Nakanishi ........... G02F 1/13454 315/169.3 |
| 2004/0188688 A1* | 9/2004 | Muranaka ............... H01L 27/12 257/72 |

(Continued)

FOREIGN PATENT DOCUMENTS

| CN | 1825548 A | 8/2006 |
| DE | 602005025074 B | 1/2011 |

(Continued)

OTHER PUBLICATIONS

Written Opinion of the International Search Authority dated Jan. 19, 2016 for corresponding PCT Application No. PCT/JP2015/080491, with English Translation.

(Continued)

*Primary Examiner* — Khiem D Nguyen
(74) *Attorney, Agent, or Firm* — Typha IP LLC

(57) ABSTRACT

The thin film transistor includes a first insulating layer provided on a substrate; a source electrode and a drain electrode that are provided on the first insulating layer; a semiconductor layer provided so as to cover the first insulating layer, the source electrode, and the drain electrode; a second insulating layer provided on the semiconductor layer; and a gate electrode provided on the second insulating layer, in which the first insulating layer is formed of a hydrophilic/hydrophobic material and has a recess portion, and the source electrode and the drain electrode are provided so as to fill the recess portion of the first insulating layer.

1 Claim, 44 Drawing Sheets

(51) Int. Cl.
*H01L 29/66* (2006.01)
*H01L 21/288* (2006.01)

(58) Field of Classification Search
CPC .............. H01L 51/0004; H01L 27/1292; H01L 51/0022; H01L 51/0005; H01L 29/7869; H01L 21/02164; H01L 27/3262; H01L 27/1251

See application file for complete search history.

(56) References Cited

U.S. PATENT DOCUMENTS

| | | | |
|---|---|---|---|
| 2006/0145146 | A1 | 7/2006 | Suh et al. |
| 2012/0312583 | A1 | 12/2012 | Suzuki et al. |
| 2016/0062242 | A1 | 5/2016 | Hamaguchi et al. |

FOREIGN PATENT DOCUMENTS

| | | | |
|---|---|---|---|
| EP | 1670079 | A2 | 6/2006 |
| EP | 2533103 | A1 | 12/2012 |
| JP | H04-302436 | A | 10/1992 |
| JP | 2006-163418 | A1 | 6/2006 |
| JP | 2006-237521 | A | 9/2006 |
| JP | 2009-235964 | A | 10/2009 |
| JP | 2010-159350 | A | 7/2010 |
| JP | 2011-122177 | A | 6/2011 |
| JP | 2011-178006 | A | 9/2011 |
| JP | 2011-241309 | A | 12/2011 |
| JP | 2013-016773 | A | 1/2013 |
| JP | 2015-192006 | A | 11/2015 |
| KR | 10-2006-0064318 | A | 6/2006 |
| KR | 10-2006-0108791 | A | 10/2006 |
| WO | 2014/178279 | A1 | 11/2014 |

OTHER PUBLICATIONS

International Search Report dated Jan. 19, 2016 for the PCT application No. PCT/JP2015/080491.

\* cited by examiner

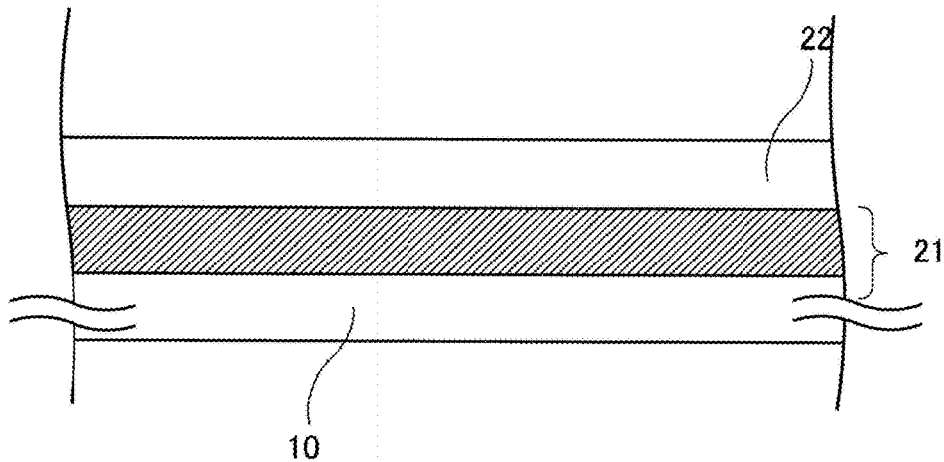
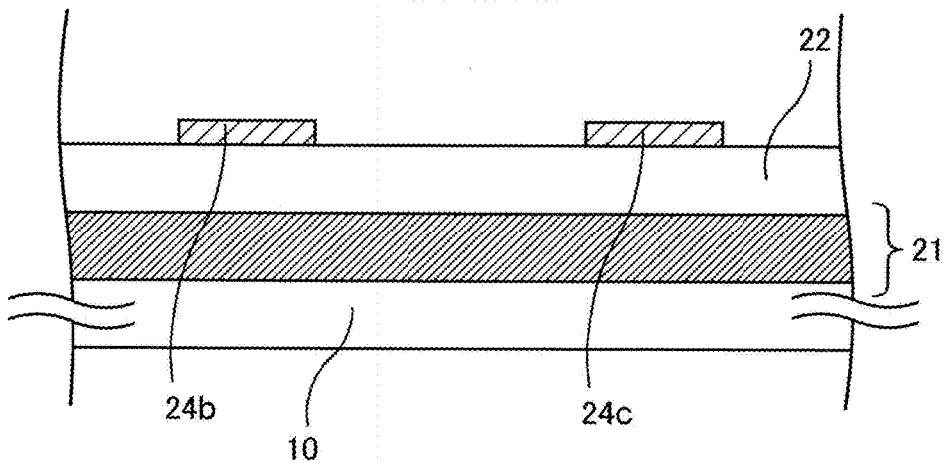
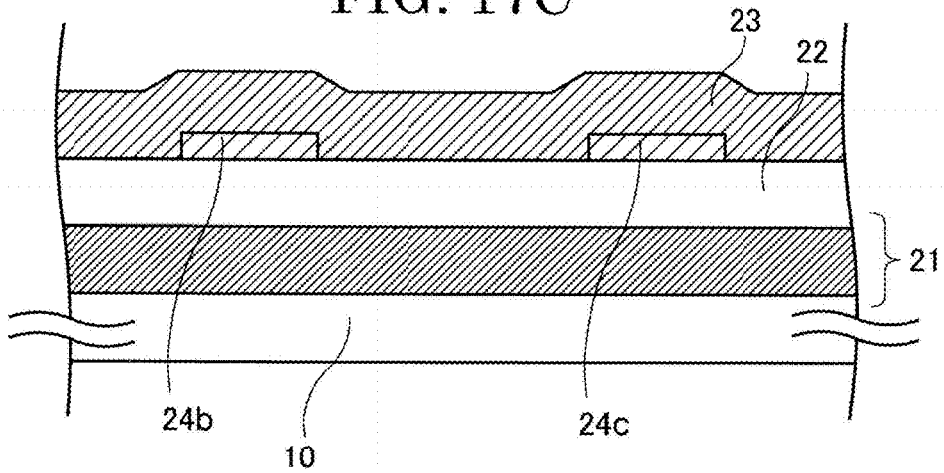

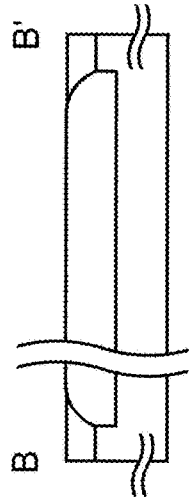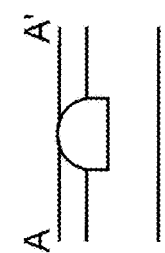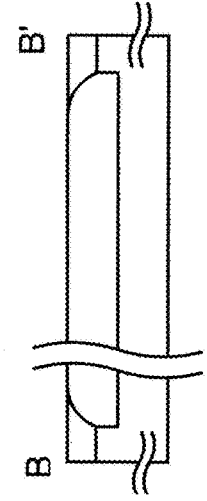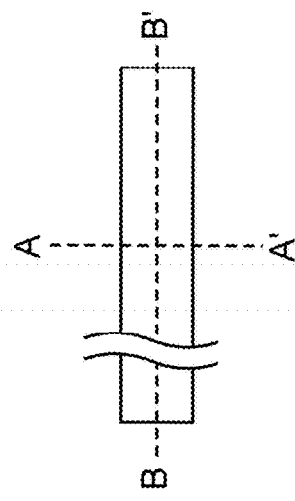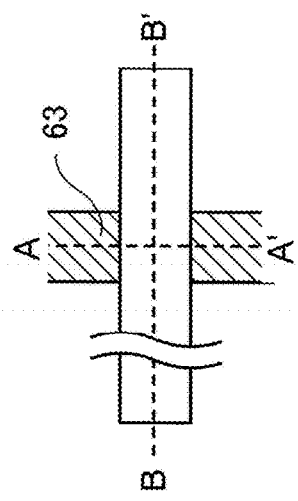

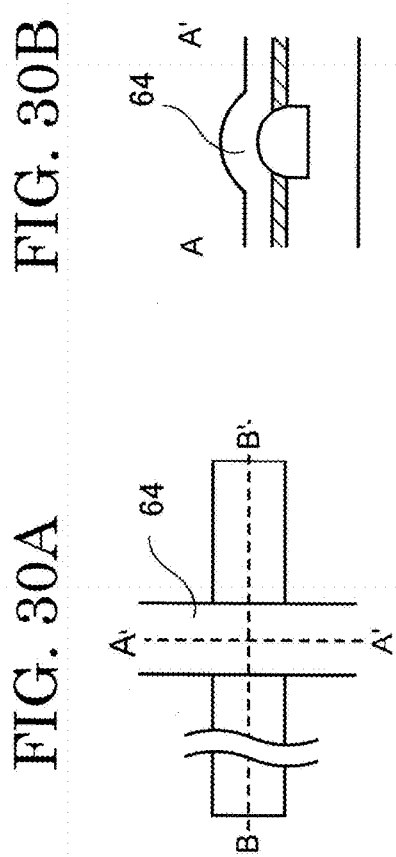
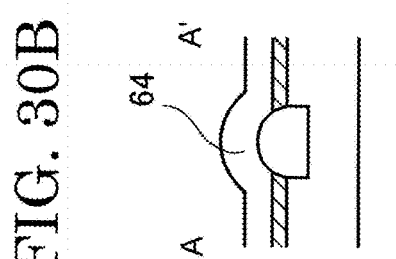
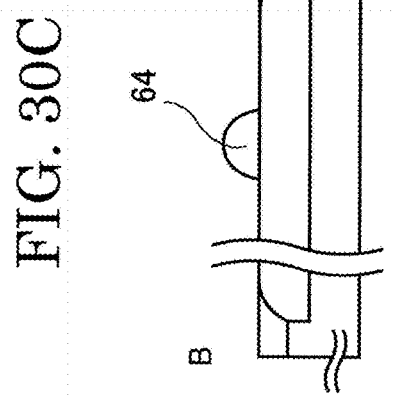

THIN FILM TRANSISTOR AND MOS FIELD EFFECT TRANSISTOR THAT INCLUDE HYDROPHILIC/HYDROPHOBIC MATERIAL, AND METHODS FOR MANUFACTURING THE SAME

CROSS-REFERENCE TO RELATED APPLICATIONS

This application is based upon and claims the benefit of priority from the prior Japanese Patent Application No. 2014-223718, filed on Oct. 31, 2014, and PCT International Patent Application No. PCT/JP2015/080491, filed on Oct. 29, 2015, the entire contents of which are incorporated herein by reference.

FIELD

The present invention relates to a thin film transistor and a MOS field effect transistor that include a hydrophilic/hydrophobic material, and methods for manufacturing the transistors. The thin film transistors and the MOS field effect transistor are used for electronic devices.

BACKGROUND

Mobile information devices, such as liquid crystal displays, mobile phones, and tablets, and electronic devices, such as digital cameras, organic EL displays, organic EL lighting, and sensors, have been desired not only to be smaller and thinner, but also to offer further higher performance. As a method for manufacturing such electronic devices more inexpensively, printed electronics by which wiring is directly printed has attracted attention.

Thin film transistors and electronic circuits including such transistors are produced by laminating various thin films, such as semiconductors, insulators, and electric conductors, on a substrate and suitably forming a predetermined pattern with photolithography. Photolithography is a technique in which, for example, a circuit pattern formed of a material impervious to light on a transparent flat plate called a photomask is transferred onto a target substrate by making use of light, and the technique has been widely made use of in a process for manufacturing, for example, semiconductor integrated circuits.

Conventional production processes using photolithography require multiple steps, such as exposure, development, baking, and peeling, even only for a mask pattern formed of a photosensitive organic resin material called photoresist. Hence, as the number of photolithographic steps increased, a production cost is also increased. To solve these problems, an attempt of manufacturing a thin film transistor with reducing photolithographic steps has been made.

Furthermore, in recent years, substrates are becoming increasingly larger in area. With this increase, vacuum apparatuses, such as CVD systems, are remarkably becoming huge in size; prices for the apparatuses are remarkably rising; and power consumption is remarkably being increased, and accordingly, production cost tends to increase. Against this background, for example, with the aim of process cost reduction, a non-vacuum process has been attracting attention. The non-vacuum process offers advantages, such as reduction in capital investment and running cost, and simpler maintenance.

The production of electronic components by printing processes allows a multistage process typically including exposure and development and a vacuum process such as vapor deposition to be bypassed, and hence, a much simpler process can be expected.

Printing processes, such as ink-jet printing, screen printing, gravure printing, and gravure offset printing, enable a wiring of a desired pattern to be formed directly on a substrate, and are therefore made use of as a simpler and low-cost process. However, a film-forming material used flows when a wiring of a desired pattern is formed, and as a result, wet-spreading and bleeding of the material, and accordingly there was a limit to what a wiring and electronic devices that have a fine pattern with excellent linearity are produced by such printing processes.

SUMMARY

A thin film transistor according to an embodiment of the present invention includes a first insulating layer provided on a substrate, a source electrode and a drain electrode that are provided on the first insulating layer, a semiconductor layer provided so as to cover the first insulating layer, the source electrode, and the drain electrode, a second insulating layer provided on the semiconductor layer, and a gate electrode provided on the second insulating layer, in which the first insulating layer is formed of a hydrophilic/hydrophobic material and has a recess portion, and the source electrode and the drain electrode are provided so as to fill the recess portion of the first insulating layer.

A thin film transistor according to an embodiment of the present invention includes a semiconductor layer provided on a substrate, a source electrode and a drain electrode that are provided on the semiconductor layer, an insulating layer provided so as to cover the semiconductor layer, the source electrode, and the drain electrode, and a gate electrode provided on the insulating layer, in which the insulating layer is formed of a hydrophilic/hydrophobic material and has a recess portion, and the gate electrode is formed so as to fill the recess portion of the insulating layer.

A thin film transistor according to an embodiment of the present invention includes a first insulating layer provided on a substrate, a gate electrode provided on the first insulating layer, a second insulating layer provided so as to cover the first insulating layer and the gate electrode, a source electrode and a drain electrode that are provided on the second insulating layer, and a semiconductor layer provided so as to cover the second insulating layer, the source electrode, and the drain electrode, in which the first insulating layer is formed of a hydrophilic/hydrophobic material and has a recess portion, and the gate electrode is provided so as to fill the recess portion of the first insulating layer.

A thin film transistor according to an embodiment of the present invention includes a first insulating layer provided on a substrate, a gate electrode provided on the first insulating layer, a second insulating layer provided so as to cover the first insulating layer and the gate electrode, a semiconductor layer provided on the second insulating layer, and a source electrode and a drain electrode that are provided on the semiconductor layer, in which the first insulating layer is formed of a hydrophilic/hydrophobic material and has a recess portion, and the gate electrode is formed so as to fill the recess portion of the first insulating layer.

A method for manufacturing a thin film transistor according to an embodiment of the present invention, the method including forming a first insulating layer formed of a hydrophilic/hydrophobic material on a first surface of a substrate, forming a source electrode and a drain electrode on the first insulating layer, forming a semiconductor layer so as to cover the first insulating layer, the source electrode, and the drain electrode, forming a second insulating layer on the semiconductor layer, and forming a gate electrode on the second insulating layer, in which the step of forming the source electrode and the drain electrode includes, irradiating a source electrode formation region and a drain electrode formation region on the first insulating layer with energy of a specific wavelength to make lyophilic the source electrode formation region and the drain electrode formation region and form a recess portion therein, and applying a metal-containing solution onto the first insulating layer to form the source electrode and the drain electrode in the source electrode formation region and the drain electrode formation region, respectively.

A method for manufacturing a thin film transistor according to an embodiment of the present invention, the method comprising, forming a semiconductor layer on a first surface of a substrate, forming a source electrode and a drain electrode on the semiconductor layer, forming an insulating layer formed of a hydrophilic/hydrophobic material so as to cover the semiconductor layer, the source electrode, and the drain electrode, and forming a gate electrode on the insulating layer, in which the step of forming the gate electrode includes, irradiating a gate electrode formation region on the insulating layer with energy of a specific wavelength to make the gate electrode formation region lyophilic and form a recess portion therein, and applying a metal-containing solution onto the insulating layer to form the gate electrode in the gate electrode formation region.

A method for manufacturing a thin film transistor according to an embodiment of the present invention, the method comprising, forming a first insulating layer formed of a hydrophilic/hydrophobic material on a first surface of a substrate, forming a gate electrode on the first insulating layer, forming a second insulating layer so as to cover the first insulating layer and the gate electrode, forming a source electrode and a drain electrode on the second insulating layer, and forming a semiconductor layer so as to cover the second insulating layer, the source electrode, and the drain electrode, in which the step of forming the gate electrode includes, irradiating a gate electrode formation region on the first insulating layer with energy of a specific wavelength to make the gate electrode formation region lyophilic and form a recess portion therein, and applying a metal-containing solution onto the first insulating layer to form the gate electrode in the gate electrode formation region.

A method for manufacturing a thin film transistor according to an embodiment of the present invention, the method including forming a first insulating layer formed of a hydrophilic/hydrophobic material on a first surface of a substrate, forming a gate electrode on the first insulating layer, forming a second insulating layer so as to cover the first insulating layer and the gate electrode, forming a semiconductor layer on the second insulating layer, and forming a source electrode and a drain electrode on the semiconductor layer, in which the step of forming the gate electrode includes, irradiating a gate electrode formation region on the first insulating layer with energy of a specific wavelength to make the gate electrode formation region lyophilic and form a recess portion therein, and applying a metal-containing solution onto the first insulating layer to form the gate electrode in the gate electrode formation region.

A MOS field effect transistor according to an embodiment of the present invention includes an active layer, a gate insulating film provided so as to cover the active layer, a gate electrode provided on the gate insulating film, an interlayer insulating film provided so as to cover the gate electrode, a contact opening portion provided in the interlayer insulating film, and a source electrode and a drain electrode that are provided by filling the contact opening portion with metal, in which the interlayer insulating film is formed of a hydrophilic/hydrophobic material and has a recess portion in the source electrode formation region and the drain electrode formation region, the contact opening portion is provided so as to penetrate a diffusion layer from the recess portion, and the source electrode and the drain electrode are provided so as to fill the recess portion.

A method for manufacturing a MOS field effect transistor according to an embodiment of the present invention includes forming a gate insulating film on an active layer, forming a gate electrode on the gate insulating film, forming an interlayer insulating film formed of a hydrophilic/hydrophobic material so as to cover the gate electrode, irradiating a source electrode formation region and a drain electrode formation region on the interlayer insulating layer with energy of a specific wavelength to form a recess portion in the source electrode formation region and the drain electrode formation region, forming a contact opening portion, and filing the contact opening portion with metal so that the source electrode and the drain electrode are formed so as to fill the recess portion.

BRIEF DESCRIPTION OF DRAWINGS

FIG. 17A to FIG. 17C are a cross-sectional view illustrating a method for manufacturing the thin film transistor according to the second embodiment of the present invention;

FIG. 29A to FIG. 29F are a cross-sectional view illustrating the step of forming the wiring contact according to the sixth embodiment of the present invention;

FIG. 30A to FIG. 30C are a cross-sectional view illustrating the step of forming the wiring contact according to the sixth embodiment of the present invention;

DESCRIPTION OF EMBODIMENTS

Figure 1A:
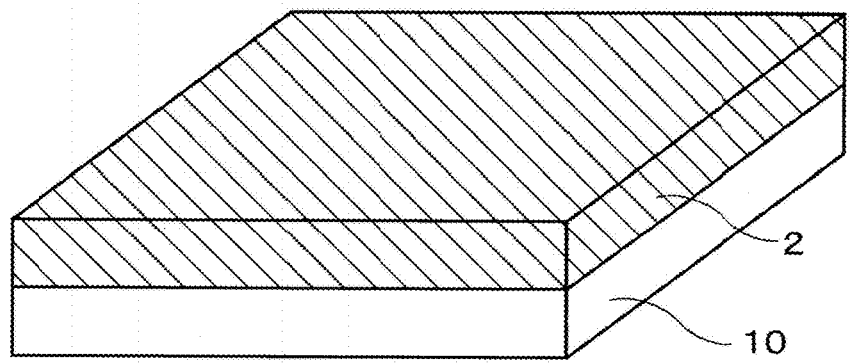
FIG. 1A to FIG. 1O are a cross-sectional view showing the step of forming a radiation-sensitive composition film formed on a substrate.

Hereinafter, embodiments of the present invention will be described in detail with reference to the drawings. It should be noted that embodiments described below are examples of the embodiments of the present invention, and the present invention is not limited to any of these embodiments. In addition, in the drawings referred in the embodiments, the same portions or portions having similar functions will be assigned the same or similar reference numerals, and duplicate description thereof will be sometimes omitted. In addition, for the sake of explanatory convenience, the dimensional ratios in the drawings sometimes differ from actual dimensional ratios and a part of a configuration is sometimes omitted from the drawings.

The inventors have completed a base film material that prevents wet-spreading and bleeding of a film-forming ink and allows a fine pattern to be formed. In this specification, the material is called a hydrophilic/hydrophobic material because of the following properties of the material. The hydrophilic/hydrophobic material allows a hydrophilic portion and a hydrophobic portion to be formed with heat, and also allows a hydrophilic portion and a hydrophobic portion to be formed with radiation irradiation. In particular, a hydrophilic/hydrophobic material that allows a hydrophilic portion and a hydrophobic portion to be formed with radiation irradiation is called a radiation-sensitive composition.

The radiation-sensitive composition is characterized by including a compound having an acid dissociative group and an acid generator.

A solution formed of the radiation-sensitive composition is applied onto a substrate to form a film, and the resulting film is irradiated with radiation, whereby the acid dissociative group leaves because of the effect of the acid generator, and volatilizes. As a result, the film thickness of an irradiated portion is thinner than the film thickness of a non-irradiated portion, and a recess pattern is formed. At this time, when the acid dissociative group has a fluorine atom, the resulting film and the non-irradiated portion are lyophobic, but, with the elimination of the acid dissociative group, the irradiated portion is more lyophilic than the non-irradiated portion.

In the present specification, an insulating layer formed by applying a solution formed of the radiation-sensitive composition to a substrate as described above is called a hydrophilic/hydrophobic material.

When a film-forming material in liquid form is applied onto such hydrophilic/hydrophobic material in which the recess pattern is formed by radiation irradiation, the difference in film thickness between a projection portion and a recess portion causes the film-forming material to gather easily on the recess portion owing to the unevenness of the film surface. However, not only the effect of this film surface form, but also lyophilic/lyophobic properties of this surface allow the film-forming material to gather easily on the recess portion, and allow a wiring having a desired form, specifically a fine pattern to be easily formed.

The use of such properties of the hydrophilic/hydrophobic material allows the provision of a method for manufacturing an electronic device which method allows a reduction in the number of photolithographic steps and the formation of a fine pattern, and allows the provision of an electronic device obtained by the method. First, a radiation-sensitive composition used for the electronic device according to the present invention will be described below.

First, the radiation-sensitive composition, in particular, a compound suitable as a component of the radiation-sensitive composition according to the embodiment of the present invention will be described. Then, a method for manufacturing a base material having a recess pattern of the radiation-sensitive composition used for the electronic device according to the present invention will be described.

Radiation-Sensitive Composition

The radiation-sensitive composition used for the electronic device according to the present invention is suitably used for an insulating layer having a recess pattern which layer constitutes the electronic device according to the present invention.

The radiation-sensitive composition used for the electronic device according to the present invention (hereinafter, sometimes, simply referred to as the composition) includes a compound having an acid dissociative group (hereinafter, sometimes, simply referred to as a compound {A}) as a component.

Besides the compound {A}, the composition of the present embodiment may include a solvent. Furthermore, the composition of the present embodiment may include an acid generator. Furthermore, the composition of the present embodiment may include a polymerizable compound having an ethylene unsaturated bond, and furthermore, may include a radiation-sensitive polymerization initiator.

The composition of the present embodiment is in liquid form when including a solvent (hereinafter, sometimes referred to as a solvent {B}), forms a film when applied, and allows a base layer to be easily formed.

Furthermore, when including an acid generator (hereinafter, sometimes referred to as an acid generator {C}), the composition of the present embodiment can have a desired high radiation sensitivity. The composition may further include a sensitizer (hereinafter, sometimes referred to as a sensitizer {D}) as an ancillary to the acid generator. Furthermore, the composition may further include a quencher (hereinafter, sometimes referred to as a quencher {E}) as an inhibitor of acid diffusion from the acid generator.

Furthermore, the composition of the present embodiment may include a polymerizable compound having an ethylene unsaturated bond (hereinafter, sometimes referred to as the polymerizable compound {F}). The composition of the present embodiment may further include a radiation-sensitive polymerization initiator (hereinafter, sometimes referred to as a radiation-sensitive polymerization initiator {G}).

Furthermore, the composition may include other optional components as long as the composition loses its properties that are made use of in the production of the electronic device according to the present invention and are such that, with energy irradiation, the composition becomes lyophilic and a recess portion is formed therein.

The viscosity of the composition (temperature: 20° C., shear rate: 10 sec-1) may be adjusted in accordance with a desired application method and the film thickness of a desired film to be formed.

{A} Compound Having Acid Dissociative Group

The compound having an acid dissociative group {A} (the compound {A}) serving as a component of the radiation-sensitive composition of the present embodiment has a group including at least one structure unit selected from the group consisting of an acetal bond and a hemiacetal ester bond. More specifically, the compound {A} has a group preferably including structure units of the following formulae (1-1) and/or (1-2).

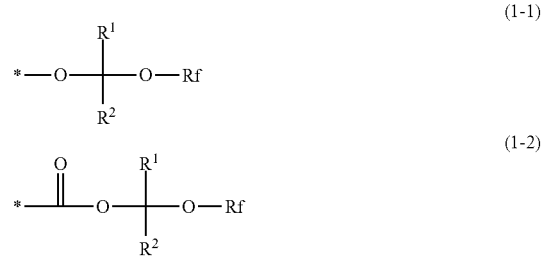

(where $R^1$ and $R^2$ are independently a hydrogen atom or a methyl group; Rf is independently an organic group substituted with a fluorine atom; and * is a binding site.)

The compound having an acetal bond can be obtained by reacting an alcohol with a compound having a $CH_2\!=\!C(R^1)\!-\!O\!-$ group. The compound having a hemiacetal ester bond can be obtained by reacting a carboxylic acid with a compound having a $CH_2\!=\!C(R^1)\!-\!O\!-$ group.

As of the Rf include an organic group having a fluorine atom. For example, as the Rf, groups of the following formulae (1-1-1) to (1-1-33) are preferable.

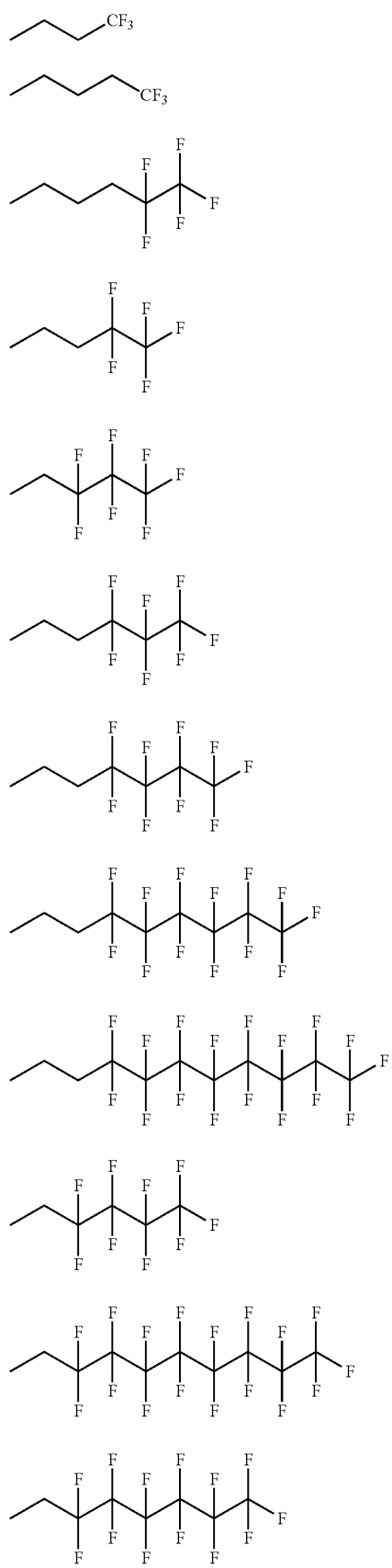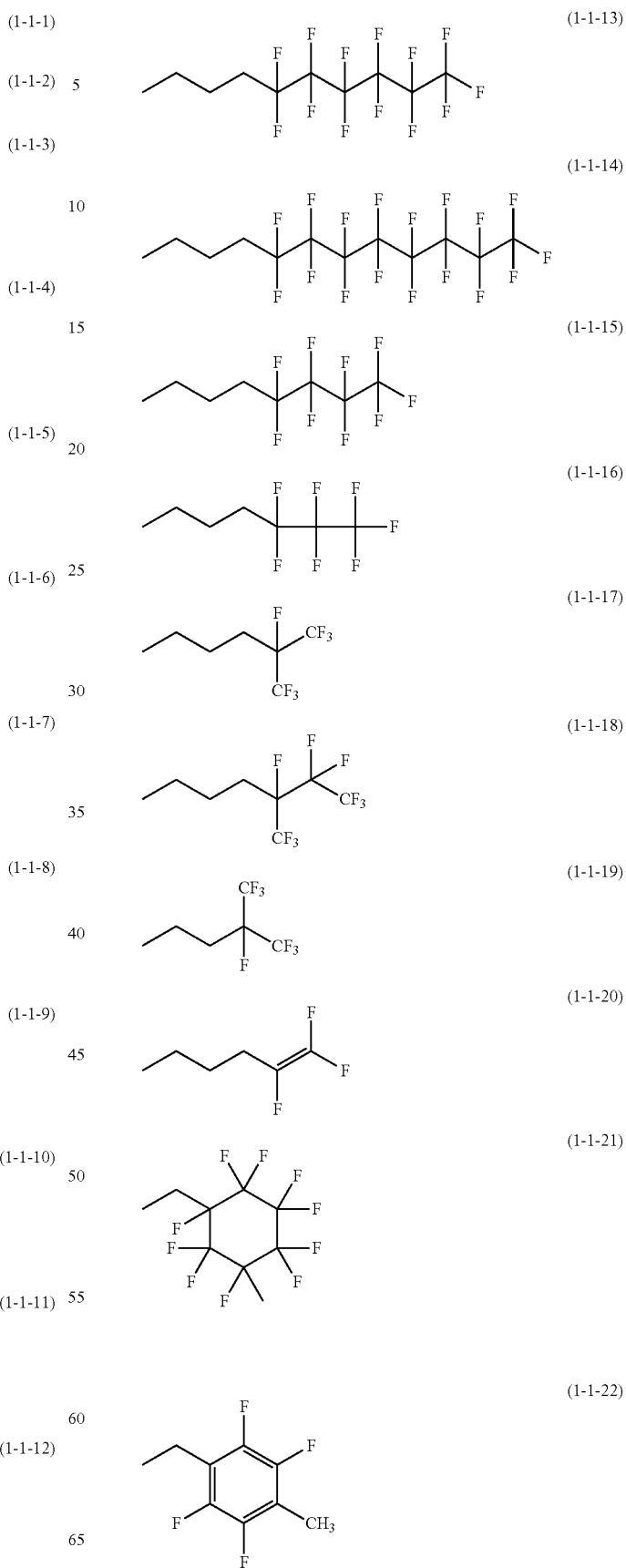

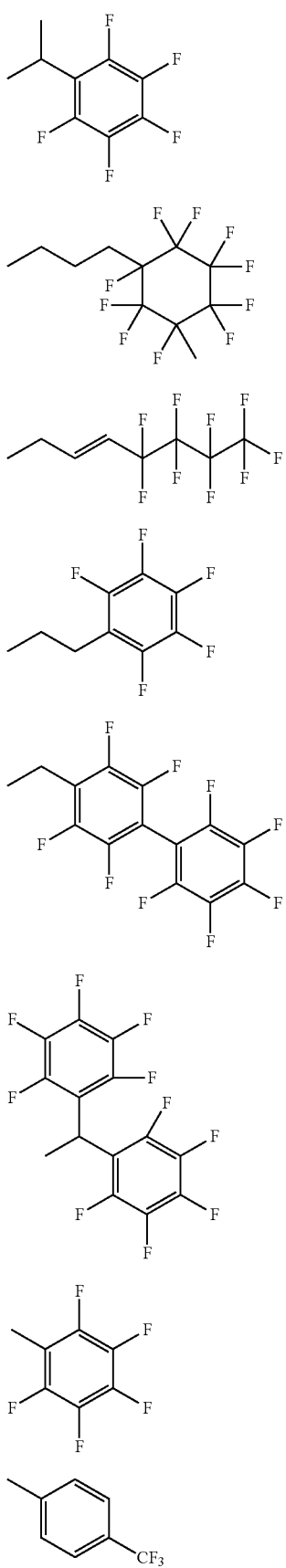

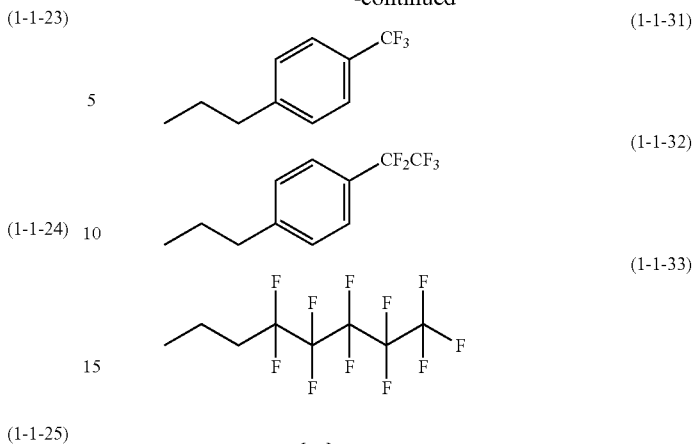

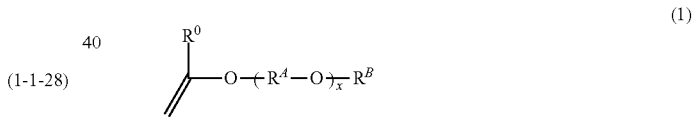

The compound {A} is preferably a compound having a structure formed by introducing a protecting group derived from a vinyl ether compound of the following formula (1) (hereinafter, sometimes referred to as a "compound (1)") into a hydroxyl group of a hydroxyl-group-containing compound serving as a precursor. Alternatively, the compound {A} may be a compound having a structure formed by introducing a protecting group derived from the compound (1) into a carboxyl group of a carboxyl-group-containing compound serving as a precursor.

These compounds (hereinafter, sometimes referred to as "compounds (a)"), in particular, the hydroxyl-group-containing compound serving as a precursor, have a property such that a protecting group is less likely to leave due to heat, and on the other hand, have the property of being capable of controlling the elimination of a protecting group due to radiation irradiation, and therefore are preferably used as the compound {A}.

$$\underset{\text{(1)}}{\overset{R^0}{\underset{\|}{\diagup}}}\!\!-\!\!O\!\!-\!\!(\!R^A\!\!-\!\!O\!)_{\overline{x}}\,R^B$$

In the formula (1) above, $R^0$ is a hydrogen atom or a methyl group. In the formula (1) above, $R^A$ is independently a methylene group, a $C_{2-12}$ alkylene group, a $C_{2-12}$ alkenylene group, a $C_{6-13}$ substituted or unsubstituted aromatic hydrocarbon group, a $C_{4-12}$ substituted or unsubstituted cycloaliphatic hydrocarbon group, or a group obtained by substituting one or more hydrogen atoms of these groups with a fluorine atom. RB is a group obtained by substituting one or more hydrogen atoms of a hydrocarbon group with a fluorine atom.

A film formed by applying the radiation-sensitive composition to a substrate has properties originated from the compound {A}, and in the case where the compound (a) is used as the compound {A}, the film has properties derived from the protecting group of the compound (a). Specifically, in the case where a film is formed from the radiation-sensitive composition containing the compound (a), first, a lyophobic film is formed by the application of the radiation-sensitive composition to a substrate. Then, when this film is irradiated with radiation, the protecting group leaves in an exposed portion of the film, and, in the portion which the protecting group leaves, a hydroxyl group remains and a lyophobic property derived from the protecting group is lost.

The compound {A}, specifically, the compound {A} as a polymer (hereinafter, sometimes referred to as a polymer {A}) can be obtained by a synthesis process described in WO2014/178279.

Preferred examples of the compound {A} include a polymer having at least one selected from the group consisting of structure units of the following formulae (2) to (5).

(2)

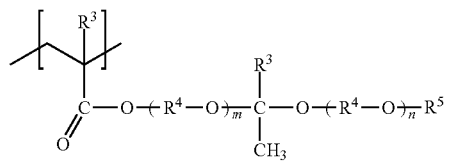

(3)

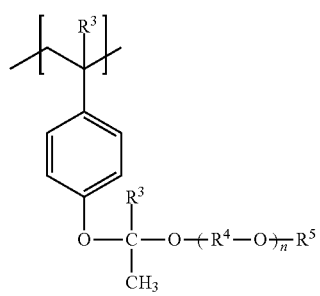

(4)

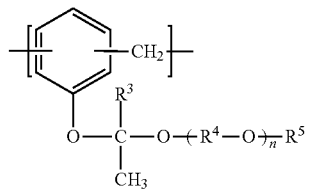

(5)

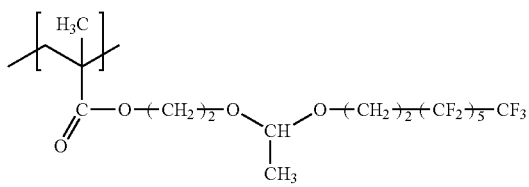

(where $R^3$ is independently a hydrogen atom or a methyl group; $R^4$ is independently a methylene group, a $C_{2-12}$ alkylene group, a $C_{2-12}$ alkenylene group, a group obtained by substituting a part of the alkylene group or the alkenylene group with —O—, —(C=O)O—, or —O(C=O)—, a $C_{6-13}$ substituted or unsubstituted aromatic hydrocarbon group, a $C_{4-12}$ substituted or unsubstituted cycloaliphatic hydrocarbon group, or a group obtained by substituting one or more hydrogen atoms of these groups with a fluorine atom; $R^5$ is independently a group obtained by substituting one or more hydrogen atoms of a hydrocarbon group with a fluorine atom; m is 0 or 1; and n is independently an integer of 0 to 12.)

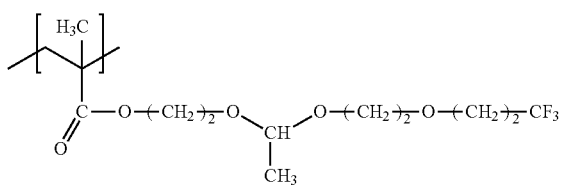

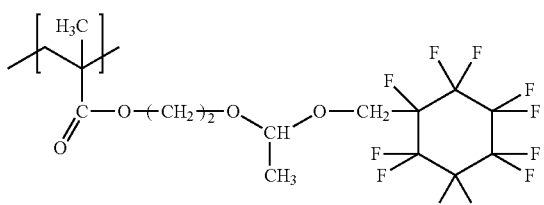

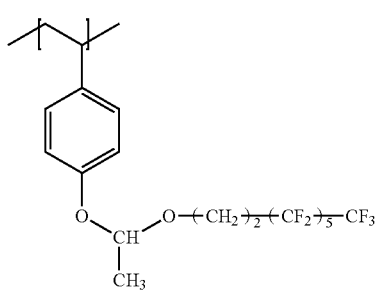

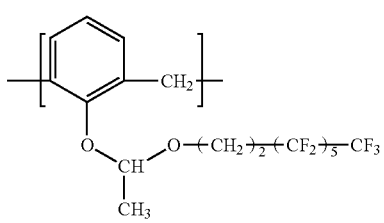

-continued

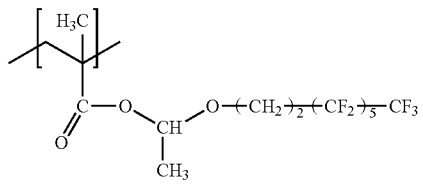
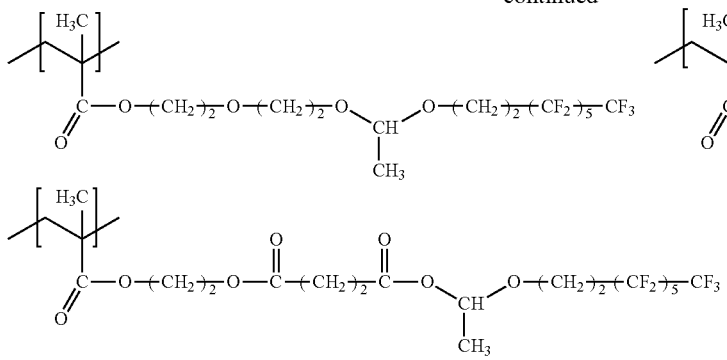

The compound {A} may be used alone, or two or more kinds thereof may be used in combination. A solvent described in WO2014/178279 may be used.

Compounds described in WO2014/178279 may be used as other components of the composition of the present embodiment, that is, the solvent {B}, the acid generator {C}, the sensitizer {D}, the quencher {E}, the polymerizable compound {F}, and the radiation-sensitive polymerization initiator {G}, and other optional components, such as surfactants, preservation stabilizers, adhesive auxiliary agents, and heat-resistance improvers.

Next, there will be described a film-forming material suitable for forming a fine pattern using a hydrophilic/hydrophobic material having a recess pattern. The film-forming material is not limited to a particular material. For example, it is only required that a material is capable of forming a wiring, and the material is preferably an ink or paste with fluidity.

Examples of the film-forming material include conductive film-forming inks; conductive film-forming pastes; resin solution inks and resin solution pastes that are capable of forming a film; coloring inks and coloring pastes that contain pigments or dyes; organic semiconductor solutions and oxide semiconductor dispersions; organic EL illuminant solutions and quantum dots; nanocarbon conductive film-forming ink; and functional ink and conductive film-forming paste of nanocarbon, such as carbon nanotube, graphene, and carbon black.

As the film-forming material, for example, use may be made of compositions described in WO2014/178279, Japanese Patent Application Laid-Open Publication No. 2009-235964, Japanese Patent Application Laid-Open Publication No. 2011-122177, and Japanese Patent Application Laid-Open Publication No. 2011-241309.

EXAMPLES

Hereinafter, the radiation-sensitive composition used for the electronic device according to the present invention will be described in detail based on Examples, but, Examples are not to be construed in any way as imposing limitations upon the scope of the present invention.

GPC Analysis

The weight average molecular weight (Mw) and the molecular weight distribution (Mw/Mn) of a polymer (A) and a polymer (PA) were measured in terms of polystyrene under tetrahydrofuran (THF) solvent condition by gel permeation chromatography (GPC, trade name: HLC-8220, manufactured by Tosoh Corporation).

$^1$H-NMR Measurement $^1$H-NMR was measured using CDCL3 at 25° C. by a nuclear magnetic resonance apparatus (AVANCEIII AV400N, manufactured by Bruker).

In Examples, as an example of the compound having an acid dissociative group {A} included in the radiation-sensitive composition used for the above-described electronic device according to the present invention, there was synthesized a polymer (hereinafter, referred to as the polymer {A}).

Synthesis of Polymer {A}

Synthesis Example 1

Into a flask equipped with a condenser and a stirrer, 8 parts by mass of dimethyl-2,2'-azobis (2-methyl propionate), 2 parts by mass of 2,4-diphenyl-4-methyl-1-pentene, and 200 parts by mass of diethylene glycol dimethyl ether were fed. Subsequently, 42 parts by mass of 2-hydroxyethyl methacrylate and 58 parts by mass of benzyl methacrylate were fed into the mixture, and while the resulting mixed solution was gently stirred under nitrogen atmosphere, the temperature of the solution was increased to 80° C. and this temperature was maintained for 4 hours to cause polymerization, whereby a solution containing a polymer (A-1) as a copolymer was obtained (solid content concentration=34.6% by mass, Mw=26,000, Mw/Mn=2.2). Note that the solid content concentration means the percentage of the mass of a copolymer to the total mass of a copolymer solution.

Subsequently, to 10 parts by mass of the obtained solution containing the polymer (A-1), 13 parts by mass of diethylene glycol dimethyl ether and 4.8 parts by mass of 3,3,4,4,5,5,6,6,7,7,8,8,8-tridecafuloro-1-vinyloxyoctane were added, and sufficiently stirred, and then, 0.27 part by mass of trifluoroacetic acid was added to the solution, and the resulting solution was allowed to react at 80° C. for 9 hours under nitrogen atmosphere. Subsequently, the reaction solution was cooled to room temperature, and 0.3 part by mass of pyridine was added thereto to quench the reaction. The obtained reaction solution was added dropwise to excessive amounts of methanol to perform reprecipitation purification. Subsequently, the resultant was dissolved in 10 parts by mass of diethylene glycol dimethyl ether, and then, the resulting solution was added dropwise to excessive amounts of hexane to perform reprecipitation purification. After drying the resultant, 6.8 parts by mass of a polymer {A} (P-1) was obtained as a white solid copolymer. The obtained polymer {A} (P-1) was analyzed using $^1$H-NMR, and as a result, it was confirmed that acetalization proceeded (chemical shift: 4.80 ppm, acetal group C—H).

Synthesis Example 2

Into a flask equipped with a condenser and a stirrer, 8 parts by mass of dimethyl-2,2'-azobis (2-methyl propionate), 2 parts by mass of pentaerythritol tetrakis(3-mercaptopropionate), and 200 parts by mass of propylene glycol monomethyl ether were fed. Subsequently, 75 parts by mass of 2-hydroxyethyl methacrylate and 25 parts by mass of benzyl methacrylate were fed into the mixture, and nitrogen purging was performed, and then, while the mixed solution was gently stirred, the temperature of the solution was increased to 80° C. and this temperature was maintained for 4 hours to cause polymerization, whereby a solution containing a polymer (A-2) as a copolymer was obtained. The obtained solution was added dropwise to excessive amounts of hexane, and dried, whereby a white solid polymer (A-2) was obtained (Mw=28,000, Mw/Mn=2.3).

Subsequently, 5 parts by mass of the polymer (A-2) was dissolved in 42 g of tetrahydrofuran, and 12.4 parts by mass of 3,3,4,4,5,5,6,6,7,7,8,8,8-tridecafuloro-1-vinyloxyoctane was added thereto, and sufficiently stirred, and then, 0.66 part by mass of trifluoroacetic acid was added to the resulting solution, and the solution was allowed to react at 80° C. for 9 hours under nitrogen atmosphere. Subsequently, the reaction solution was cooled to room temperature, and 0.7 part by mass of pyridine was added thereto to quench the reaction. The obtained reaction solution was added dropwise to excessive amounts of methanol to perform reprecipitation purification. Subsequently, the resultant was again dissolved in 15 parts by mass of diethylene glycol dimethyl ether, and then, the resulting solution was added dropwise to excessive amounts of hexane to perform reprecipitation purification, whereby 11.0 parts by mass of a polymer {A} (P-2) was obtained as a white solid copolymer. The obtained polymer {A} (P-2) was analyzed using $^1$H-NMR, and as a result, it was confirmed that acetalization proceeded (chemical shift: 4.80 ppm, acetal group C—H).

Synthesis Example 3

Into a flask equipped with a condenser and a stirrer, 8 parts by mass of dimethyl-2,2'-azobis (2-methyl propionate), 2 parts by mass of 2,4-diphenyl-4-methyl-1-pentene, and 200 parts by mass of propylene glycol monomethyl ether were fed. Subsequently, 30 parts by mass of methacrylic acid and 70 parts by mass of benzyl methacrylate were fed into the mixture, and nitrogen purging was performed, and then, while the mixed solution was gently stirred, the temperature of the solution was increased to 80° C. and this temperature was maintained for 4 hours to cause polymerization, whereby a solution containing a polymer (A-3) as a copolymer was obtained. The obtained solution was added dropwise to excessive amounts of hexane, and dried, whereby a white solid polymer (A-3) was obtained (Mw=24,000, Mw/Mn=2.2).

Subsequently, 5 parts by mass of the polymer (A-3) was dissolved in 34 parts by mass of diethylene glycol dimethyl ether, and 9.4 parts by mass of 3,3,4,4,5,5,6,6,7,7,8,8,9,9,10,10,10-heptadecafluoro-1-vinyloxydecane was added thereto, and sufficiently stirred, and then, 0.09 part by mass of pyridinium p-toluenesulfonate was added to the resulting solution, and the solution was allowed to react at 80° C. for 5 hours under nitrogen atmosphere. Subsequently, the reaction solution was cooled to room temperature, and 0.04 part by mass of pyridine was added thereto to quench the reaction. The obtained reaction solution was added dropwise to excessive amounts of methanol to perform reprecipitation purification. Subsequently, the resultant was again dissolved in 15 parts by mass of diethylene glycol dimethyl ether, and then, the resulting solution was added dropwise to hexane to perform reprecipitation purification, whereby 10.9 parts by mass of a polymer {A} (P-3) was obtained as a white solid copolymer. The obtained polymer {A} (P-3) was analyzed using $^1$H-NMR, and as a result, it was confirmed that acetalization proceeded (chemical shift: 5.74 ppm, acetal group C—H).

Preparation of Radiation-Sensitive Composition

The details of components used in Examples and Comparative Examples are described below.

The following materials may be used as the acid generator {C}.
C-1: N-hydroxynaphthalimide-trifluoromethanesulfonate
C-2: 4,7-di-n-butoxy-1-naphthyltetrahydrothiophenium trifluoromethanesulfonate
The following materials may be used as the sensitizer {D}.
D-1: 2-isopropylthioxanthone
The following materials may be used as the quencher {E}.
E-1: 2-phenylbenzimidazole
<{F} Polymerizable Compound>
The following materials may be used as the polymerizable compound {F}.
F-1: phenolic novolak type epoxy resin
The following materials may be used as the radiation-sensitive polymerization initiator G].
G-1: 2-methyl-1-(4-methylthiophenyl)-2-morpholinopropane-1-one (Irgacure (registered trademark) 907, manufactured by BASF)

Process for Manufacturing Base Material Having Recess Pattern

A process for manufacturing a base material having a recess pattern by making use of the radiation-sensitive composition is characterized by including the following steps (i) to (iii) and not including a development step.

(i) applying the radiation-sensitive composition including a compound having an acid dissociative group and an acid generator to a substrate to form a film (ii) irradiating a predetermined portion of the film with radiation (iii) baking the film after the radiation irradiation The use of the above-described steps (i) and (ii) (hereinafter, also referred to as the step (i) and the step (ii), respectively) and furthermore the above-described step (iii) (hereinafter, also referred to as the step (iii)) allows a recess pattern to be formed without using a development step which has been conventionally required for patterning, and thus, a base film having the recess pattern can be produced.

Hereinafter, each of the steps in the process for manufacturing a base film having a recess pattern by making use of the radiation-sensitive composition will be described.
Step (i):
FIG. 1A is a schematic diagram illustrating a radiation-sensitive composition film formed on a substrate.

The step (i) is a step of applying the radiation-sensitive composition including a compound having an acid dissociative group and an acid generator to a substrate and subsequently preferably baking (pre-baking) the coated surface to form a film 2 on the substrate 10.

The use of the radiation-sensitive composition in the step (i) allows a recess portion 3b to be formed on the substrate 10 without performing a development step in the following step (iii) and other steps. A specific description of the radiation-sensitive composition will be given below.

Examples of a material usable for the substrate 10 include glass, quartz, silicon, and resin.

As the substrate 10, resin substrates, glass substrates, and semiconductor substrates, which have been conventionally used for electronic circuits, are preferably employed because a substrate with a wiring that is finally obtained by a process for manufacturing a wiring to be formed on the radiation-sensitive composition is preferably used as it is for, for example, electronic circuits. Incidentally, a substrate described in WO2014/178279 may be used.

Note that, before the radiation-sensitive composition is applied to the substrate 10, a substrate surface may be subject to pretreatments, such as washing, roughening and coarsening, and the addition of fine projections-and-recesses to the surface, as needed.

The process for applying the radiation-sensitive composition is not limited to a particular process, and an application process described in WO2014/178279 may be used. Among various application processes, slit-die coating and spin coating are particularly preferable.

The thickness of the film 2 to be formed in the step (i) may be suitably adjusted in accordance with a desired usage, but, is preferably 0.1 µm to 20 µm, and more preferably 0.2 µm to 10 µm.

Conditions for the pre-baking vary depending on, for example, the composition of the radiation-sensitive composition to be used, but, the pre-baking is conducted preferably approximately at 60° C. to 120° C. for 1 minute to 10 minutes.

Step (ii):

The step (ii) is a step of exposure by irradiating at least a part of the film 2 formed in the step (i) with radiation.

Figure 1B:
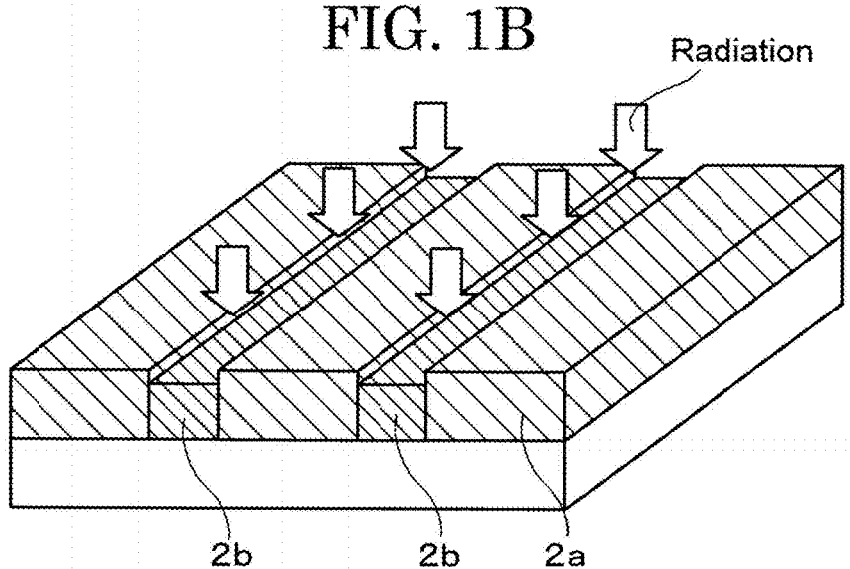
Figure 1C:
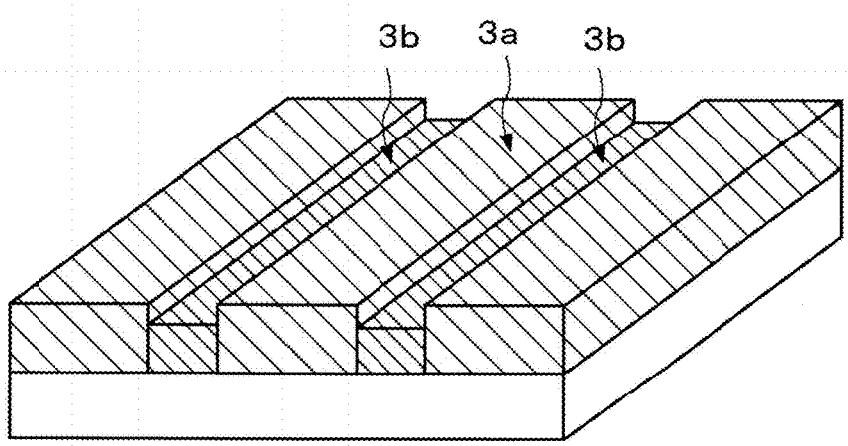

FIG. 1B is a schematic diagram illustrating the exposure of the radiation-sensitive composition film on the substrate.

In the step (ii), as illustrated in FIG. 1B, a part of the film 2 on the substrate 10 is irradiated with radiation to form a film having an irradiated portion 2b and a non-irradiated portion 2a.

Through the step (ii), an acid dissociative group leaves by the effect of the acid generator, and volatilizes. As a result, the film thickness of the irradiated portion becomes thinner than the film thickness of the non-irradiated portion, and a recess pattern is thus formed. At this time, when the acid dissociative group has a fluorine atom, the film 2 obtained in the step (i) and the non-irradiated portion 2a are lyophobic, and by contrast, with the elimination of the acid dissociative group, the irradiated portion 2b becomes more lyophilic than the non-irradiated portion 2a.

Thus, in the case where the composition including a compound containing an acid dissociative group having a fluorine atom is used in the step (i), a film having the lyophobic non-irradiated portion 2a and the recess-patterned irradiated portion 2b which is more lyophilic than the non-irradiated portion 2a is formed on the substrate through the step (ii).

In the step (ii), a predetermined pattern can be drawn by exposure via a photomask having the predetermined pattern or using a direct-writing exposure system so as to form an irradiated portion having the same form as a desired wiring form.

Examples of the radiation used for the exposure include visible radiation, ultraviolet rays, far-ultraviolet rays, charged particle beams, and X-rays. Among these radiations, a radiation having a wavelength in a range of 190 nm to 450 nm is preferable, and in particular, a radiation containing 365-nm ultraviolet rays is more preferable.

The amount of exposure in the step (ii) is preferably such that the radiation exposure results in the formation of a recess portion 3b obtained after the following step (iii) having a film thickness in the following range.

Step (iii):

FIG. 10 is a schematic diagram illustrating the baking of the radiation-sensitive composition film 2 which is partially exposed.

In the step (iii), the film 2 obtained through the step (ii) is baked to form the film 2 having a recess portion 3b corresponding to the irradiated portion 2b in the step (ii) and a projection portion 3a corresponding to the non-irradiated portion 2a in the step (ii).

The step (iii) allows further volatilization of a component in which an acid dissociative group has left by the effect of the acid generator in the irradiated portion 2b in the step (ii). As a result, a recess portion in the irradiated portion becomes deeper (the film thickness of the recess portion 3b becomes still smaller), whereby a film in which the film thickness of the recess portion 3b is thinner by 10% or more than the film thickness of the projection portion 3a can be formed.

In the case where the composition including a compound containing an acid dissociative group having a fluorine atom is used in the step (i), the film 2 having the lyophobic projection portion 3a and the recess portion 3b which is more lyophilic than the projection portion 3a is formed on the substrate through the step (iii). Then, when a film-forming material in liquid form is applied onto such film 2, due to a large difference in film thickness between the projection portion 3a and the recess portion 3b, the unevenness of the film surface causes the material to gather easily on the recess portion 3b. However, not only the effect of the form of the film surface, but also the lyophilic/lyophobic properties of the surface cause the material to gather easily on the recess portion 3b, whereby a wiring in a more desired form, specifically, wiring having a fine pattern can be easily formed.

Furthermore, in the case where the composition including a compound containing an acid dissociative group having a fluorine atom is used in the step (i), the group having the fluorine atom leaves by radiation irradiation. Since this leaving group comparatively easily volatilizes, the film 2 having a large difference in film thickness between the projection portion 3a and the recess portion 3b can be formed more simply and more easily in the step (iii).

Examples of a method for baking the film 2 in the step (iii) include: baking of the coated substrate by using a hot plate, a batch type oven, or a conveyor type oven; hot-air drying using a dryer or other tools; and vacuum baking.

Conditions for the baking vary depending on, for example, the composition of the radiation-sensitive composition used in the step (i) and the thickness of the film obtained in the step (ii), but, the baking is conducted preferably approximately at 60° C. to 150° C. for 3 minutes to 30 minutes.

In the step (iii), there is desirably formed a film being such that the film thickness of the recess portion 3b is preferably thinner by 2% or more, more preferably thinner by 2% to 40%, and still more preferably thinner by 10% to 30% than the film thickness of the projection portion 3a. When the obtained film has such form, on the occasion of applying a film-forming material to the recess portion 3b, such level difference of the uneven film surface causes the material to be less likely to overflow from the recess portion 3b and also causes the material to be less likely to remain in a region other than the recess portion 3b, and accordingly, a large amount of the film-forming material can be applied, and even when a large amount of a wiring material, a wiring having a fine pattern can be attained.

The film thicknesses of the recess portion 3b and the projection portion 3a can be measured specifically by a process described in the following Examples.

Note that the film thickness of the recess portion 3b obtained in the step (iii) may be suitably adjusted in accordance with a desired usage, but, is preferably 0.01 μm to 18 μm, and more preferably 0.05 μm to 15 μm.

The difference between the contact angle of tetradecane with the recess portion 3b surface and the contact angle thereof with the projection portion 3a surface (Contact angle of projection portion 3a surface—Contact angle of recess portion 3b surface) is preferably 30° or more, more preferably 40° or more, and still more preferably 50° or more. In the case where the contact angle difference is in the above-described range, in the following step (iv), even when a film-forming material in liquid form is applied also to the projection portion 3a surface, the projection portion 3a serving as a lyophobic portion repels the material, and accordingly, the material easily moves to the recess portion 3b serving as a lyophilic portion, whereby a wiring can be formed along the recess portion 3b.

The difference in contact angle can be measured specifically by a process described in the following Examples.

Note that the recess portion 3b surface and the projection portion 3a surface mean, as illustrated in FIG. 10, a surface of the film formed on the substrate 10, the surface being opposite to a surface in contact with the substrate 10.

When the obtained recess portion 3b and the obtained projection portion 3a satisfy the conditions that the film thickness of the recess portion 3b is thinner by 10% or more than the film thickness of the projection portion 3a and the difference between the contact angle of tetradecane with the recess portion 3b surface and the contact angle thereof with the projection portion 3a surface is 30° or more, a large amount of a film-forming material can be easily applied only to the recess portion 3b from the same reason as that mentioned above.

Process of Forming Film on Recess Portion

Figure 2A:
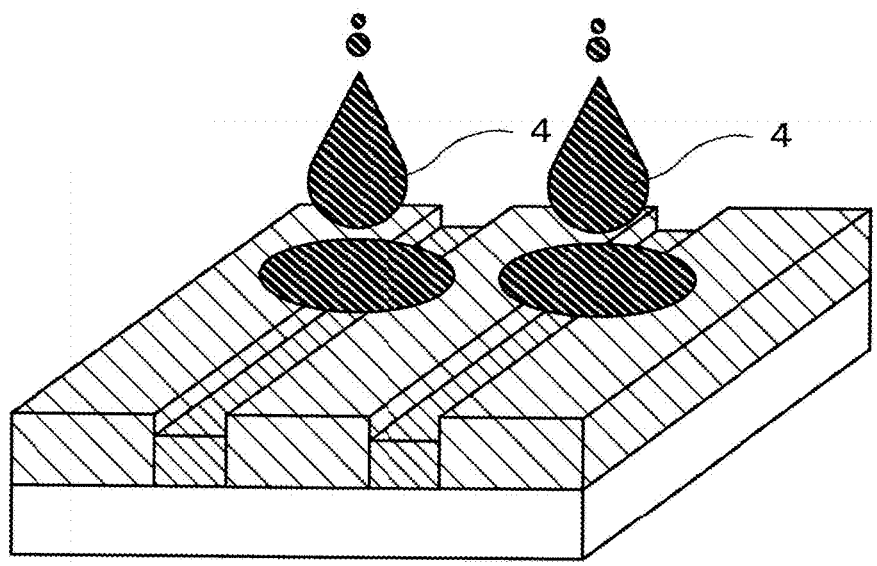
FIG. 2A and FIG. 2B are a cross-sectional view showing the step of forming the radiation-sensitive composition film formed on the substrate.

The production method according to the present invention includes a process of forming a film on the recess portion 3b obtained in the step (iii).
Step (iv):
FIG. 2A is a schematic diagram illustrating the application of a film-forming material in a film formation process according to the embodiment of the present invention.

In the step (iv), a film-forming material 4 is applied onto the recess portion 3b. A specific description of the film-forming material 4 will be given below.

The application process is not limited to a particular process, and an application process described in WO2014/178279 may be employed.

From the viewpoint of the formation of a fine, thick, low-resistance wiring that is less likely to cause broken wire, offset printing is preferably employed. Offset printing can be performed in accordance with, for example, the descriptions in Japanese Patent Application Laid-Open Publication No. 2010-159350 and Japanese Patent Application Laid-Open Publication No. 2011-178006.

A film 5 formed of the film-forming material 4 that is obtained in the step (iii) has the lyophobic projection portion 3a and the recess portion 3b which is more lyophilic than the projection portion 3a, and therefore, in the case where the film-forming material 4 in liquid form is used, even with any of the above-described processes, the projection 3a repels the material, and the material gathers easily on the recess portion 3b, and accordingly, there is caused a state in which the film-forming material 4 is applied along the recess portion 3b.
Step (v):
In the step (v), the substrate with the film-forming material that is obtained in the step (iv) is baked.

Figure 2B:
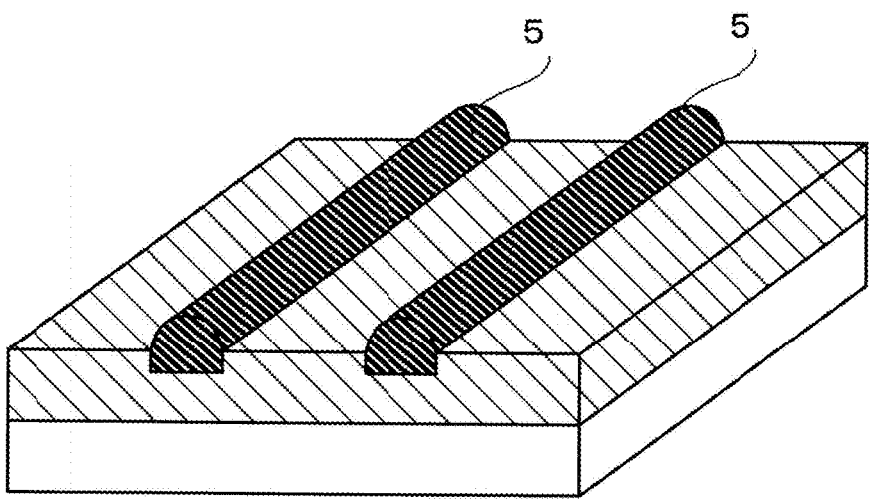

FIG. 2B is a schematic diagram illustrating a pattern formed on the substrate according to the embodiment of the present invention.

Through this step (v), a pattern 5 is formed.

The temperature for the baking is not limited to a particular temperature, but is preferably 190° C. or lower. In the case where a film with poor heat-resistance, such as polyethylene terephthalate, is used for the substrate 10, the baking temperature is preferably equal to or lower than the heat resistant temperature of the film, specifically 150° C. or lower.

The baking time is also not limited to a particular time, but is preferably 1 minute to 120 minutes, and more preferably 3 minutes to 60 minutes.

Examples of a method for the baking include baking using a hot plate, a batch type oven, or a conveyor type oven, hot-air drying using a dryer or other tools, and vacuum baking.

Process for Forming Conductive Pattern

In the present invention, using a base material formed through the step (i), the step (ii), and the step (iii) of the method for manufacturing a base material having a recess pattern according to the embodiment of the present invention, and using a conductive film-forming ink or a conductive film formation paste as a film-forming material, a conductive film according to the present invention can be formed by the same process as the above-described film formation process according to the embodiment of the present invention.

Electronic Circuit and Electronic Device

An electronic circuit according to the present invention has a wiring produced by the process of forming a conductive pattern, and preferably has a laminate of a substrate and a wiring produced by the process of forming a conductive pattern.

An electronic device including the thin film transistor or the MOS field effect transistor according to the present invention has the electronic circuit. Therefore, the electronic device is smaller, thinner, and highly functional.

Examples of the electronic device include liquid crystal displays, mobile information devices such as mobile phones, digital cameras, organic displays, organic EL lighting, various sensors, and wearable devices.

Examples 1 to 3 and Comparative Examples 1 to 2

Various components whose kinds and contents are shown in Table 1 were mixed, and 0.1 part by mass of POLYFLOW No. 75 (manufactured by Kyoeisha Chemical Co., Ltd.) was added as a surfactant thereto, and diethylene glycol dimethyl ether was added as a solvent {B} to the mixture so as to achieve a solid content concentration of 20% by mass, and then the resulting mixture was filtered with a millipore filter having a pore diameter of 0.5 μm, whereby radiation-sensitive compositions were prepared. Note that "–" in Table 1 represents the disuse of a component marked with the "–".

(the recess portion) and the non-exposed portion (the projection portion) were measured using a contact type thickness-meter (Alpha-Step 10, manufactured by KEYENCE CORPORATION). Then, the difference between the film thickness of the non-exposed portion and the film thickness of the exposed portion was calculated, and the rate of

TABLE 1

| | {A} Polymer | | {C} Acid Generator | | {D} Sensitizer | | {E} Quencher | | {F} Polymerizable Compound | | {G} Radiation-Sensitive Polymerization Initiator | |
|---|---|---|---|---|---|---|---|---|---|---|---|---|
| | Kinds | Contents (parts) | Kinds | Contents (parts) | Kinds | Contents (parts) | Kinds | Contents (parts) | Kinds | Contents (parts) | Kinds | Contents (parts) |
| Example 1 | P-1 | 100 | C-1 | 2 | D-1 | 1 | E-1 | 0.05 | — | — | — | — |
| Example 2 | P-2 | 100 | C-1 | 2 | — | — | E-1 | 0.05 | — | — | — | — |
| Example 3 | P-3 | 100 | C-2 | 2 | — | — | E-1 | 0.05 | F-1 | 5 | G-1 | 2 |
| Comparative Example 1 | A-1 | 100 | C-1 | 2 | D-1 | 1 | E-1 | 0.05 | F-1 | 5 | G-1 | 2 |
| Comparative Example 2 | A-3 | 100 | C-1 | 2 | D-1 | 1 | E-1 | 0.05 | — | — | — | — |

Film Evaluation

Using the radiation-sensitive compositions prepared in Examples 1 to 3 and Comparative Examples 1 to 2, films were formed, and evaluated as follows. Table 2 shows the results.

Contact Angle

Onto an alkali-free glass substrate, each of the radiation-sensitive compositions prepared in Examples 1 to 3 and Comparative Examples 1 to 2 was applied using a spinner, and then, the coated substrate was pre-baked on a hot plate at 90° C. for 2 minutes to form a film having a thickness of 0.5 μm. Next, the obtained film was irradiated with radiation at the amount of exposure of 250 mJ/cm$^2$ by a high-pressure mercury lamp (exposure system: MA-1400, manufactured by Japan Science Engineering Co., Ltd.) via a quartz mask (contact). Subsequently, baking was performed using a hot plate at 110° C. for 5 minutes to form a film patterned with a lyophilic portion and a lyophobic portion (hereinafter, sometimes referred to as the "lyophilic/lyophobic patterned film"), which lyophilic portion is originated from an exposed portion (the recess portion) and which lyophobic portion is originated from a non-exposed portion (the projection portion). In the formed lyophilic/lyophobic patterned film, the contact angles of each of water, decane, and tetradecane with each of the film surface of the exposed portion corresponding to the lyophilic portion and the film surface of the non-exposed portion corresponding to the lyophobic portion were measured using a contact angle meter (CA-X, manufactured by Kyowa Interface Science Co., Ltd.), whereby lyophilic/lyophobic properties were examined. Note that, in Table 2, the contact angle of water with the surface of the exposed portion was represented as "lyophilic portion, water", and the contact angle of water with the surface of the non-exposed portion was represented as "lyophobic portion, water". The contact angles of decane and tetradecane are represented likewise.

Examination of Recess Patterning Properties

As for each of films obtained by the same process as in the "Contact angle", the film thicknesses of the exposed portion reduction in film thickness (%) was calculated from the following formula, whereby recess formation performance was examined.

Figure 3A:
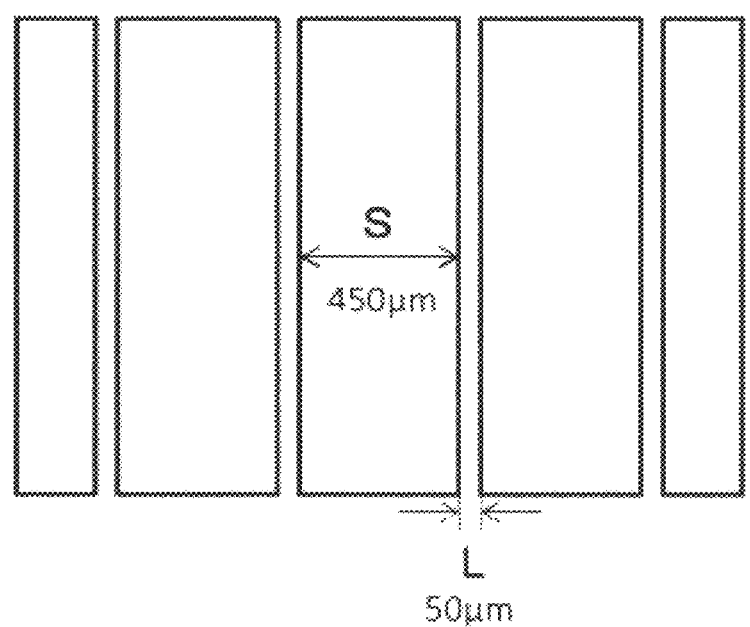
FIG. 3A is a plan view showing a quartz mask used in Examples.
Figure 3B:
FIG. 3B is a cross-sectional view showing a quartz mask used in Examples.

Rate of reduction in film thickness (%)=(Film thickness of lyophobic portion−Film thickness of lyophilic portion)×100/Film thickness of lyophobic portion Evaluation of Ink Application Assisting Performance on Lyophilic/Lyophobic Pattern FIG. 3A is a plan view showing a quartz mask used in Examples, and FIG. 3B is a cross-sectional view thereof.

A lyophilic/lyophobic patterned film was formed by the same process as in the "Contact angle", except that, as the quartz mask, a quartz mask (L/S=50 μm/450 μm) illustrated in FIG. 3A and FIG. 3B was used. Using an automatic minimum contact angle meter (MCA-2, manufactured by Kyowa Interface Science Co., Ltd.), 60 pl of tetradecane was added dropwise around the recess portion of the obtained film by a micro capillary, and 5 minutes later, the tetradecane dropped portion was observed from the dropping direction (from the top) with a microscope.

Figure 4A:
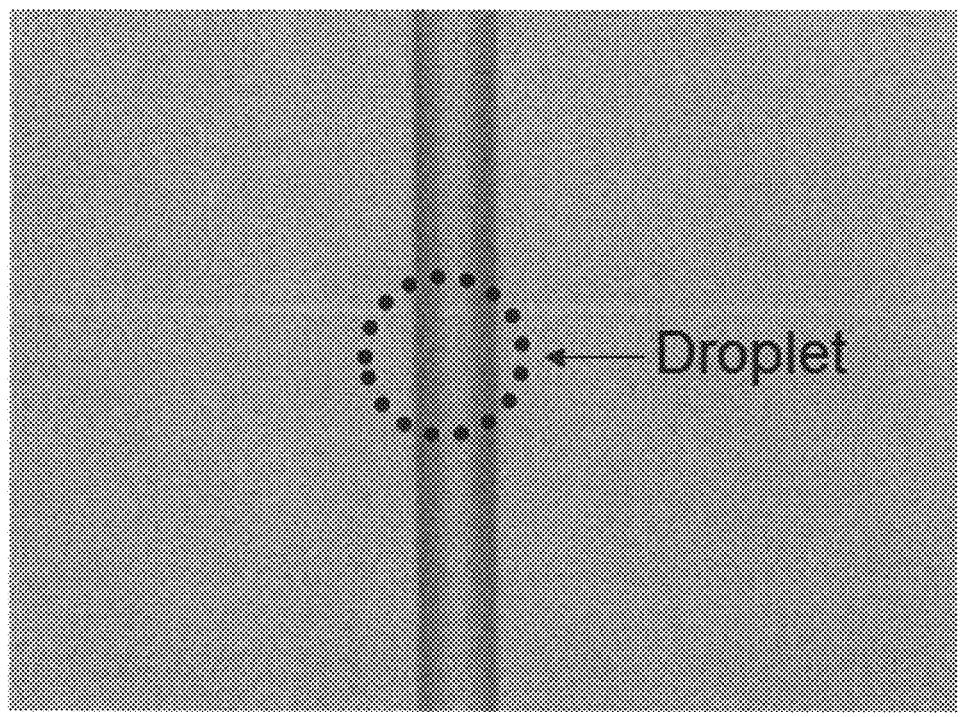
FIG. 4A is an enlarged photograph of an example of good patterning.
Figure 4B:
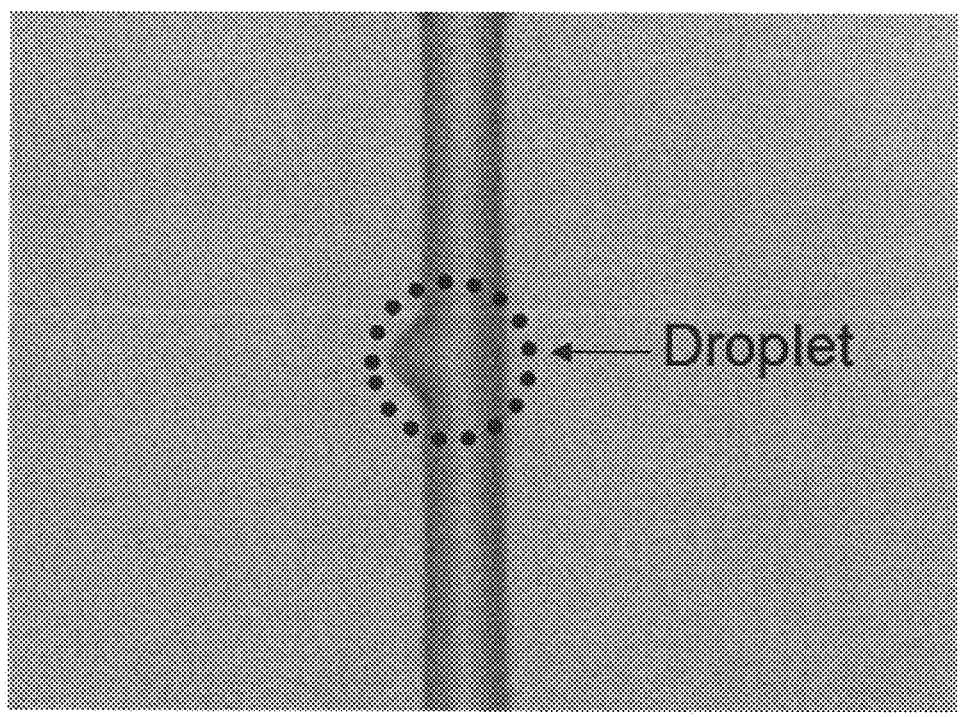
FIG. 4B is an enlarged photograph of an example of poor patterning.

FIG. 4A is an enlarged photograph of an example of good patterning. FIG. 4B is an enlarged photograph of an example of poor patterning.

As a result, a pattern of tetradecane formed along the lyophilic/lyophobic pattern was evaluated as ○, in other words, as illustrated in FIG. 4A, in the case where the formed recess line was not impaired by a droplet of tetradecane, such pattern was evaluated as ○. By contrast, a case in which tetradecane was present in a portion other than the recess portion of the lyophilic/lyophobic pattern was evaluated as x, in other words, as illustrated in FIG. 4B, a case in which the recess portion line was impaired due to a droplet of tetradecane was evaluated as x.

Figure 5A:
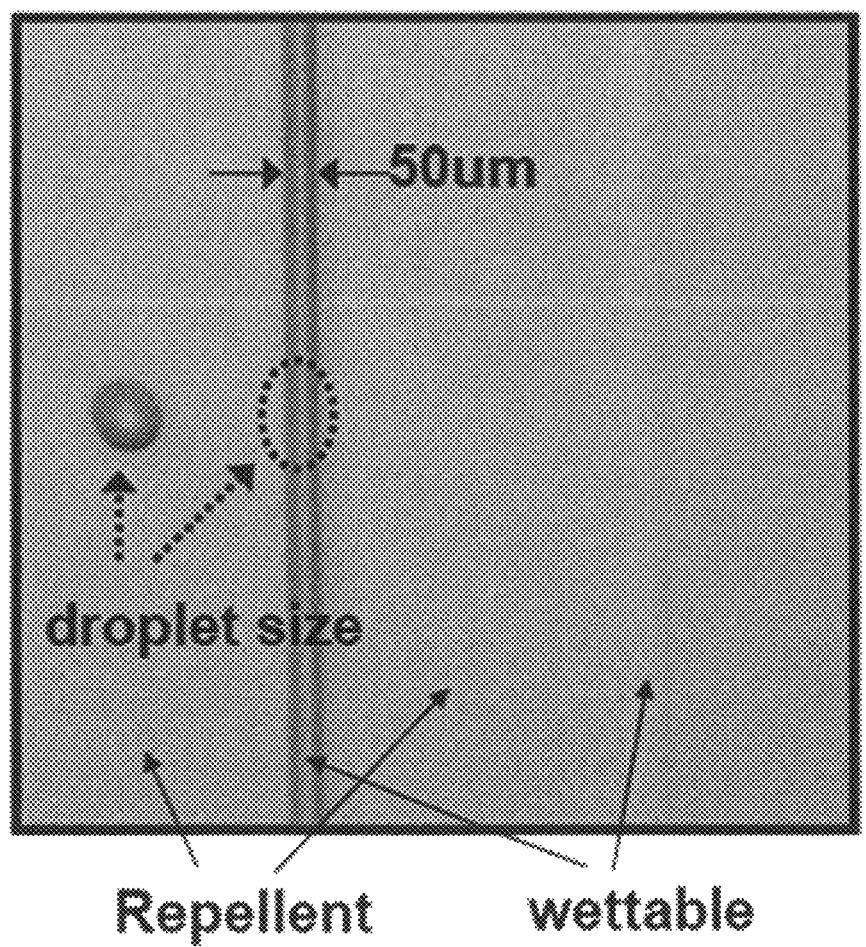
FIG. 5A is an observation photograph taken after a linear lyophilic pattern is formed in a radiation-sensitive composition film and a film-forming ink containing copper is added dropwise thereto.
Figure 5B:
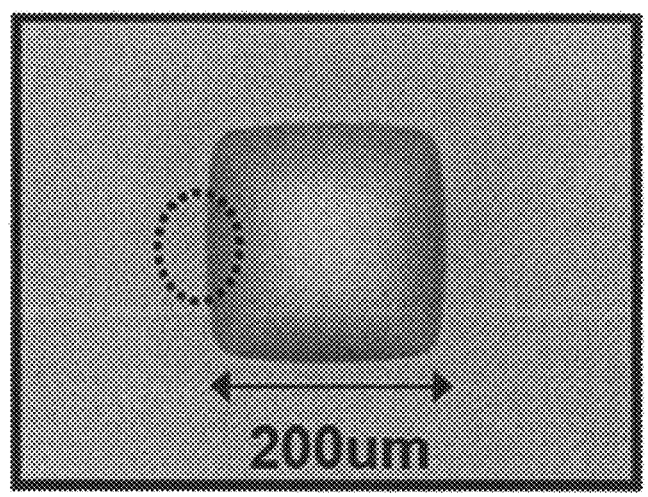
FIG. 5B is an observation photograph taken after a square lyophilic pattern is formed in a radiation-sensitive composition film and the film-forming ink containing copper is added dropwise thereto.
Figure 5C:
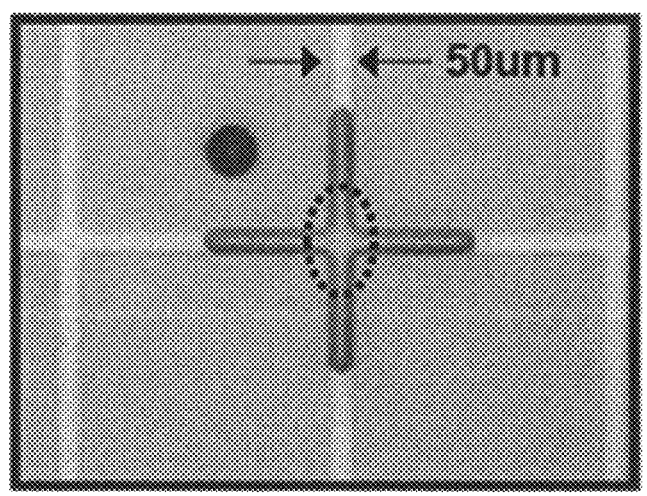
FIG. 5C is an observation photograph taken after a lyophilic pattern in which straight lines intersect is formed in a radiation-sensitive composition film and the film-forming ink containing copper is added dropwise thereto.
Figure 5D:
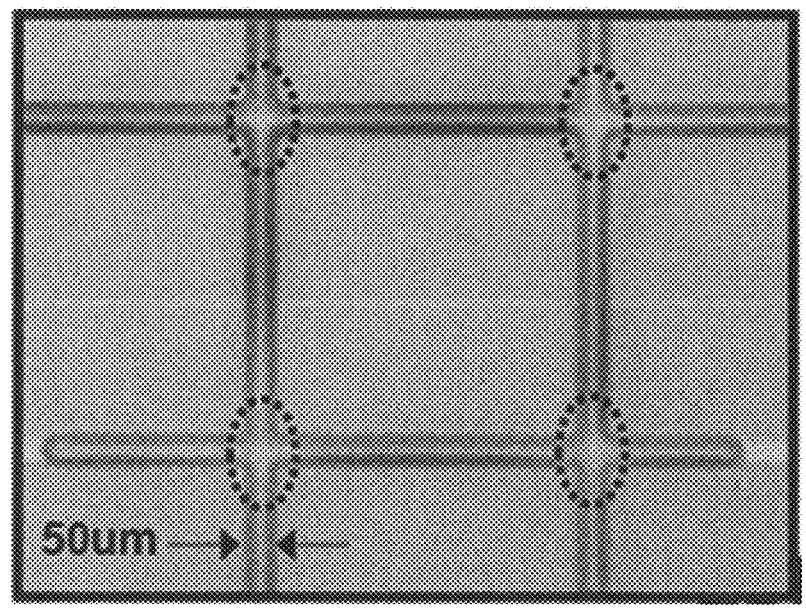
FIG. 5D is an observation photograph taken after a grid lyophilic pattern is formed in a radiation-sensitive composition film and the film-forming ink containing copper is added dropwise thereto.

In addition, other patterning examples will be shown. FIG. 5A to FIG. 5D are observation photographs taken after various lyophilic patterns were formed in one of the films of the radiation-sensitive compositions according to the present embodiment, and a film-forming ink containing copper was added dropwise thereto. FIG. 5A is an observation photograph taken after a linear lyophilic pattern having a width of 50 μm was formed and a film-forming ink containing copper was added dropwise thereto. FIG. 5B is a photograph taken at the time when a lyophilic pattern having a square shape of side 200 μm was formed and an observation was performed in the same manner as in the case illustrated in FIG. 5A. FIG. 5C is a photograph taken at the time when a lyophilic pattern in which straight lines each having a width of 50 μm intersected was formed and an observation was performed in the same manner as in the case illustrated in FIG. 5A. FIG. 5D is a photograph taken at the time when a lyophilic pattern in which straight lines each having a width of 50 μm were arranged in a grid form was formed and an observation was performed in the same manner as in the case illustrated in FIG. 5A. The wet-spreading of the dropped ink along the lyophilic pattern and the resulting good pattern were observed.

Figure 6:
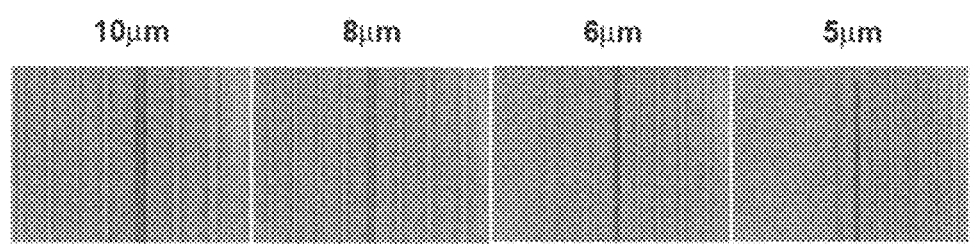
FIG. 6 is an observation photograph taken after a linear lyophilic pattern is formed in a radiation-sensitive composition film and tetradecane is added dropwise thereto.

FIG. 6 is an observation photograph taken after linear lyophilic patterns having line widths of 10 μm, 8 μm, 6 μm, and 5 μm were formed in one of the films of the radiation-sensitive compositions obtained in Examples and tetradecane was added dropwise thereto. It was observed that, among these patterns, even in the lyophilic pattern having the minimum line width, that is, a line width of 5 μm, a good pattern was formed.

Figure 7A:
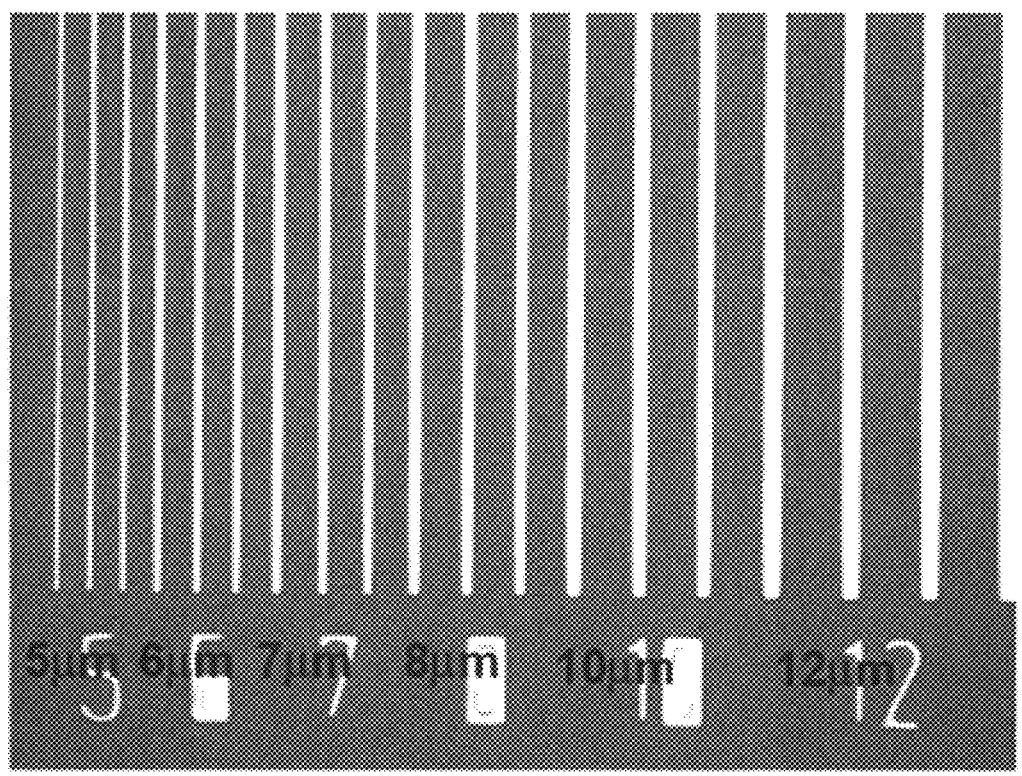
FIG. 7A is an observation photograph taken after a linear lyophilic pattern is formed in a radiation-sensitive composition film and a film-forming ink containing silver is applied thereto by spin coating.
Figure 7B:
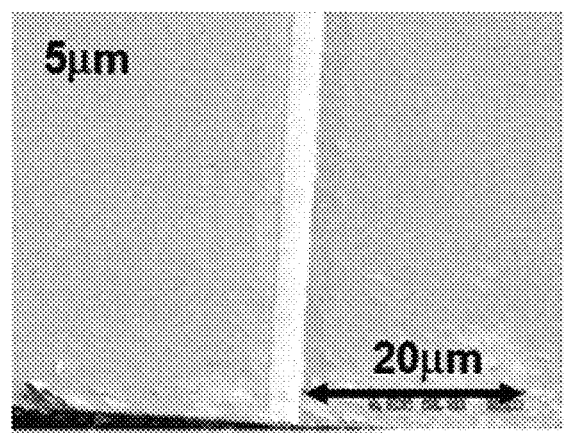
FIG. 7B is an enlarged photograph taken around a portion having a line width of 5 µm in the pattern.
Figure 7C:
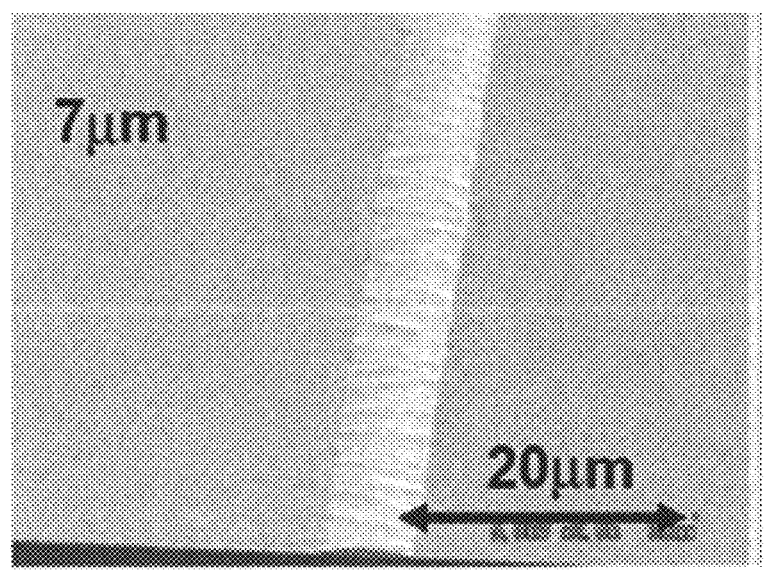
FIG. 7C is an enlarged photograph taken around a portion having a line width of 7 µm in the pattern.

FIG. 7A is an observation photograph taken after linear lyophilic patterns having line widths of 5 μm, 6 μm, 7 μm, 8 μm, 10 μm, and 12 μm were formed in one of the films of the radiation-sensitive compositions obtained in Examples and a film-forming ink containing silver was applied thereto by spin coating. FIG. 7B is an enlarged photograph taken around a linear lyophilic pattern having a line width of 5 μm. FIG. 7C is an enlarged photograph taken around a linear lyophilic pattern having a line width of 7 μm. It was observed that the dropped ink wet and spread along the lyophilic pattern to form a good pattern, and in particular, among those patterns, even in the linear lyophilic pattern having the minimum line width, that is, a line width of 5 μm, a good pattern was formed.

Figure 8:
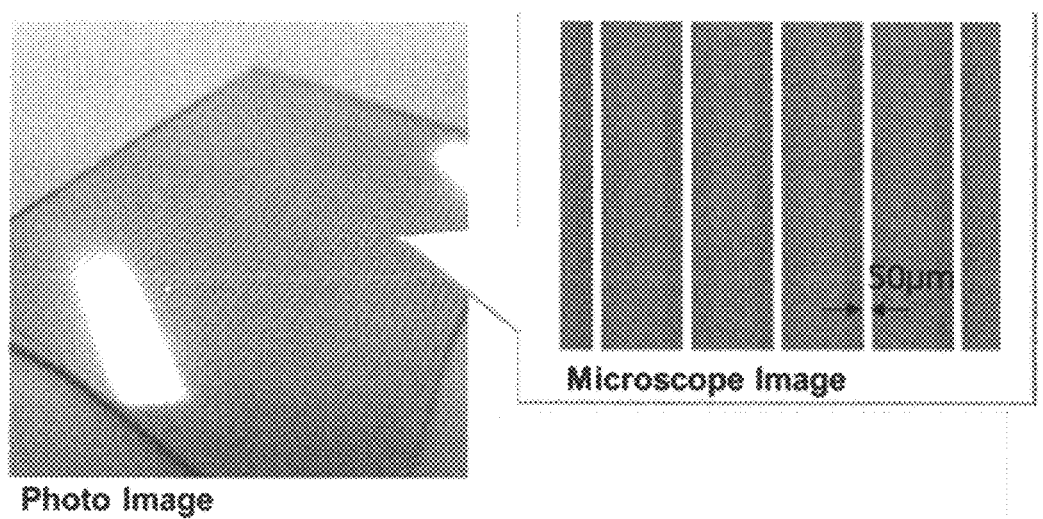
FIG. 8 is an observation photograph of a substrate appearance and a pattern after a linear lyophilic pattern is formed in a radiation-sensitive composition film and a film-forming ink containing silver is applied thereto by dipping.

FIG. 8 is an observation photograph of substrate appearance and a pattern which photograph was taken after a linear lyophilic pattern having a line width of 50 μm was formed in one of the films of the radiation-sensitive compositions obtained in Examples and a film-forming ink containing silver was applied thereto by dipping.

Figure 9:
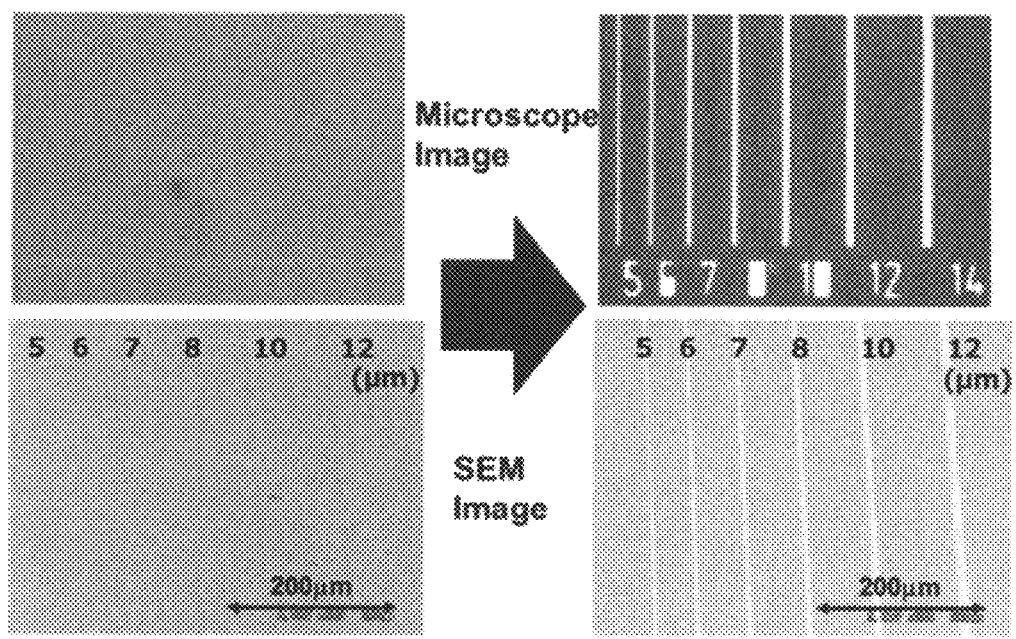
FIG. 9 is an observation photograph of a pattern before and after a linear lyophilic pattern is formed in a radiation-sensitive composition film and a film-forming ink containing silver is applied thereto by dipping.

FIG. 9 is an observation photograph taken immediately after linear lyophilic patterns having line widths of 5 μm, 6 μm, 7 μm, 8 μm, 10 μm, 12 μm, and 14 μm were formed in one of the films of the radiation-sensitive compositions obtained in Examples, and an observation photograph taken after a film-forming ink containing silver was applied thereto by dipping. It was observed that the dropped ink wet and spread along the lyophilic pattern to form a good pattern, and in particular, among those patterns, even in the linear lyophilic pattern having the minimum line width, that is, a line width of 5 μm, a good pattern was formed.

Evaluation of Exposure Sensitivity in Lyophilic/Lyophobic Patterned Film Formation Using, as the quartz mask, a quartz mask (L/S=50 μm/450 μm) illustrated in FIG. 3A and FIG. 3B, a lyophilic/lyophobic patterned film was formed with varying exposure amounts from 50 mJ/cm$^2$, 100 mJ/cm$^2$, 150 mJ/cm$^2$, 200 mJ/cm$^2$, 250 mJ/cm$^2$, to 300 mJ/cm$^2$, and the rate of reduction in the film thickness was calculated by the same process as in the "Examination of recess patterning properties".

A larger exposure amount leads to a higher reduction rate in film thickness. Considering, as sensitivity, an exposure amount that leads to 10% or higher reduction rate in film thickness, sensitivity evaluation was performed.

Figure 10A:
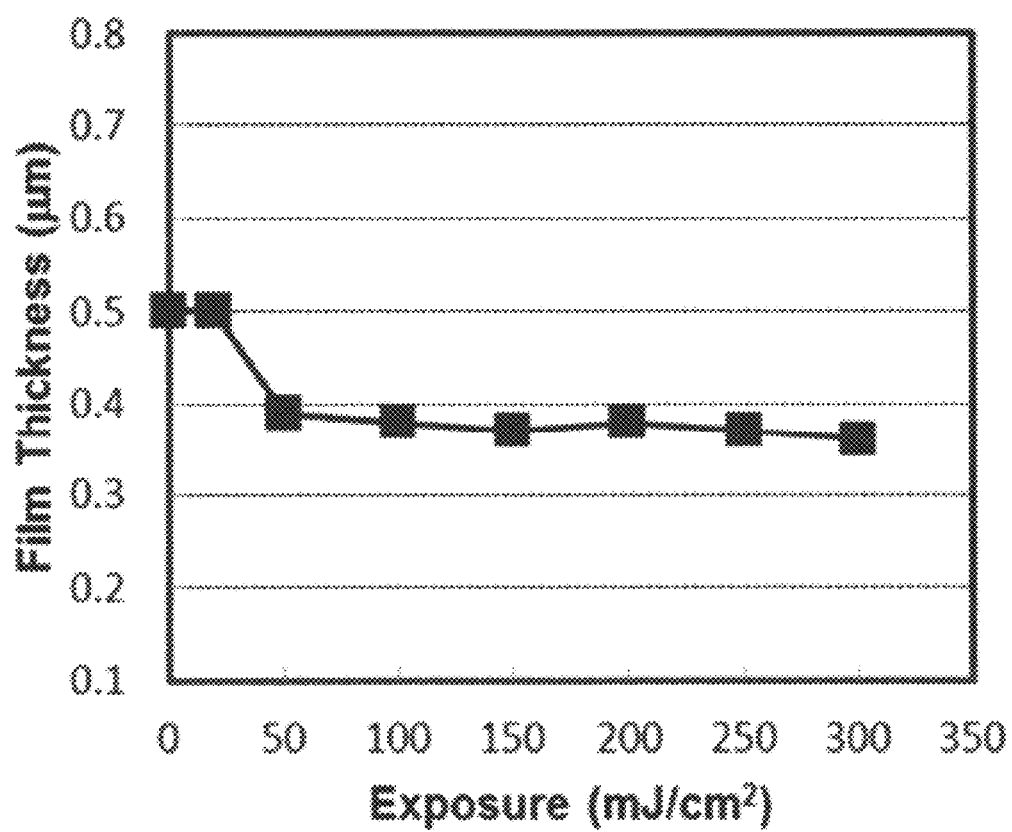
FIG. 10A is a graph showing the relationship between the amount of exposure of the radiation-sensitive composition and the film thickness measured after exposure.
Figure 10B:
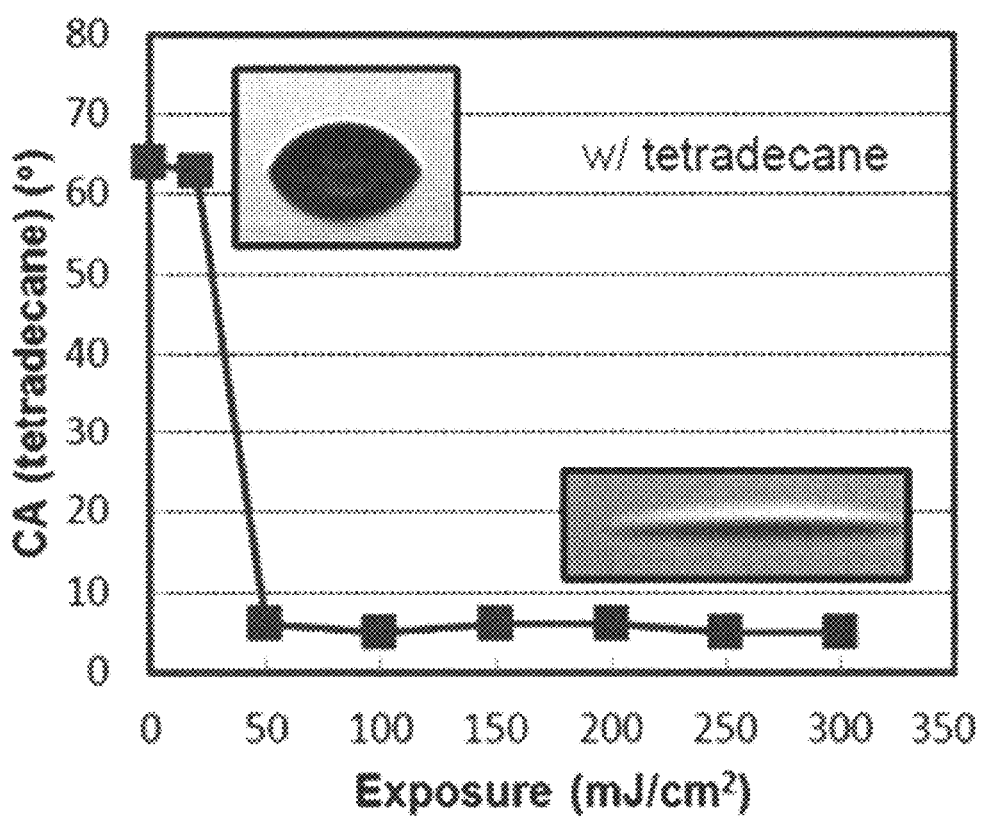
FIG. 10B is a graph showing the relationship between the amount of exposure of the radiation-sensitive composition and a contact angle of tetradecane measured after exposure.

FIG. 10A is a graph showing the relationship between the amount of exposure of the radiation-sensitive composition prepared in Example 1 and the film thickness thereof measured after exposure. FIG. 10B is a graph showing the relationship between the amount of exposure of the radiation-sensitive composition and a contact angle of tetradecane measured after exposure.

TABLE 2

| | Recess Patterning Properties | | Contact angle (°) | | | | | | ink | |
|---|---|---|---|---|---|---|---|---|---|---|
| | (lyophobic portion)-(lyophilic portion) (μm) | Reduction in Film Thickness (%) | lyophilic portion water | lyophobic portion water | lyophilic portion decane | lyophobic portion decane | lyophilic portion tetradecane | lyophobic portion tetradecane | Application Assisting Performance | Exposure Sensitivity (mJ/cm$^2$) |
| Example 1 | 0.13 | 26 | 73 | 108 | 5 | 54 | 5 | 64 | ○ | 50 |
| Example 2 | 0.25 | 50 | 61 | 121 | 5 | 60 | 5 | 69 | ○ | 50 |
| Example 3 | 0.18 | 36 | 74 | 107 | 6 | 55 | 6 | 63 | ○ | 100 |
| Comparative Example 1 | 0.00 | 0 | 81 | 81 | 5 | 6 | 5 | 6 | x | NG |
| Comparative Example 2 | 0.01 | 2 | 74 | 75 | 6 | 7 | 7 | 7 | x | NG |

The results in Table 2 revealed that the lyophilic/lyophobic patterned films formed using the radiation-sensitive compositions prepared in Example 1 to Example 3 had better lyophilic/lyophobic properties and better patterning properties than the films of Comparative Examples that were formed using the radiation-sensitive compositions prepared in Comparative Example 1 to Comparative Example 2.

Examples 4 to 7

Film Evaluation

Films were formed using radiation-sensitive compositions (Examples 4 to 7) prepared independently from the compositions in Examples 1 to 3, and the films were evaluated as follows. Table 3 shows the results.

TABLE 3

| | Contact angle (°) | | | | | | Film Thickness (μm) | | | Surface Free Energy (mN/m) | | |
|---|---|---|---|---|---|---|---|---|---|---|---|---|
| | tetradecane | | | water | | | | | | | | |
| | before exposure | after exposure | Δ | before exposure | after exposure | Δ | before exposure | after exposure | Δ | before exposure | after exposure | Δ |
| Example 4 | 64 | 5 | 59 | 111 | 78 | 33 | 0.50 | 0.37 | 0.13 | 16.5 | 64.6 | 48.1 |
| Example 5 | 69 | 3 | 66 | 121 | 61 | 60 | 0.50 | 0.24 | 0.26 | 14.0 | 65.0 | 51.0 |
| Example 6 | 67 | 3 | 64 | 110 | 48 | 62 | 0.49 | 0.24 | 0.25 | 17.0 | 67.1 | 50.1 |
| Example 7 | 64 | 4 | 60 | 110 | 77 | 33 | 0.52 | 0.51 | 0.01 | — | — | — |

Contact Angle

Using the radiation-sensitive compositions prepared in Examples 4 to 7, films were formed by the same process as in the "Examples 1 to 3 and Comparative Examples 1 to 2". In each of the formed lyophilic/lyophobic patterned films, contact angles of each of water and tetradecane with each of the film surface of the exposed portion corresponding to the lyophilic portion and the film surface of the non-exposed portion corresponding to the lyophobic portion were measured using a contact angle meter (CA-X, manufactured by Kyowa Interface Science Co., Ltd.), whereby lyophilic/lyophobic properties were examined. In particular, it was observed that the differences between the contact angles of tetradecane before exposure and after exposure were around 60°, and the differences between the contact angles of water before exposure and after exposure were in a range of 30° to 60°. In the formed lyophilic/lyophobic patterned films, electrodes and wiring that have a fine pattern can be more easily formed.

Examination of Recess Patterning Properties

As for each of films obtained by the same process as in the "Contact angle", the film thicknesses of the exposed portion (the recess portion) and the non-exposed portion (the projection portion) were measured using a contact type thickness-meter (Alpha-Step IQ, manufactured by KEYENCE CORPORATION). Then, the difference between the film thickness of the non-exposed portion and the film thickness of the exposed portion was calculated. In Example 5 and Example 6, the film thicknesses were reduced approximately by half due to exposure. By contrast, in Example 7, exposure scarcely causes a change in the film thickness. In other words, the adjustment of the composition of the radiation-sensitive composition allows the amount of change in film thickness by exposure to be controlled, while clearly maintaining the boundary between the lyophilic portion and the lyophobic portion.

Surface Free Energy

Figure 11:
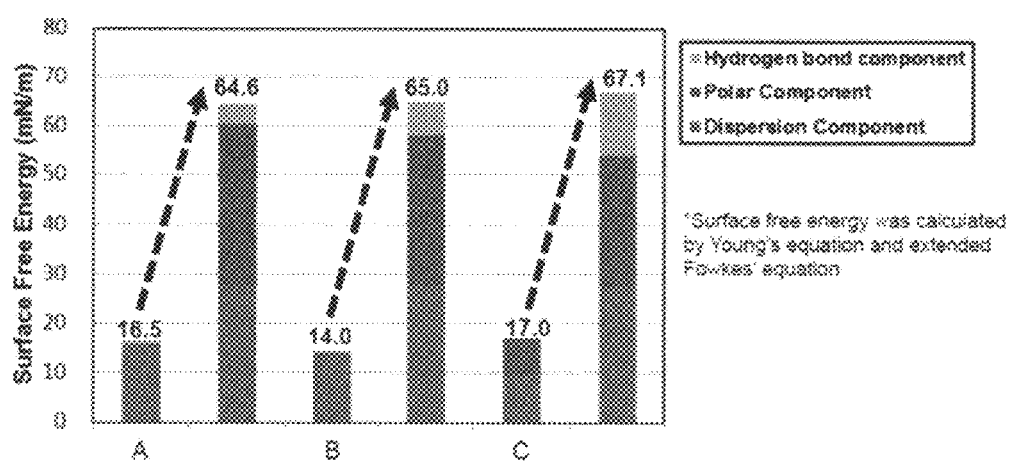
FIG. 11 is a graph showing surface free energy before and after the exposure of the radiation-sensitive composition.

As for each of films obtained by the same process as in the "Contact angle", surface free energy in the exposed portion (the recess portion) and the non-exposed portion (the projection portion) were calculated using the Young equation and the extended Fowkes equation. FIG. 11 is a graph showing surface free energy before and after exposure by component (hydrogen bond component, polar component, dispersion component). A significant increase in surface free energy by exposure was observed.

Refractive Index

Films were formed using the radiation-sensitive compositions prepared in Examples 4 to 7 by the same method as in the "Examples 1 to 3 and Comparative Examples 1 to 2", except that the prepared film samples had the respective film thicknesses of 408 nm, 633 nm, and 828 nm. Refractive indexes in the formed lyophilic/lyophobic patterned films were measured using a prism camera (Model-2010, manufactured by Metricon Corporation) and spectroscopic ellipsometry (M-2000D, manufactured by J.A. Woollam Co., Inc.).

Table 4 shows the results. In the table, Measurement 1 represents a measurement using the prism camera, and Measurement 2 represents a measurement using spectroscopic ellipsometry. It was found that, in the films obtained using the radiation-sensitive compositions, the refractive indexes were increased after exposure.

TABLE 4

| | Refractive Index | | | | | |
|---|---|---|---|---|---|---|
| | 408 nm | | 633 nm | | 828 nm | |
| | Measurement 1 | Measurement 2 | Measurement 1 | Measurement 2 | Measurement 1 | Measurement 2 |
| exposed portion (lyophilic) | 1.542 | 1.544 | 1.517 | 1.517 | 1.512 | 1.509 |
| non-exposed portion (lyophilic) | 1.483 | 1.488 | 1.464 | 1.467 | 1.459 | 1.461 |

Others

Figure 12:
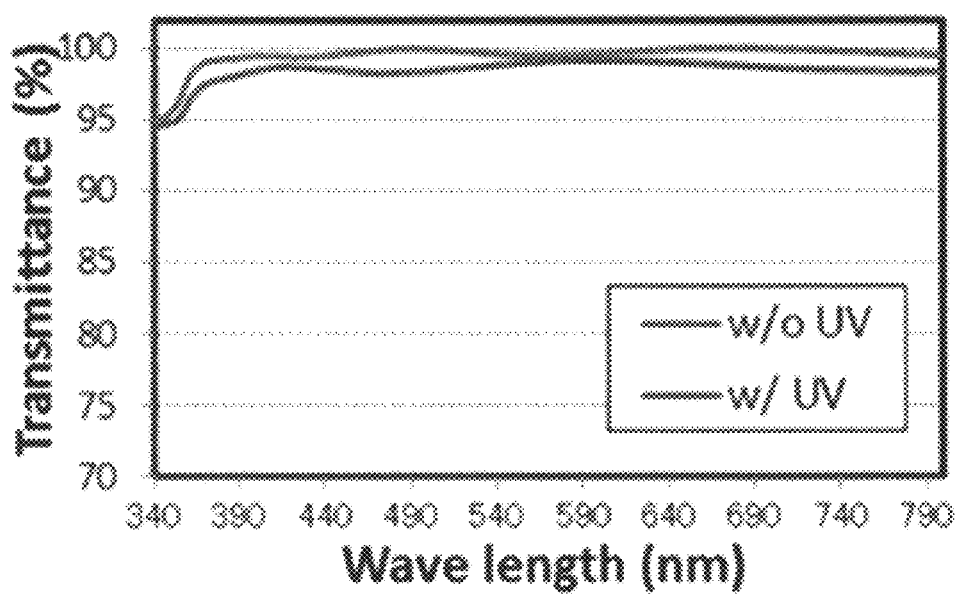
FIG. 12 is a graph showing the relationship between the measured transmittance of the radiation-sensitive composition and the wavelength of incident light.

Using the radiation-sensitive compositions prepared independently from the compositions in Examples 1 to 3, films were formed by the same process as in the "Examples 1 to 3 and Comparative Examples 1 to 2". The transmittance of the exposed portion, the relative dielectric constant, the breakdown voltage, and the leakage current in the formed films were measured. Table 5 shows the results. FIG. 12 is a graph showing the relationship between the measured transmittance and the wavelength of incident light. It was found that the films obtained using the radiation-sensitive compositions had high transparency and had a dielectric strength on the same level as a common cross-linked acrylic resin.

TABLE 5

| Transmittance (@400 nm) | >98% at 1.0 µm |
| Relative Dielectric Constant (1 MHz) | 3.1~4.0 |
| Breakdown Voltage | 3.0 MV/cm |
| Leakage Current | 0.1 mA/cm$^2$ @3.0 MV/cm |

Electronic Device

First Embodiment

Figure 13:
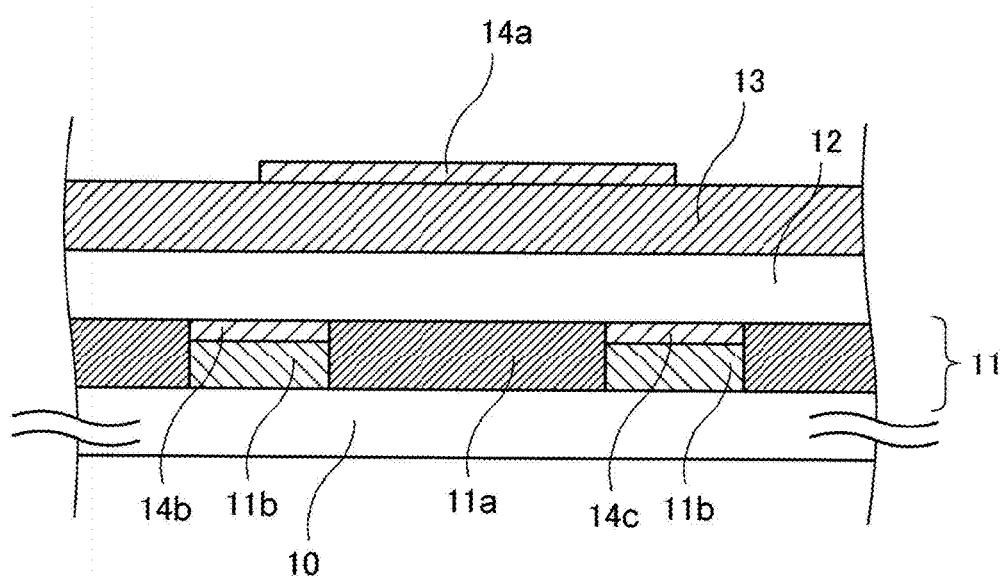
FIG. 13 is a cross-sectional view illustrating the configuration of a thin film transistor according to a first embodiment of the present invention.

Using FIG. 13, the configuration of a thin film transistor according to a first embodiment of the present invention will be described in detail. FIG. 13 is a cross-sectional view illustrating the configuration of the thin film transistor according to the first embodiment of the present invention. In the present embodiment, there will be described a so-called staggered type thin film transistor in which a source electrode 14b and a drain electrode 14c are provided below a semiconductor layer 12, and a gate electrode 14a is provided above the semiconductor layer 12.

As illustrated in FIG. 13, the thin film transistor according to the present embodiment includes a first insulating layer 11 provided on a substrate 10; a source electrode 14b and a drain electrode 14c provided on an irradiated portion 11b formed by irradiating the first insulating layer 11 with energy; a semiconductor layer 12 provided so as to cover the first insulating layer 11, the source electrode 14b, and the drain electrode 14c; a second insulating layer 13 provided on the semiconductor layer 12; and a gate electrode 14a provided on the second insulating layer 13. In the thin film transistor according to the present embodiment, the source electrode 14b and the drain electrode 14c are provided so as to be located on the first insulating layer 11 formed of a hydrophilic/hydrophobic material and to be embedded therein. Therefore, the unevenness caused by the source electrode 14b and the drain electrode 14c is suppressed, whereby the thin film transistor is highly flat.

Figure 14A:
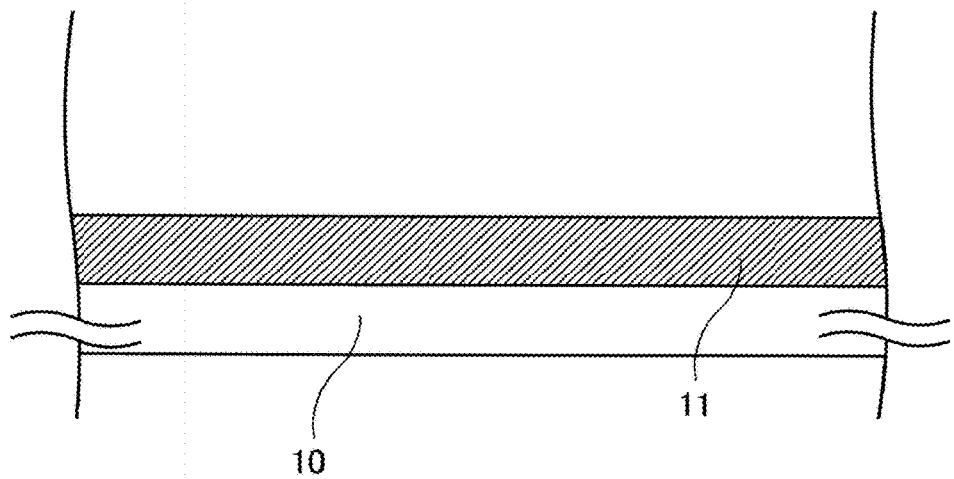
FIG. 14A to FIG. 14C are a cross-sectional view illustrating a method for manufacturing the thin film transistor according to the first embodiment of the present invention.
Figure 14B:
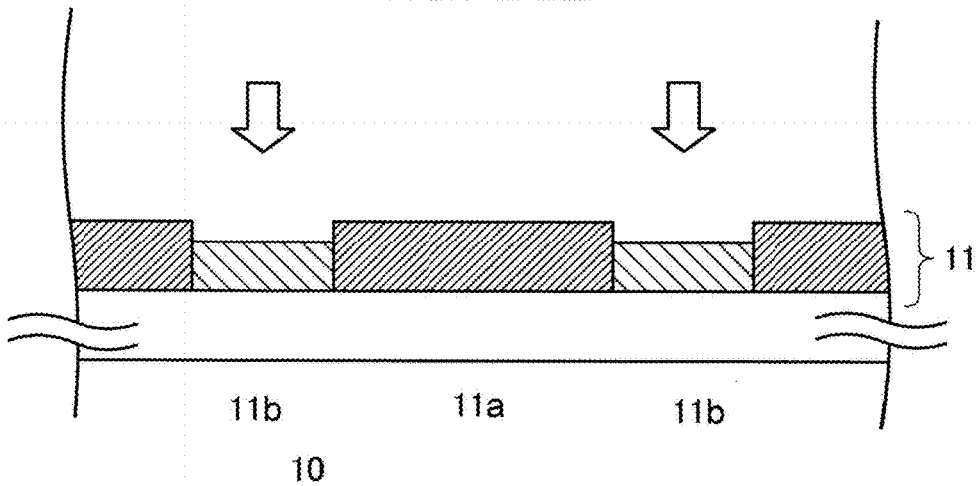
Figure 14C:
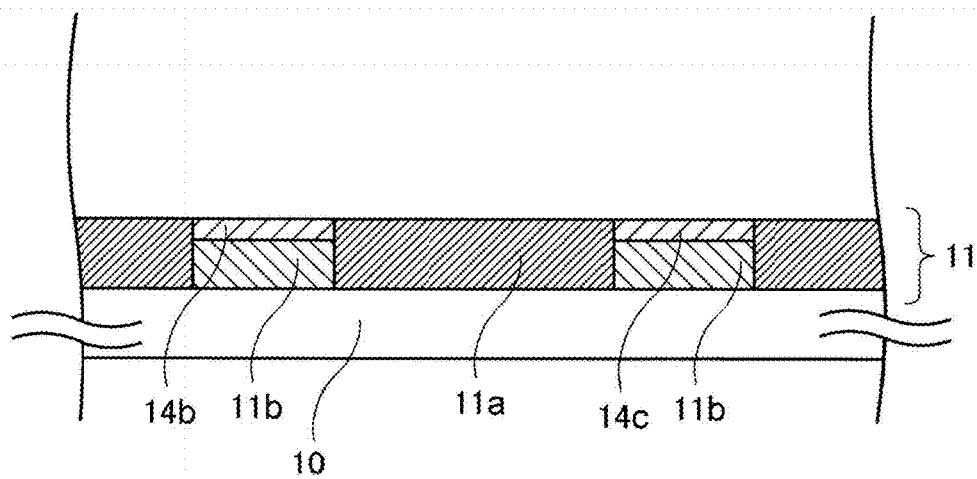

Using FIG. 14A, FIG. 14B, FIG. 14C, FIG. 15A, FIG. 15B, and FIG. 15C, a method for manufacturing the thin film transistor according to the first embodiment of the present invention will be described in detail. FIG. 14 A, FIG. 14B, FIG. 14C, FIG. 15A, FIG. 15B, and FIG. 15C are cross-sectional views illustrating the method for manufacturing the thin film transistor according to the first embodiment of the present invention. In the present embodiment, first, the first insulating layer 11 formed of a hydrophilic/hydrophobic material is formed on a first surface of the substrate 10 (FIG. 14A).

Examples of a material usable for the substrate 10 include glass, quartz, silicon, and resin.

As the substrate 10, resin substrates, glass substrates, and semiconductor substrates, which have been conventionally used for electronic circuits, are preferable because a substrate with a wiring that is finally obtained by a process for manufacturing a wiring to be formed on the radiation-sensitive composition is preferably used as it is for, for example, electronic circuits.

Note that, before the hydrophilic/hydrophobic material is formed on the substrate 10, the substrate surface may be subject to pretreatments, such as washing, roughening and coarsening, and the addition of fine projections-and-recesses to the surface, as needed.

The hydrophilic/hydrophobic material is formed by applying a solution of the radiation-sensitive composition to the substrate. The process for applying the solution of the radiation-sensitive composition is not limited to a particular one, and an application process described in WO2014/178279 may be used. Among various application processes, slit-die coating and spin coating are particularly preferable.

The thickness of the hydrophilic/hydrophobic material formed by the application of the radiation-sensitive composition may be suitably adjusted in accordance with a desired usage, but, is preferably 0.1 µm to 20 µm, and more preferably 0.2 µm to 10 µm.

Pre-baking may be performed after the application of the radiation-sensitive composition. Conditions for the pre-baking vary depending on, for example, the composition of the radiation-sensitive composition to be used, but, the pre-baking is performed preferably approximately at 60° C. to 120° C. for 1 minute to 10 minutes.

Next, the source electrode 14b and the drain electrode 14c are formed in a region for forming a source electrode (hereinafter, referred to as a source electrode formation region) and a region for forming a drain electrode (hereinafter, referred to as a drain electrode formation region) on the first insulating layer 11, respectively. In the present embodiment, the electrodes are formed by an application process. Specifically, the source electrode formation region and the drain electrode formation region on the first insulating layer 11 are irradiated with energy of a specific wavelength to make lyophilic the source electrode formation region and the drain electrode formation region and form a recess portion (FIG. 14B). As illustrated in FIG. 14B, a predetermined region of the hydrophilic/hydrophobic material formed on the substrate 10 is irradiated with energy to form a film having an irradiated portion 11b and a non-irradiated portion 11a.

Through the step illustrated in FIG. 14B, an acid dissociative group in the hydrophilic/hydrophobic material leaves by the effect of the acid generator, and volatilizes. As a result, the film thickness of the irradiated portion 11b becomes thinner than the film thickness of the non-irradiated portion 11a, and a recess portion is thus formed. At this time, when the acid dissociative group has a fluorine atom, the non-irradiated portion 11a obtained through the step illustrated in FIG. 14B is lyophobic, and by contrast, with the elimination of the acid dissociative group, the irradiated portion 11b becomes more lyophilic than the non-irradiated portion 11a.

Thus, in the case where the composition including a compound containing an acid dissociative group having a fluorine atom is used in the step illustrated in FIG. 14B, a film having the lyophobic non-irradiated portion 11a and the irradiated portion 11b serving as a recess portion which is more lyophilic than the non-irradiated portion 11a is formed on the substrate through this step.

In the step illustrated in FIG. 14B, a predetermined pattern can be drawn by exposure via a photomask having the predetermined pattern or using a direct-writing exposure system so as to form the irradiated portion having the same form as a desired wiring form.

In the present invention, examples of the radiation used for the exposure include visible radiation, ultraviolet rays, far-ultraviolet rays, charged particle beams, and X-rays.

Among these radiations, a radiation having a wavelength in a range of 190 nm to 450 nm is preferable, and in particular, a radiation containing 365-nm ultraviolet rays is more preferable.

The amount of exposure in the step illustrated in FIG. 14B is preferably such that the radiation exposure results in the formation of a recess portion having a film thickness in the following range.

Although depending on the composition of the hydrophilic/hydrophobic material, the film thickness of the recess portion of the first insulating layer 11 is thinner approximately by 5% to 30% than the film thickness of a region, other than the recess portion, of the first insulating layer 11. In the present embodiment, the film thickness of the recess portion is thinner approximately by 10% to 30% than the film thickness of a region, other than the recess portion, of the first insulating layer 11.

Post-baking, not illustrated, may be performed after patterning of the first insulating layer 11. Conditions for the post-baking vary depending on, for example, the composition of the hydrophilic/hydrophobic material to be used, but, the post-baking is performed preferably approximately at 60° C. to 120° C. for 1 minute to 10 minutes. The post-baking allows further volatilization of a component in which an acid dissociative group has left by the effect of the acid generator in an irradiated portion 31. As a result, a recess in the irradiated portion 31 becomes deeper (the film thickness of the recess portion becomes still smaller), whereby a film in which the film thickness of the recess portion is thinner by 10% or more than the film thickness of a region other than the recess portion can be formed.

In the case where the composition including a compound containing an acid dissociative group having a fluorine atom is used as the hydrophilic/hydrophobic material, in combination with the post-baking, a film having a lyophobic region and a recess portion that is more lyophilic than the lyophobic region and further deeper is formed on the substrate. Then, when a film-forming material in liquid form is applied onto such film, due to a large difference in film thickness between the non-irradiated portion 11a and the irradiated portion 11b, the unevenness of the film surface cause the material to gather easily on the recess portion. However, not only the effect of the form of the film surface, but also the lyophilic/lyophobic properties of the surface cause the material to gather easily on the recess portion, whereby a wiring in a more desired form, specifically, a wiring having a fine pattern can be more easily formed.

Furthermore, in the case where the composition including a compound containing an acid dissociative group having a fluorine atom is used for the hydrophilic/hydrophobic material, the group having the fluorine atom leaves by energy irradiation. Furthermore, since this leaving group comparatively easily volatilizes, a film having a large difference in film thickness between the recess portion and a region other than the recess portion can be more simply and more easily formed by the post-baking.

Examples of a method for baking the film in the post-baking include: baking of the coated substrate by a hot plate, a batch type oven, or a conveyor type oven; hot-air drying using a dryer or other tools; and vacuum baking.

Conditions for the baking vary depending on, for example, the composition of the hydrophilic/hydrophobic material and the thickness of the film, but, the baking is performed preferably approximately at 60° C. to 150° C. for 3 minutes to 30 minutes.

In the post-baking, there is desirably formed a film that is such that the film thickness of the recess portion is preferably thinner by 2% or more, more preferably thinner by 2% to 40%, and still more preferably thinner by 10% to 30% than the film thickness of a region other than the recess portion. When the obtained film has such form, on the occasion of applying a film-forming material to the recess portion, such level difference of the uneven film surface causes the material to be less likely to overflow from the recess portion and also causes the material to be less likely to remain in a region other than the recess portion, and accordingly, a large amount of the film-forming material can be applied. Thus, the film can be formed thicker by the recess depth of the recess portion, and therefore, a low resistance wiring can be attained, and furthermore, even when a wiring material is used in large amounts, a wiring having excellent linearity and a fine pattern can be attained.

Note that the film thickness of the recess portion obtained in the post-baking may be suitably adjusted in accordance with a desired usage, but, is preferably 0.01 μm to 18 μm, and more preferably 0.05 μm to 15 μm.

Then, a metal-containing solution is applied onto the first insulating layer 11 to form the source electrode 14b and the drain electrode 14c in the source electrode formation region and the drain electrode formation region, respectively (FIG. 14C).

The process for the application is not limited to a particular process, and an application process described in WO2014/178279 may be used. Among various application processes, dipping, spraying, spin coating, slit-die coating, offset printing, ink-jet printing, and dispensing are particularly preferable.

The hydrophilic/hydrophobic material obtained by energy irradiation has the lyophobic non-irradiated portion 11a and the irradiated portion 11b which is more lyophilic than the non-irradiated portion 11a, and therefore, in the case where a film-forming material in liquid form is used, the non-irradiated portion 11a repels the material, and the material gathers easily on the irradiated portion 11b, and accordingly, there is caused a state in which the electrode material is applied along the irradiated portion 11b.

A conductive pattern of the present embodiment which pattern is formed on the hydrophilic/hydrophobic material of the present embodiment is effective in forming wiring and an electrode that have excellent properties, such as conductivity and adhesion, and have a fine pattern.

Furthermore, in the present embodiment, the source electrode 14b and the drain electrode 14c can be formed without using a well-known photolithographic step. Thus, the number of production steps can be reduced.

Furthermore, when the source electrode 14b and the drain electrode 14c are formed so as to be embedded in the recess portion formed by energy irradiation, the unevenness caused by these electrodes can be suppressed, and accordingly, a highly-flat thin film transistor can be attained.

Although not illustrated, after the formation of the source electrode 14b and the drain electrode 14c, an entire surface of the substrate may be irradiated with energy of a specific wavelength from the first surface side to make the non-irradiated portion 11a of the insulating layer 11 lyophilic and thinner. Thus, even if, for example, ultraviolet rays leak into the thin film transistor from the outside after the completion of steps, the hydrophilic/hydrophobic material neither changes its properties nor becomes thinner due to the ultraviolet rays, and thus, the obtained thin film transistor has higher stability.

Figure 15A:
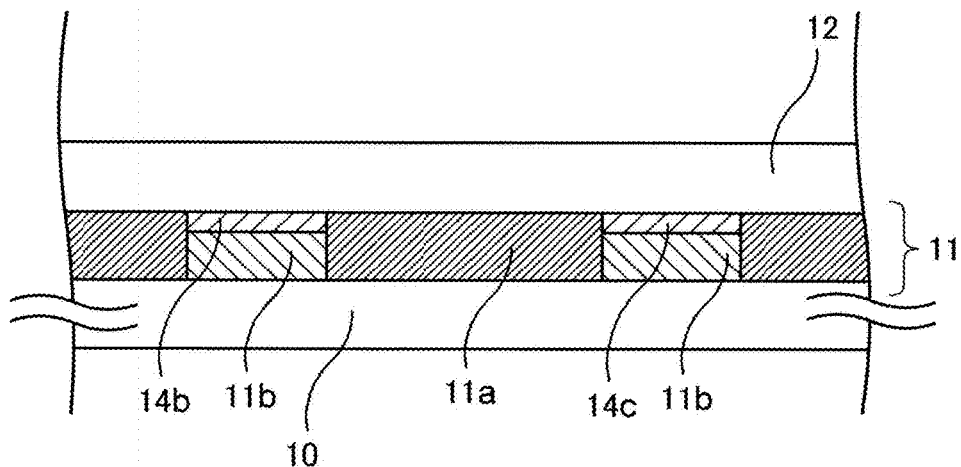
FIG. 15A to FIG. 15C are a cross-sectional view illustrating the method for manufacturing the thin film transistor according to the first embodiment of the present invention.

Next, the semiconductor layer 12 is formed so as to cover the first insulating layer 11, the source electrode 14b, and the drain electrode 14c (FIG. 15A).

As the semiconductor layer 12, amorphous silicon or polycrystalline silicon may be used. As the semiconductor layer 12, an oxide semiconductor may be used. Specifically, InGaZnO-based semiconductors, InZnO-based semiconductors, InO-based semiconductors, GaO-based semiconductors, SnO-based semiconductors, and oxide semiconductors of the mixture thereof may be used. Alternatively, inorganic semiconductors, such as gallium arsenide (GaAs); high molecular weight organic semiconductors, such as polythiophene, polyallylamine and derivatives thereof; and low molecular weight organic semiconductors, such as pentacene, tetracene, and derivatives thereof may be used. As a process for forming the semiconductor layer 12, for example, sputtering, vacuum deposition, and laser ablation may be used for oxide semiconductors, and ink-jet printing may be used for organic semiconductors.

Figure 15B:
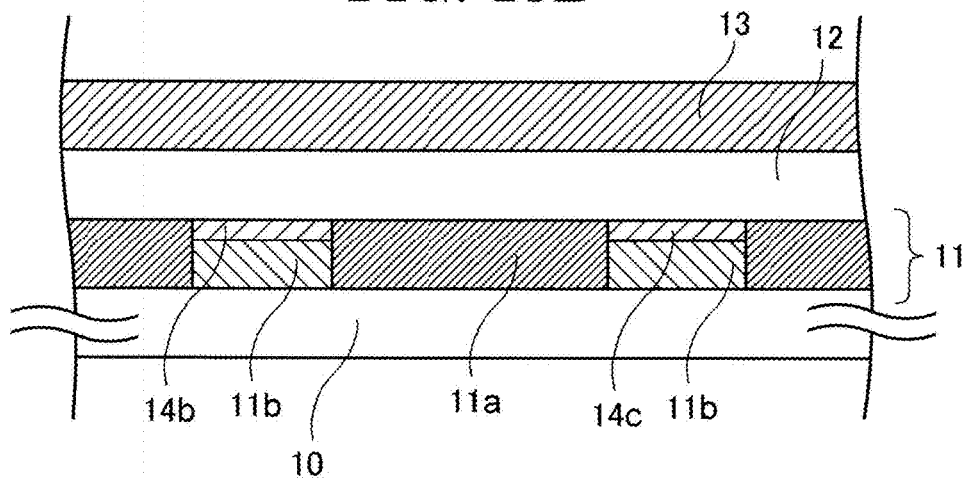

The second insulating layer 13 which functions as a gate insulating film is formed on the semiconductor layer 12 (FIG. 15B). A material for the second insulating layer 13 is not limited to a particular material, but, specifically, for example, inorganic materials, such as $SiO_2$, SiN, SiON, and $Al_2O_3$, and organic materials, such as a fluororesin, polyester/melamine resin, polyvinylphenol (PVP), and polyvinyl alcohol (PVA), may be used. As a process for forming the second insulating layer 13, for example, spin coating, relief printing, ink-jet printing, vacuum deposition, sputtering, and CVD may be employed, but the process is not limited to these.

Figure 15C:
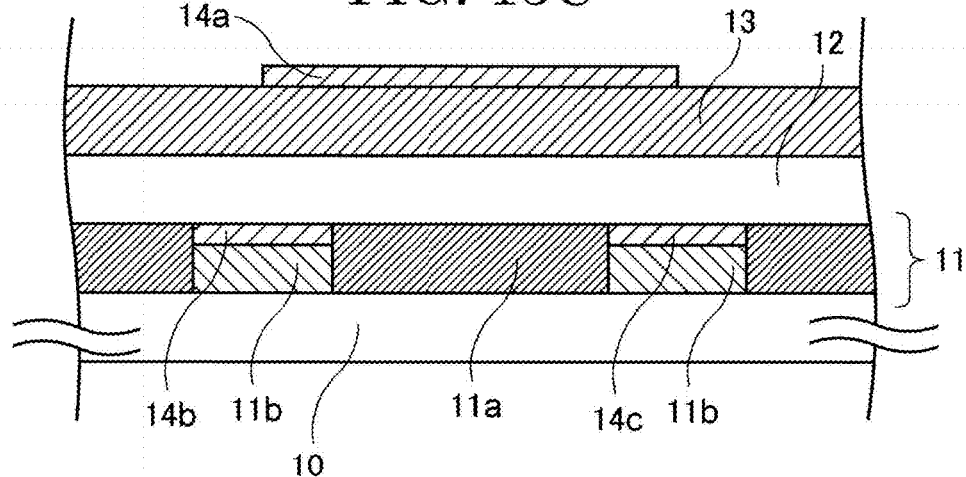

Next, the gate electrode 14a is formed on the second insulating layer 13 (FIG. 15C). In the present embodiment, the gate electrode 14a is formed using photolithography. Although not illustrated, first, a conductive film is formed on the second insulating layer 13. For the formation of the conductive film, thin film deposition processes, typically such as sputtering, vacuum deposition, pulsed laser deposition, ion plating, and organic metal chemical vapor deposition, may be used. Subsequently, photoresist is applied onto the conductive film. Subsequently, using the photoresist as a mask, the conductive film is selectively etched to form the gate electrode 14a. The photoresist is removed after the formation of the gate electrode 14a.

For the second insulating layer 13 which functions as a gate insulating film, a hydrophilic/hydrophobic material may be used. In this case, the second insulating layer 13 is formed of the hydrophilic/hydrophobic material, and the gate electrode 14a is formed in such a manner that a region in which a gate electrode is to be formed on the second insulating layer 13 (hereinafter, referred to as a gate electrode formation region) is irradiated with energy of a specific wavelength to make the gate electrode formation region lyophilic and form a recess portion therein, and a metal-containing solution is applied onto the second insulating layer 13 to form a gate electrode in the gate electrode formation region. Thus, when the gate electrode 14a is formed so as to be embedded in the recess portion formed by energy irradiation, the unevenness caused by the electrode can be suppressed, and accordingly, a highly-flat thin film transistor can be attained.

Although depending on the composition of the hydrophilic/hydrophobic material, the film thickness of the recess portion of the second insulating layer 13 is thinner approximately by 5% to 30% than the film thickness of a region, other than the recess portion, of the second insulating layer 13. In the present embodiment, the film thickness of the recess portion is thinner approximately by 10% to 30% than the film thickness of a region, other than the recess portion, of the second insulating layer 13.

After the formation of the gate electrode 14a, an entire surface of the substrate may be irradiated with energy of a specific wavelength from the first surface side to make a non-irradiated portion of the second insulating layer 13 lyophilic and thinner. This allows the achievement of a stable thin film transistor being such that, even if, for example, ultraviolet rays leak into the thin film transistor from the outside after the completion of steps, the hydrophilic/hydrophobic material neither changes its properties nor becomes thinner due to the ultraviolet rays.

Second Embodiment

Figure 16:
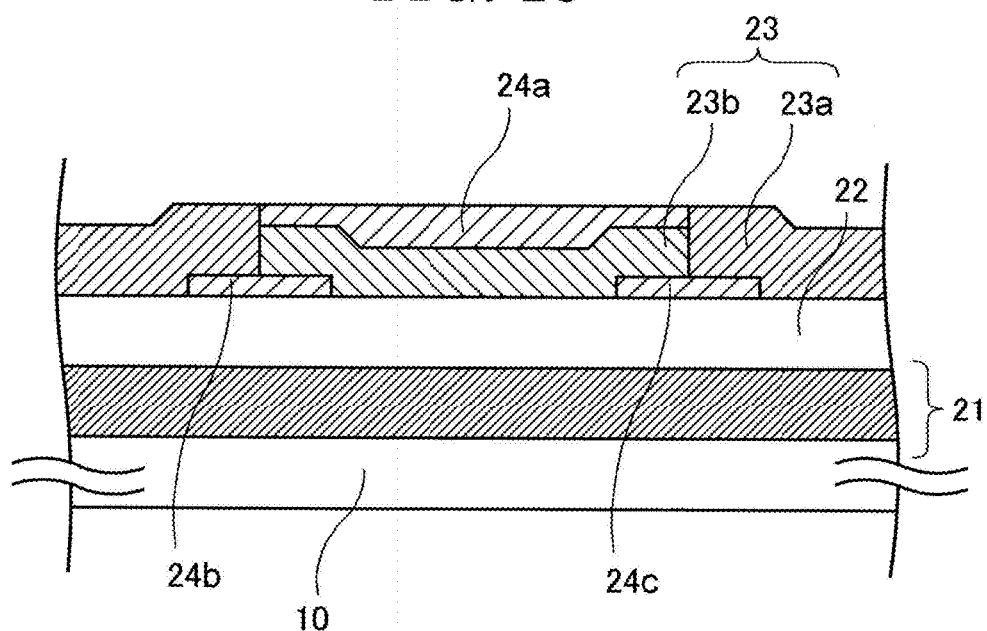
FIG. 16 is a cross-sectional view illustrating the configuration of a thin film transistor according to a second embodiment of the present invention.

Using FIG. 16, the configuration of a thin film transistor according to a second embodiment of the present invention will be described in detail. FIG. 16 is a cross-sectional view illustrating the configuration of the thin film transistor according to the second embodiment of the present invention. In the present embodiment, there will be described a so-called planar type thin film transistor in which a source electrode 24b, a drain electrode 24c, and a gate electrode 24a are provided above a semiconductor layer.

As illustrated in FIG. 16, the thin film transistor according to the present embodiment includes a semiconductor layer 22 provided on a substrate 10; a source electrode 24b and a drain electrode 24c provided on the semiconductor layer; an insulating layer 23 provided so as to cover the semiconductor layer 22, the source electrode 24b, and the drain electrode 24c; and a gate electrode 24a provided on the insulating layer 23. In the thin film transistor according to the present embodiment, the gate electrode 24a is provided so as to be located on the insulating layer 23 formed of a hydrophilic/hydrophobic material and to be embedded therein. Therefore, the unevenness caused by the gate electrode 24a is suppressed, whereby the thin film transistor is highly flat.

Using FIG. 17A, FIG. 17B, FIG. 17C, FIG. 18A, and FIG. 18B, a method for manufacturing the thin film transistor according to the second embodiment of the present invention will be described in detail. FIG. 17A, FIG. 17B, FIG. 17C, FIG. 18A, and FIG. 18B are cross-sectional views illustrating the method for manufacturing the thin film transistor according to the second embodiment of the present invention. In the present embodiment, first, the insulating layer 21 serving as a base film is formed on a first surface of the substrate 10, and, on the insulating layer 21, the semiconductor layer 22 is formed (FIG. 17A). As a process for forming the semiconductor layer 22, the process described in the first embodiment can be used, and therefore, detailed description thereof is omitted here.

Next, the source electrode 24b and the drain electrode 24c are formed on the semiconductor layer 22 (FIG. 17B). In the present embodiment, the source electrode 24b and the drain electrode 24c are formed using photolithography. Although not illustrated, first, a conductive film is formed on the substrate 10. For the formation of the conductive film, thin film deposition processes, typically such as sputtering, vacuum deposition, pulsed laser deposition, ion plating, and organic metal chemical vapor deposition, may be used. Subsequently, photoresist is applied onto the conductive film. Subsequently, using the photoresist as a mask, the conductive film is selectively etched to form the source electrode 24b and the drain electrode 24c. The photoresist is removed after the formation of the source electrode 24b and the drain electrode 24c.

Next, the insulating layer 13 formed of the hydrophilic/hydrophobic material and functioning as a gate insulating film is formed so as to cover the semiconductor layer 22, the source electrode 24*b*, and the drain electrode 24*c* (FIG. 17C). As a process for forming the insulating layer 13 formed of a hydrophilic/hydrophobic material, the process described in the first embodiment can be used, and therefore, detailed description thereof is omitted here.

Figure 18A:
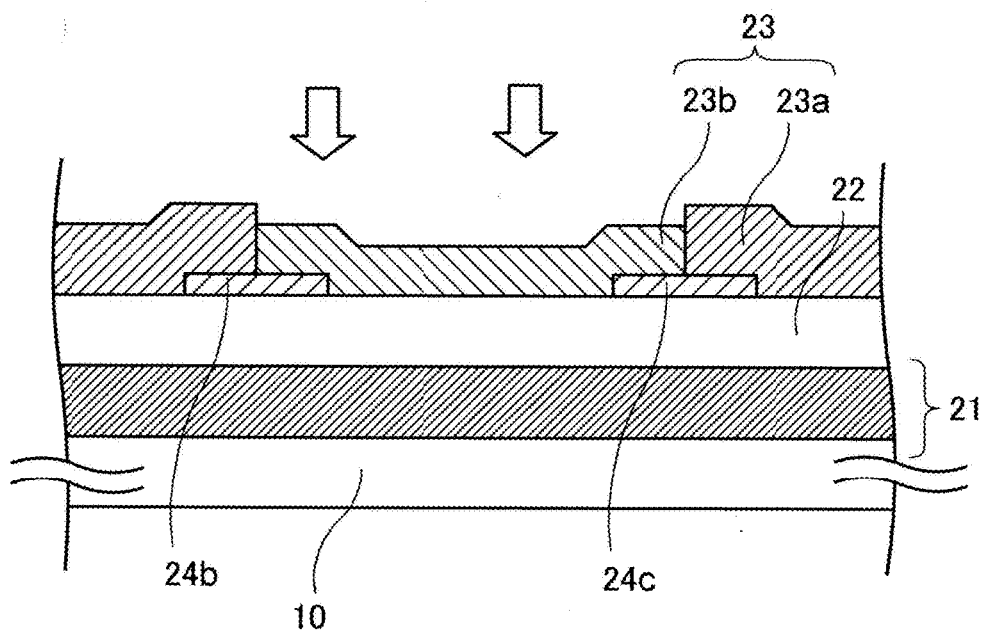
FIG. 18A and FIG. 18B are a cross-sectional view illustrating the method for manufacturing the thin film transistor according to the second embodiment of the present invention.
Figure 18B:
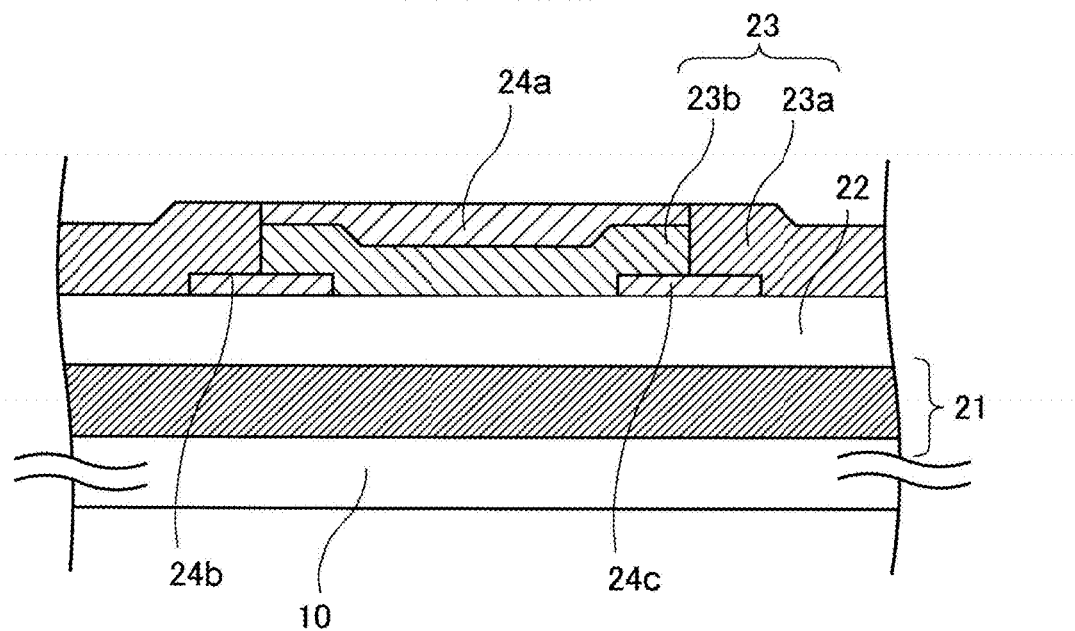

Next, the gate electrode 24*a* is formed in a region for forming a gate electrode on the insulating layer 23 (hereinafter, referred to as a gate electrode formation region). In the present embodiment, the electrode is formed by an application process. Specifically, the gate electrode formation region on the insulating layer 23 is irradiated with energy of a specific wavelength to make lyophilic the gate electrode formation region and form a recess portion (FIG. 18A). Then, a metal-containing solution is applied onto the insulating layer 23 to form the gate electrode 24*a* in the gate electrode formation region (FIG. 18B). As a process for forming the gate electrode 24*a* on the hydrophilic/hydrophobic material, the process for forming the source electrode 24*b* and the drain electrode 24*c* which process is described in the first embodiment can be used, and therefore, detailed description thereof is omitted here.

Although depending on the composition of the hydrophilic/hydrophobic material, the film thickness of the recess portion of the insulating layer 23 is thinner approximately by 5% to 30%, and preferably thinner approximately by 10% to 20% than the film thickness of a region, other than the recess portion, of the insulating layer 23. In the present embodiment, the film thickness of the recess portion is thinner approximately by 10% to 30% than the film thickness of a region, other than the recess portion, of the insulating layer 23.

After the formation of the gate electrode 24*a*, an entire surface of the substrate may be irradiated with energy of a specific wavelength from the first surface side to make a non-irradiated portion 23*a* of the insulating layer 23 lyophilic and thinner. Thus, even if, for example, ultraviolet rays leak into the thin film transistor from the outside after the completion of steps, the hydrophilic/hydrophobic material neither changes its properties nor becomes thinner due to the ultraviolet rays, and thus, the obtained thin film transistor has higher stability.

Third Embodiment

Figure 19:
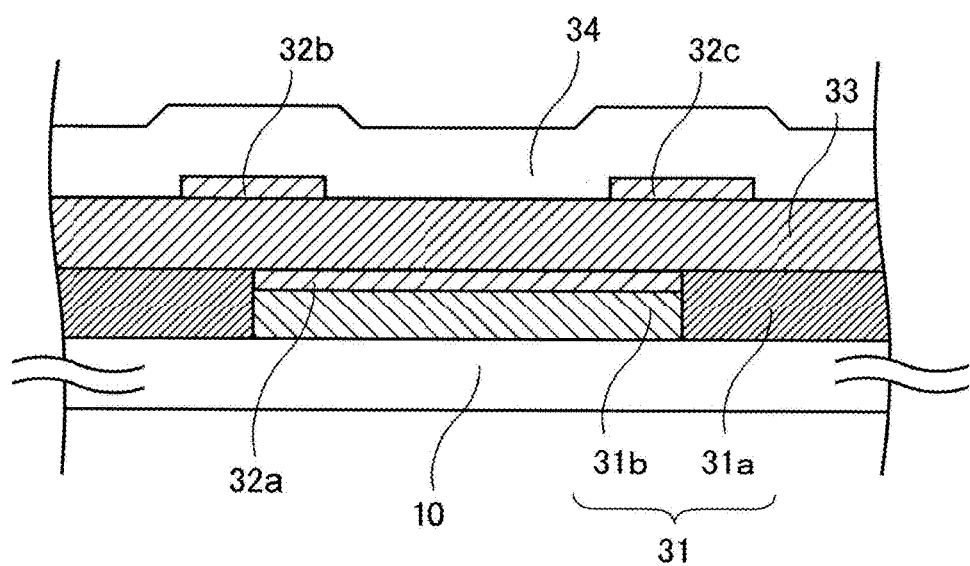
FIG. 19 is a cross-sectional view illustrating the configuration of a thin film transistor according to a third embodiment of the present invention.

Using FIG. 19, the configuration of a thin film transistor according to a third embodiment of the present invention will be described in detail. FIG. 19 is a cross-sectional view illustrating the configuration of the thin film transistor according to the third embodiment of the present invention. In the present embodiment, there will be described a so-called reverse planar type thin film transistor in which a source electrode 32*b*, a drain electrode 32*c*, and a gate electrode 32*a* are provided below a semiconductor layer 34.

Note that, as for materials and steps in the present embodiment that are the same as in the first embodiment and the second embodiment, duplicate description thereof will be omitted unless otherwise specifically noted.

As illustrated in FIG. 19, the thin film transistor according to the present embodiment includes a first insulating layer 31 provided on a substrate; a gate electrode 32*a* provided on the first insulating layer 31; a second insulating layer 33 provided so as to cover the first insulating layer 31 and the gate electrode 32*a*; a source electrode 32*b* and a drain electrode 32*c* provided on the second insulating layer 33; and a semiconductor layer 34 provided so as to cover the second insulating layer 33, the source electrode 32*b*, and the drain electrode 32*c*. In the thin film transistor according to the present embodiment, the gate electrode 32*a* is provided so as to be located on the insulating layer 31 formed of a hydrophilic/hydrophobic material and to be embedded therein. Therefore, unevenness caused by the gate electrode 32*a* is suppressed, whereby the thin film transistor is highly flat.

Figure 20A:
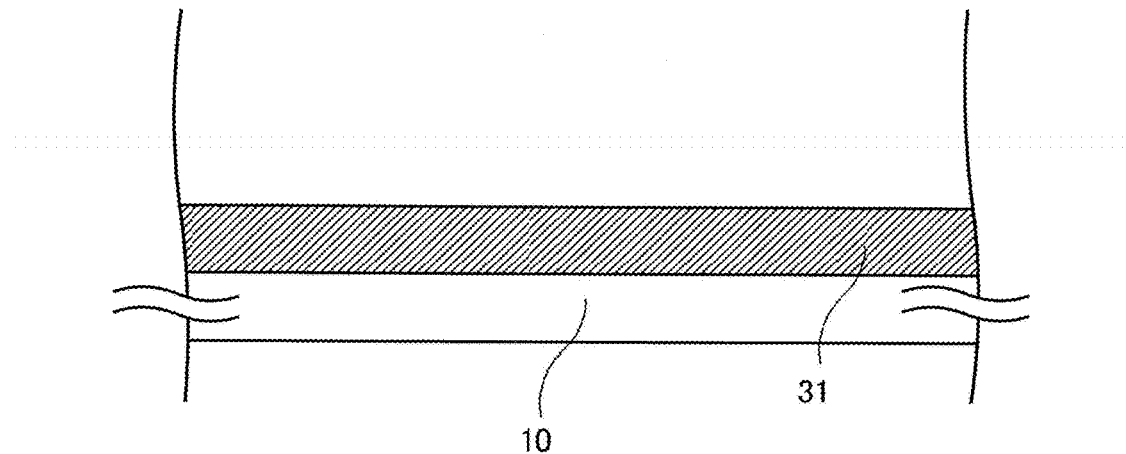
FIG. 20A to FIG. 20C are a cross-sectional view illustrating a method for manufacturing the thin film transistor according to the third embodiment of the present invention.
Figure 20B:
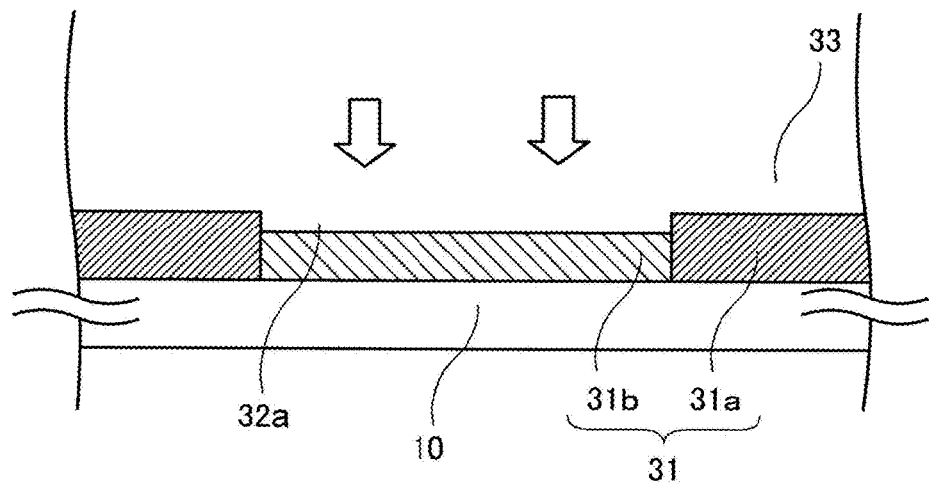
Figure 20C:
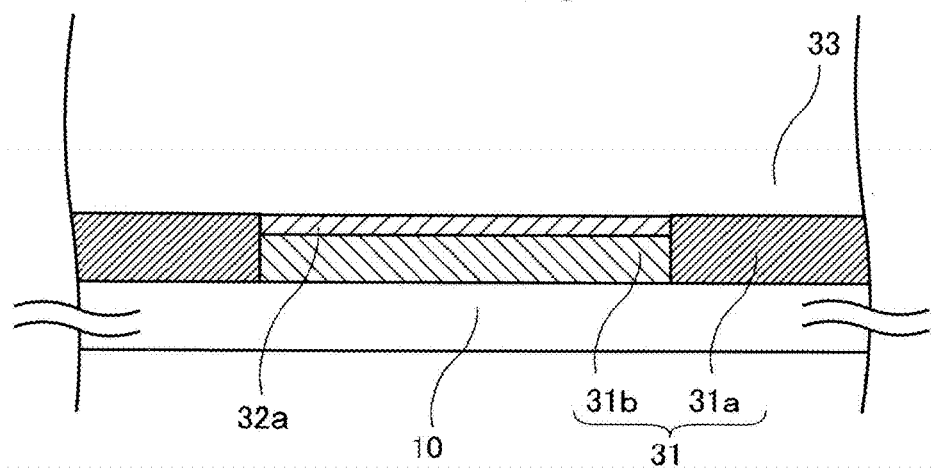

Using FIG. 20A, FIG. 20B, FIG. 20C, FIG. 21A, FIG. 21B, and FIG. 21C, a method for manufacturing the thin film transistor according to the third embodiment of the present invention will be described in detail. FIG. 20 A, FIG. 20B, FIG. 20C, FIG. 21A, FIG. 21B, and FIG. 21C are cross-sectional views illustrating the method for manufacturing the thin film transistor according to the third embodiment of the present invention. In the present embodiment, first, the first insulating layer 31 formed of a hydrophilic/hydrophobic material is formed on a first surface of a substrate 10 (FIG. 20A).

Next, the gate electrode 32*a* is formed in a predetermined gate electrode formation region on the first insulating layer 31. In the present embodiment, the electrode is formed by an application process. Specifically, the gate electrode formation region on the first insulating layer 31 is irradiated with energy of a specific wavelength to make the gate electrode formation region lyophilic and form a recess portion therein (FIG. 20B). Then, a metal-containing solution is applied onto the first insulating layer 31 to form the gate electrode 32*a* in the gate electrode formation region (FIG. 20C).

Although depending on the composition of the hydrophilic/hydrophobic material, the film thickness of the recess portion in the first insulating layer 31 is thinner approximately by 5% to 30%, and preferably thinner approximately by 10% to 20% than the film thickness of a region, other than the recess portion, of the first insulating layer 31. In the present embodiment, the film thickness of the recess portion is thinner approximately by 10% to 30% than the film thickness of a region, other than the recess portion, of the first insulating layer 31.

Although not illustrated, after the formation of the gate electrode 32*a*, an entire surface of the substrate may be irradiated with energy of a specific wavelength from the first surface side of the substrate to make a non-irradiated portion 31*a* of the first insulating layer 31 lyophilic and thinner. Thus, even if, for example, ultraviolet rays leak into the thin film transistor from the outside after the completion of steps, the hydrophilic/hydrophobic material neither changes its properties nor becomes thinner due to the ultraviolet rays, and thus, the obtained thin film transistor has higher stability.

Figure 21A:
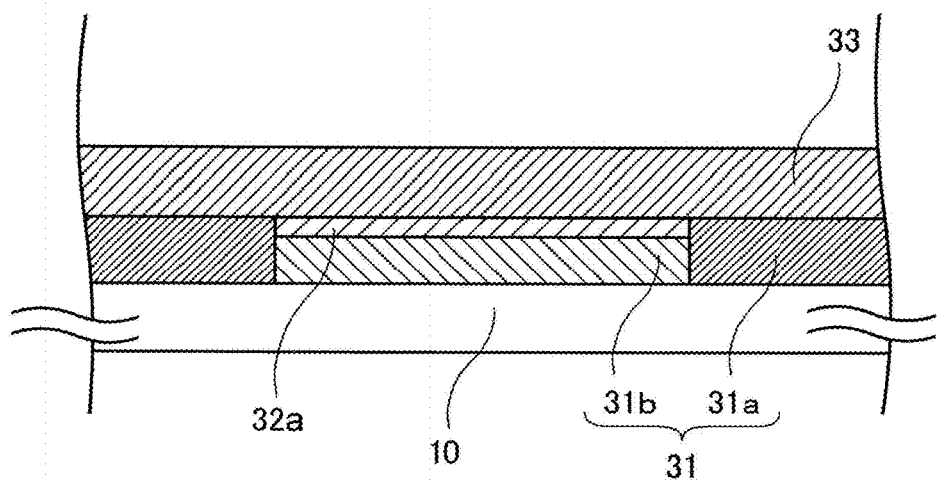
FIG. 21A to FIG. 21C are a cross-sectional view illustrating the method for manufacturing the thin film transistor according to the third embodiment of the present invention.

Next, the second insulating layer 33 which functions as a gate insulating film is formed so as to cover the first insulating layer 31 and the gate electrode 32 (FIG. 21A).

Figure 21B:
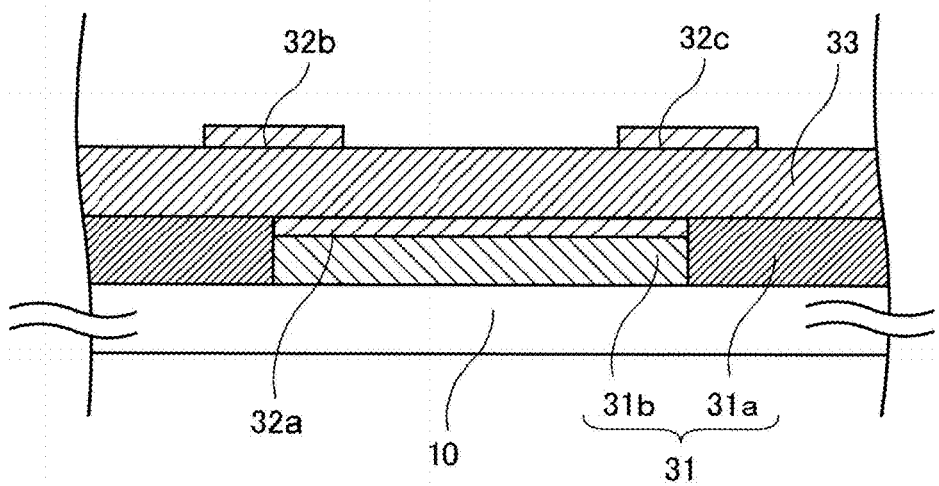

The source electrode 32*b* and the drain electrode 32*c* are formed on the second insulating layer 33 (FIG. 21B).

Figure 21C:
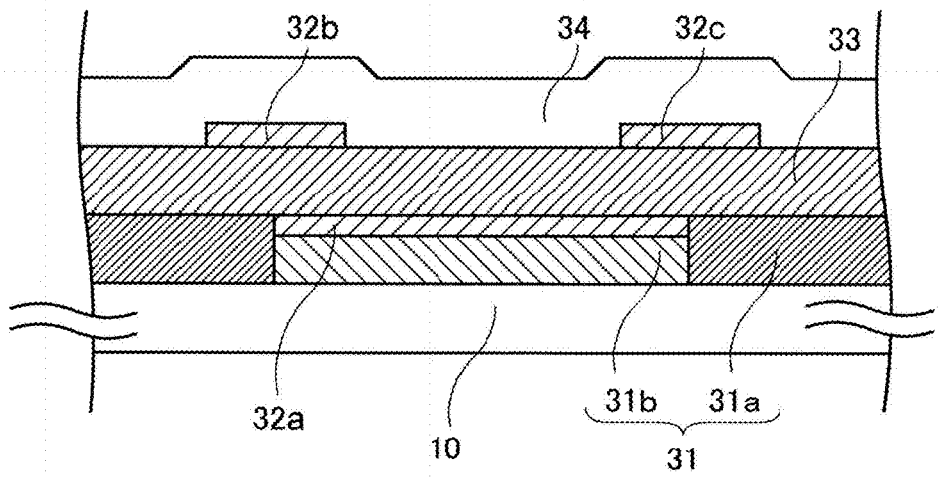

The semiconductor layer 34 is formed so as to cover the second insulating layer 33, the source electrode 32*b*, and the drain electrode 32*c* (FIG. 21C).

For the second insulating layer 33, a hydrophilic/hydrophobic material may be used. In this case, the second insulating layer 33 is formed of the hydrophilic/hydrophobic material, and the source electrode 32*b* and the drain electrode 32*c* are formed in such a manner that a source electrode formation region and a drain electrode formation region on the second insulating layer 33 are irradiated with energy of a specific wavelength to make lyophilic the source electrode formation region and the drain electrode formation region and form a recess portion therein, and a metal-containing solution is applied onto the second insulating layer 33 to form the source electrode 32*b* and the drain electrode 32c in the source electrode formation region and the drain electrode formation region, respectively.

Although depending on the composition of the hydrophilic/hydrophobic material, the film thickness of the recess portion of the second insulating layer is thinner approximately by 5% to 30%, and preferably thinner approximately by 10% to 20% than the film thickness of a region, other than the recess portion, of the second insulating layer. In the present embodiment, the film thickness of the recess portion is thinner approximately by 10% to 30% than the film thickness of a region, other than the recess portion, of the second insulating layer 33.

After the formation of the source electrode 32b and the drain electrode 32c, an entire surface of the substrate may be irradiated with energy of a specific wavelength from the first surface side to make a non-irradiated portion of the second insulating layer 33 lyophilic and thinner. Thus, even if, for example, ultraviolet rays leak into the thin film transistor from the outside after the completion of steps, the hydrophilic/hydrophobic material neither changes its properties nor becomes thinner due to the ultraviolet rays, and thus, the obtained thin film transistor has higher stability.

Fourth Embodiment

Figure 22:
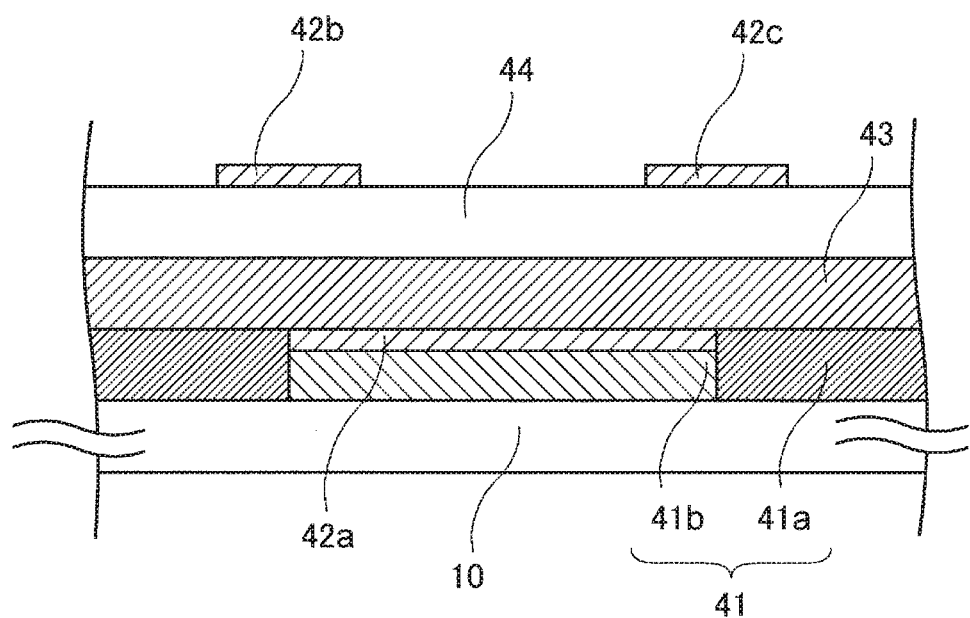
FIG. 22 is a cross-sectional view illustrating the configuration of a thin film transistor according to a fourth embodiment of the present invention.

Using FIG. 22, the configuration of a thin film transistor according to a fourth embodiment of the present invention will be described in detail. FIG. 22 is a cross-sectional view illustrating the configuration of the thin film transistor according to the fourth embodiment of the present invention. In the present embodiment, there will be described a so-called reverse staggered type thin film transistor in which a gate electrode 42a is provided below a semiconductor layer 44, and a source electrode 42b and a drain electrode 42c are provided above the semiconductor layer 44.

Note that, as for materials and steps in the present embodiment that are the same as in the first embodiment and the second embodiment, duplicate description thereof will be omitted unless otherwise specifically noted.

As illustrated in FIG. 22, the thin film transistor according to the present embodiment includes a first insulating layer 41 provided on a substrate 10; a gate electrode 42a provided on the first insulating layer 41; a second insulating layer 43 provided so as to cover the first insulating layer 41 and the gate electrode 42a; a semiconductor layer 44 provided on the second insulating layer 43; and a source electrode 42b and a drain electrode 42c provided on the semiconductor layer. In the thin film transistor according to the present embodiment, the gate electrode 42a is provided so as to be located on the insulating layer 41 formed of a hydrophilic/hydrophobic material and to be embedded therein. Therefore, unevenness caused by the gate electrode 42a is suppressed, whereby the thin film transistor is highly flat.

Figure 23A:
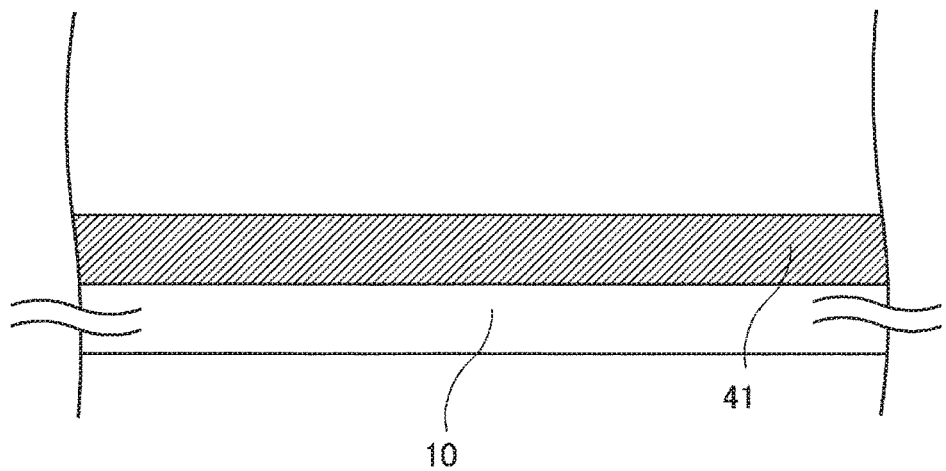
FIG. 23A to FIG. 23C are a cross-sectional view illustrating a method for manufacturing the thin film transistor according to the fourth embodiment of the present invention.

Using FIG. 23A, FIG. 23B, FIG. 23C, FIG. 24A, FIG. 24B and FIG. 24C, a method for manufacturing the thin film transistor according to the fourth embodiment of the present invention will be described in detail. FIG. 23A, FIG. 23B, FIG. 23C, FIG. 24A, FIG. 24B and FIG. 24C are cross-sectional views illustrating the method for manufacturing the thin film transistor according to the fourth embodiment of the present invention. In the present embodiment, first, the first insulating layer 41 formed of a hydrophilic/hydrophobic material is formed on a first surface of the substrate 10 (FIG. 23A).

Figure 23B:
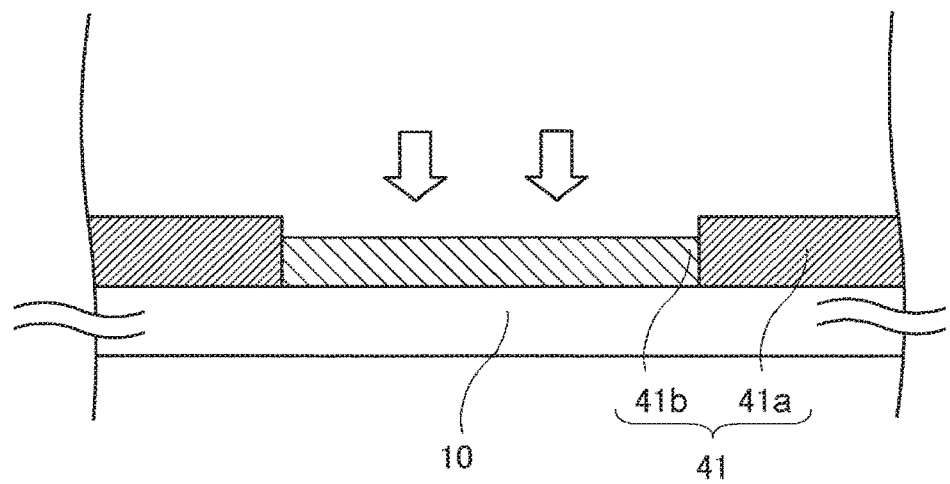
Figure 23C:
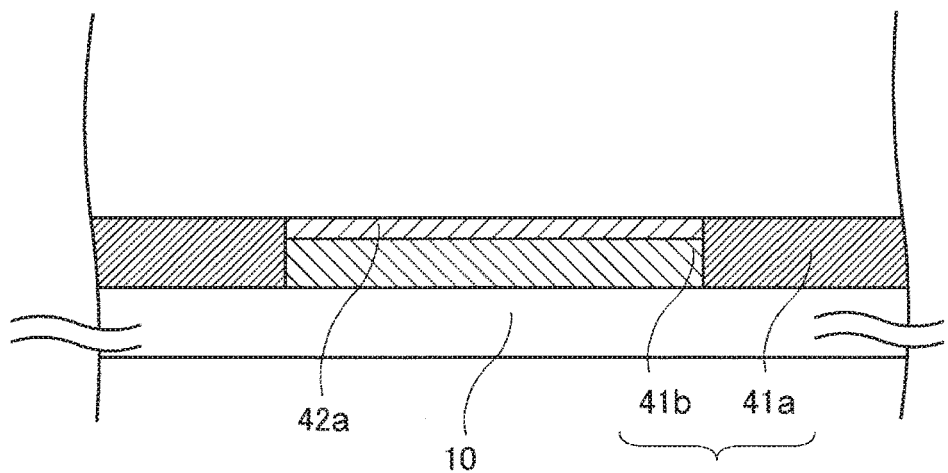

Next, the gate electrode 42a is formed in a predetermined gate electrode formation region on the first insulating layer 41. In the present embodiment, the electrode is formed by an application process. Specifically, the gate electrode formation region on the first insulating layer 41 is irradiated with energy of a specific wavelength to make the gate electrode formation region (irradiated portion 41b) lyophilic and form a recess portion therein (FIG. 23B). Then, a metal-containing solution is applied onto the first insulating layer 41 to form the gate electrode 42a in the gate electrode formation region (FIG. 23C).

Although depending on the composition of the hydrophilic/hydrophobic material, the film thickness of the recess portion of the first insulating layer 41 is thinner approximately by 5% to 30%, and preferably thinner approximately by 10% to 20% than the film thickness of a region, other than the recess portion, of the first insulating layer 41. In the present embodiment, the film thickness of the recess portion is thinner approximately by 10% to 30% than the film thicknesses of a region, other than the recess portion, of the first insulating layer 41.

Although not illustrated, after the formation of the gate electrode 42a, an entire surface of the substrate may be irradiated with energy of a specific wavelength from the first surface side to make a non-irradiated portion 41a of the first insulating layer 41 lyophilic and thinner. Thus, even if, for example, ultraviolet rays leak into the thin film transistor from the outside after the completion of steps, the hydrophilic/hydrophobic material neither changes its properties nor becomes thinner due to the ultraviolet rays, and thus, the obtained thin film transistor has higher stability.

Figure 24A:
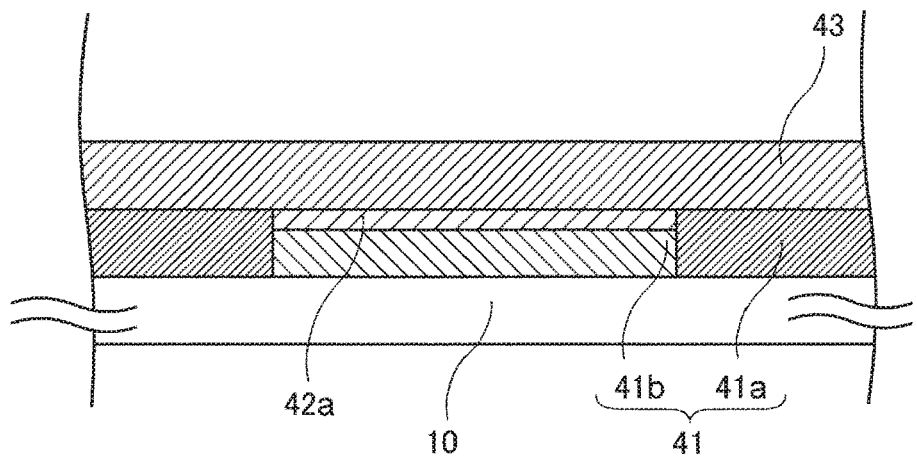
FIG. 24A to FIG. 24C are a cross-sectional view illustrating the method for manufacturing the thin film transistor according to the fourth embodiment of the present invention.

Next, the second insulating layer 43 is formed so as to cover the first insulating layer 41 and the gate electrode 42a (FIG. 24A).

Figure 24B:
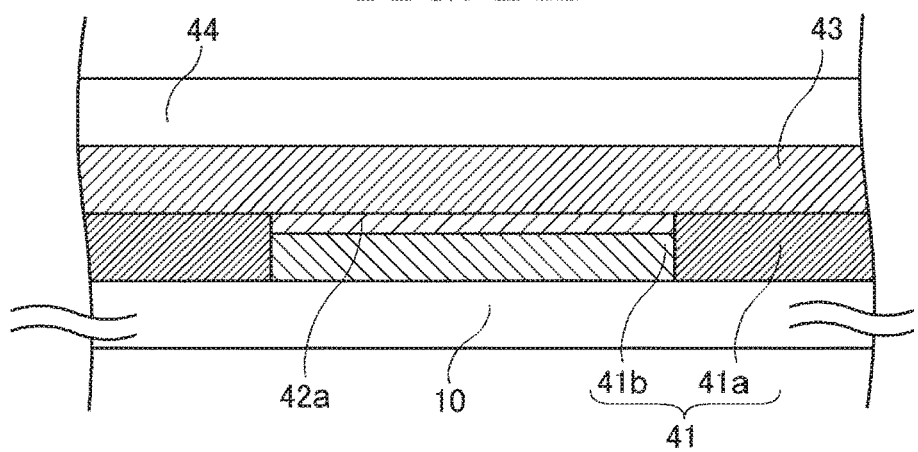

Next, the semiconductor layer 44 is formed on the second insulating layer 43 (FIG. 24B).

Figure 24C:
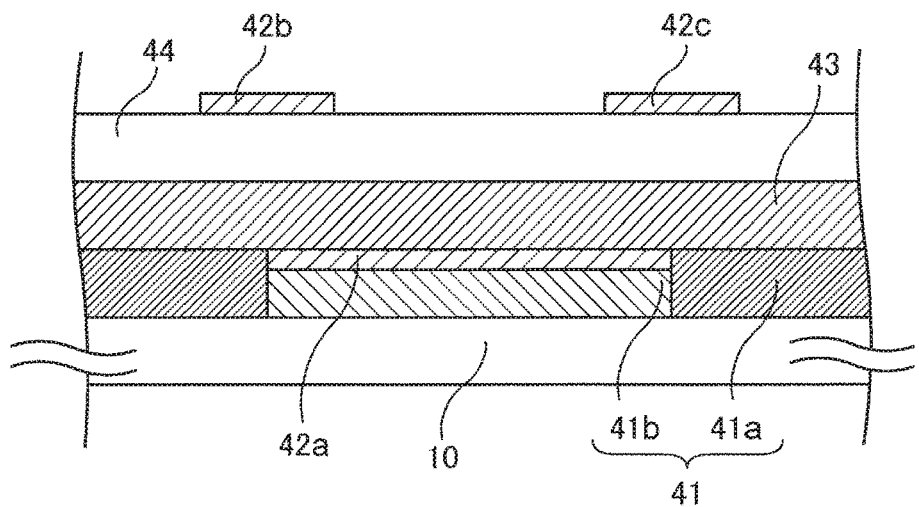

Next, the source electrode 42b and the drain electrode 43c are formed on the semiconductor layer 44 (FIG. 24C).

Fifth Embodiment

Figure 25:
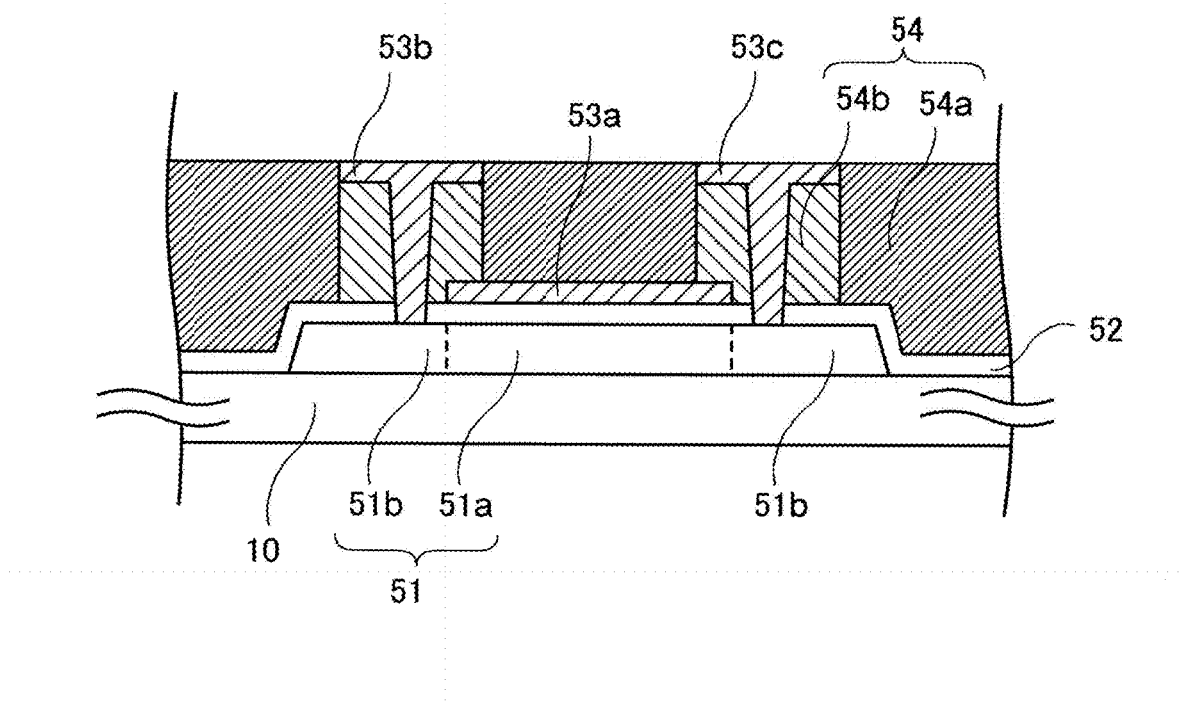
FIG. 25 is a cross-sectional view illustrating in detail the configuration of a MOS field effect transistor according to a fifth embodiment of the present invention.

Using FIG. 25, the configuration of a MOS field effect transistor according to a fifth embodiment of the present invention will be described in detail. FIG. 25 is a cross-sectional view illustrating the configuration of the MOS field effect transistor according to the fifth embodiment of the present invention.

Note that, as for materials and steps in the present embodiment that are the same as in the first embodiment and the second embodiment, duplicate description thereof will be omitted unless otherwise specifically noted.

As illustrated in FIG. 25, the MOS field effect transistor according to the present embodiment includes an active layer 51; a gate insulating film 52 provided so as to cover the active layer 51; a gate electrode 53a provided on the gate insulating film 52; an interlayer insulating film 54 provided so as to cover the gate electrode 53a; a contact opening portion 70 provided in the interlayer insulating film 54; and a source electrode 53b and a drain electrode 53c which are provided by filling the contact opening portion 70 with metal, in which the interlayer insulating film 54 is formed of a hydrophilic/hydrophobic material, and has a recess portion in a source electrode formation region and a drain electrode formation region. In the MOS field effect transistor according to the present embodiment, the source electrode 53b and the drain electrode 53c are provided so as to be located on the interlayer insulating film 54 formed of a hydrophilic/hydrophobic material and to be embedded therein. Therefore, unevenness caused by the source electrode 53b and the drain electrode 53c is suppressed, whereby the MOS field effect transistor is highly flat.

Figure 26A:
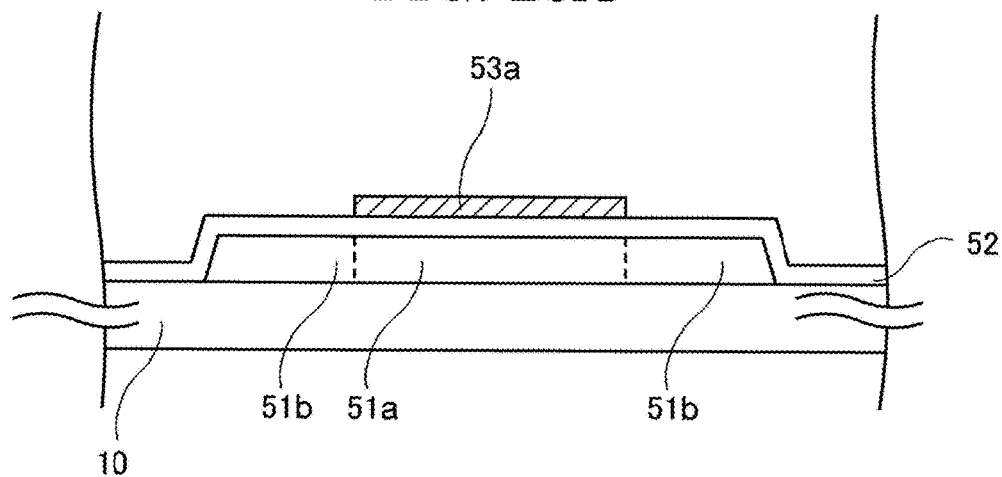
FIG. 26A to FIG. 26C are a cross-sectional view illustrating in detail a method for manufacturing the MOS field effect transistor according to the fifth embodiment of the present invention.

Using FIG. 26A, FIG. 26B, FIG. 26C, FIG. 27A, and FIG. 27B, a method for manufacturing the MOS field effect transistor according to the fifth embodiment of the present invention will be described in detail. FIG. 26A, FIG. 26B, FIG. 26C, FIG. 27A and FIG. 27B are cross-sectional views illustrating the method for manufacturing the MOS field effect transistor according to the fifth embodiment of the present invention. In the present embodiment, first, the insulating layer 52 which functions as a gate insulating film is formed on the active layer 51, and the gate electrode 53a is formed on the insulating layer 52 which functions as a gate insulating film (FIG. 26A). As the active layer 51, polycrystalline silicon or single crystal silicon may be used. The active layer 51 may be a bulk silicon substrate or may be an SOI substrate. Next, a diffusion layer 51b is formed in the active layer 51. Using the gate electrode 51 as a mask, an n-type diffusion layer 51b can be formed by doping with phosphorus.

Figure 26B:
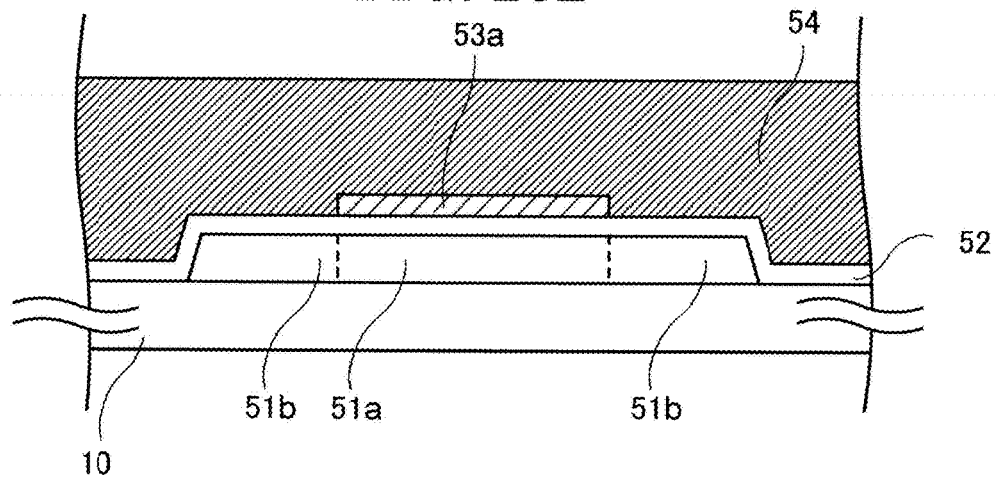

Next, the interlayer insulating film 54 formed of a hydrophilic/hydrophobic material is formed so as to cover the gate electrode 53a (FIG. 26B).

Figure 26C:
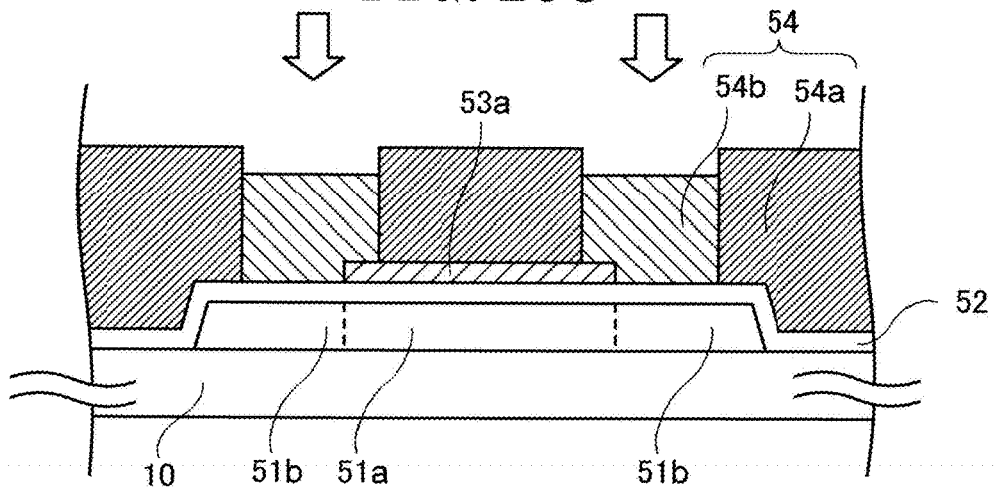

Next, the source electrode formation region and the drain electrode formation region on the interlayer insulating film 54 are irradiated with energy of a specific wavelength to form a recess portion in the source electrode formation region and the drain electrode formation region (FIG. 26C).

Figure 27A:
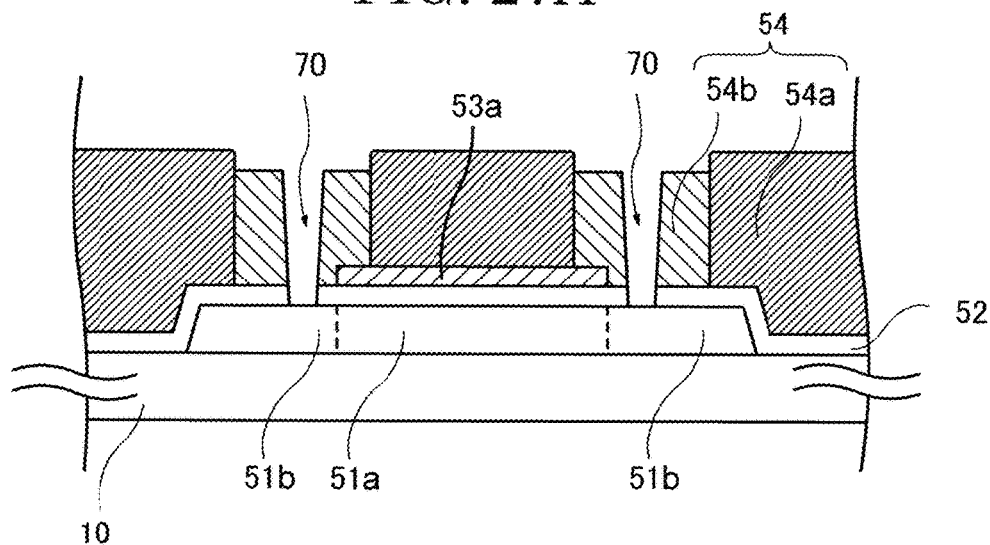
FIG. 27A and FIG. 27B are a cross-sectional view illustrating in detail the method for manufacturing the MOS field effect transistor according to the fifth embodiment of the present invention.

Next, the contact opening portion 70 is formed so as to penetrate the interlayer insulating film 54 and the insulating layer 52, thereby resulting in the diffusion layer 51b being exposed from a part of the recess portion (FIG. 27A). For the formation of the contact opening portion 70, photolithography is employed.

Figure 27B:
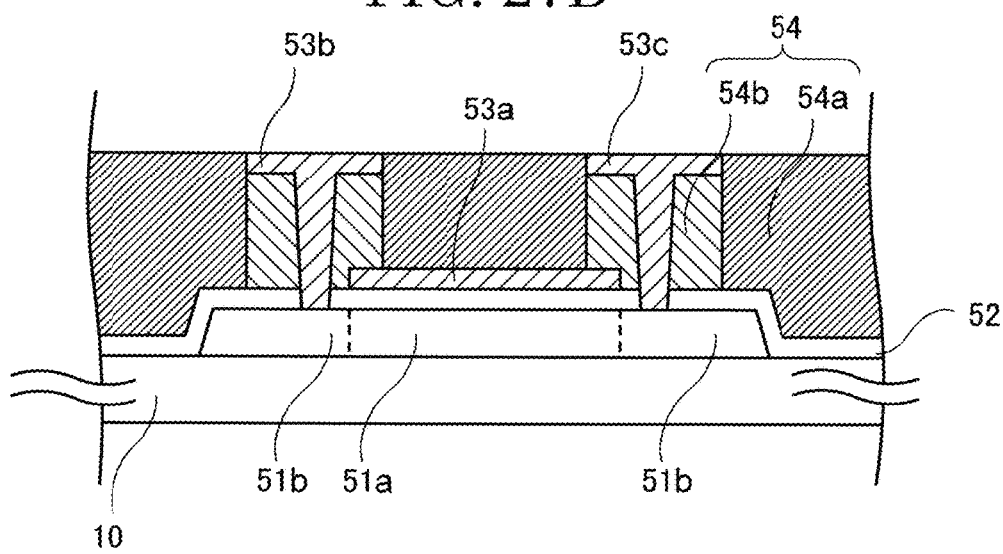

Next, a metal-containing solution is applied onto the interlayer insulating film 54 to fill the contact opening portion 70 with metal, whereby the recess portion is filled up to form the source electrode 53b and the drain electrode 53c (FIG. 27B).

The application process is not limited to a particular process, and for example, brush application, dipping, spraying, roll coating, rotating coating (spin coating), slit-die coating, bar coating, squeegee coating, flexo-printing, offset printing, ink-jet printing, and dispensing may be suitably employed. Among these, dipping, spraying, spin coating, slit-die coating, offset printing, ink-jet printing, and dispensing are preferable.

When the source electrode 53b and the drain electrode 53c are formed through a combination of a photolithographic step and the step of making a hydrophilic/hydrophobic material lyophilic and forming a recess portion by energy irradiation, the MOS field effect transistor according to the present embodiment is allowed to have a structure in which the source electrode 53b and the drain electrode 53c are embedded in the interlayer insulating film 54 as illustrated in FIG. 27B, whereby the obtained MOS field effect transistor is highly flat.

Sixth Embodiment

In the present embodiment, a process for forming a contact between the above-described electronic devices according to the present invention and a wiring, and a structure of the contact will be described using FIG. 28A, FIG. 28B, FIG. 28C, FIG. 28D, FIG. 28E, FIG. 28F, FIG. 29A, FIG. 29B, FIG. 29C, FIG. 29D, FIG. 29E, FIG. 29F, FIG. 30A, FIG. 30B, and FIG. 30C. FIG. 28A, FIG. 28B, FIG. 28C, FIG. 28D, FIG. 28E, FIG. 28F, FIG. 29A, FIG. 29B, FIG. 29C, FIG. 29D, FIG. 29E, FIG. 29F, FIG. 30A, FIG. 30B and FIG. 30C are cross-sectional views illustrating the step of forming a wiring contact according to a sixth embodiment of the present invention.

Figure 28A:
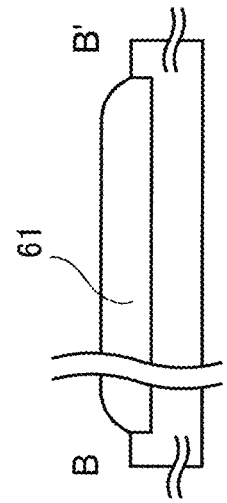
FIG. 28A to FIG. 28F are a cross-sectional view illustrating the step of forming a wiring contact according to a sixth embodiment of the present invention.
Figure 28B:
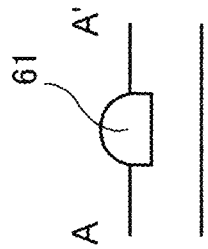
Figure 28C:
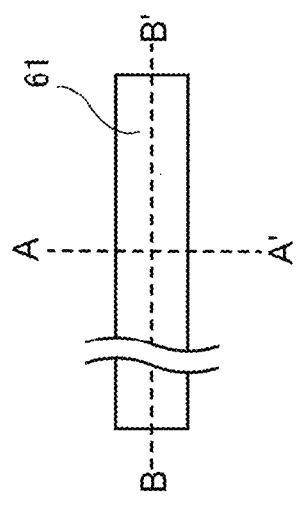

First, as illustrated in FIG. 28A, FIG. 28B, and FIG. 28C, a first wiring 61 is formed on a hydrophilic/hydrophobic material. A process for the wiring formation is the same as the electrode formation process for the thin film transistor in the above-described embodiments, and therefore, detailed description thereof will be omitted. In the present embodiment, a wiring is provided so as not to be perfectly embedded in a recess portion formed by the irradiation of the hydrophilic/hydrophobic material with energy, but to be in the form of a projection. A region other than the recess portion is lyophobic, and accordingly, a wiring material is less likely to overflow from the lyophilic recess portion, and furthermore, the material is less likely to remain in a region other than the recess portion, and therefore, a large amount of the film-forming material can be applied. Thus, the film can be formed thicker by the recess depth of the recess portion, and therefore, a low resistance wiring can be attained, and furthermore, even when the wiring material is used in large amounts, a wiring having excellent linearity and a fine pattern can be attained.

Figure 28D:
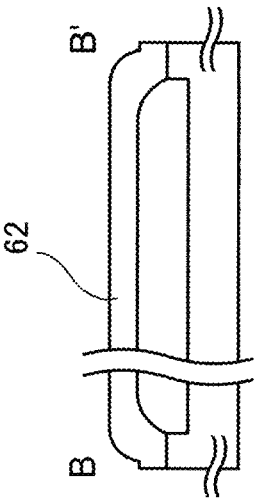
Figure 28E:
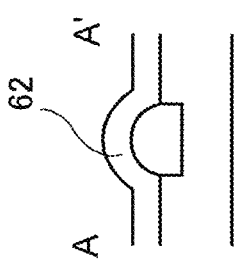
Figure 28F:
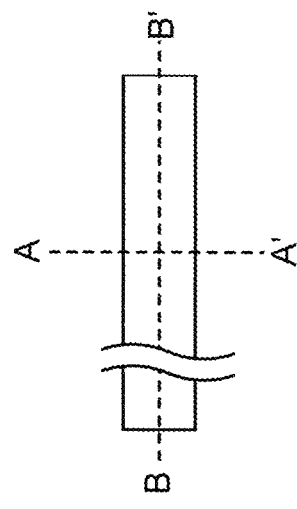

Next, as illustrated in FIG. 28D, FIG. 28E, and FIG. 28F, a hydrophilic/hydrophobic material 21 is formed.

Next, as illustrated in FIG. 29A, FIG. 29B, and FIG. 29C, the hydrophilic/hydrophobic material 21 is etched until a part of the first wiring 61 is exposed.

Next, as illustrated in FIG. 29D, FIG. 29E, and FIG. 29F, a region 63 in which a second wiring 64 is to be formed is irradiated with energy to make the region lyophilic and form a recess portion therein. As the recess portion is formed by energy irradiation here, the exposed portion of the first wiring 61 is expanded.

Next, as illustrated in FIG. 30A, FIG. 30B, and FIG. 30C, the second wiring 64 is formed.

The above-described step allows a contact between wirings to be formed without using a well-known photolithographic step. Thus, the number of production steps can be reduced.

Furthermore, although not illustrated, use can be made of a design by which a contact portion between the first wiring 61 and the second wiring 64 is made larger to reduce contact resistance. For example, around an intersection portion of wirings illustrated in FIG. 30 A, FIG. 30B, and FIG. 30C, the first wiring 61 may be in the form of a cross so as to protrude in the A-A' direction. Likewise, around the intersection portion of wirings, the second wiring 64 may be in the form of a cross so as to protrude in the B-B' direction.

In the present embodiment, the first wiring 61 and the second wiring 64 may differ in material. The first wiring 61 may be formed of, for example, the gate electrode 51 in the MOS field effect transistor, and the second wiring 64 may be formed of, for example, a gate signal line. For the first wiring, a metal material having a desired work function may be selected. For the second wiring 64, a metal material having a high conductivity may be selected. Such selections allow a design in which a gate delay due to the resistance of a gate signal line is considered.

Seventh Embodiment

The above-described electronic device according to the present invention can be used for display devices, and, without a photolithographic step, a color filter can be produced using a hydrophilic/hydrophobic material. Using FIG. 31A, FIG. 31B, FIG. 31C, FIG. 32A, FIG. 32B, FIG. 32C and FIG. 33, a method for manufacturing a color filter according to the present embodiment will be described in detail. FIG. 31A, FIG. 31B, FIG. 31C, FIG. 32A, FIG. 32B, FIG. 32C and FIG. 33 are cross-sectional views illustrating the method for manufacturing the color filter according to the present embodiment.

FIG. 34A, FIG. 34B, FIG. 34C, FIG. 35A, FIG. 35B, FIG. 35C and FIG. 36 are cross-sectional views illustrating a modification of the method for manufacturing the color filter according to the present embodiment.

Figure 31A:
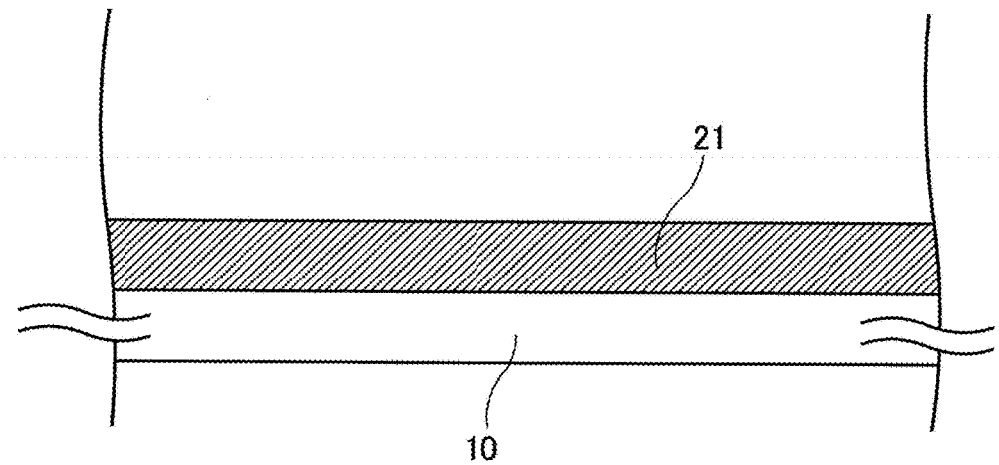
FIG. 31A to FIG. 31C are a cross-sectional view illustrating a method for manufacturing a color filter according to the seventh embodiment of the present invention.
Figure 31B:
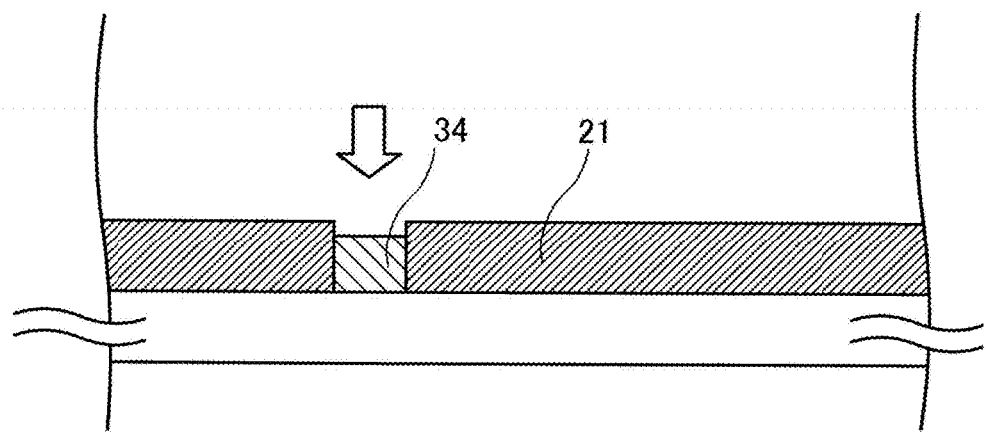
Figure 31C:
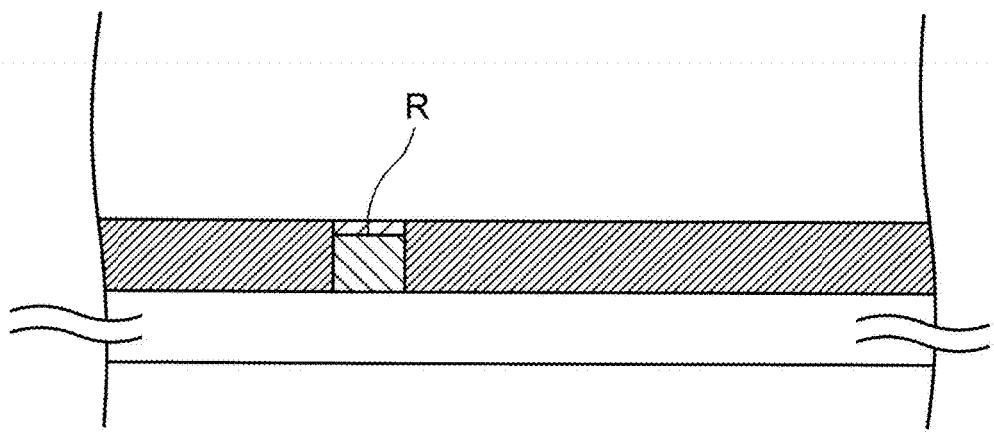

First, as illustrated in FIG. 31A, a hydrophilic/hydrophobic material 21 is formed on a substrate 10. Next, a predetermined region 34 in which a red color filter is to be formed is irradiated with energy to make the region lyophilic and form a recess portion therein (FIG. 31B). Subsequently, a solution containing a red color ink is applied onto the hydrophilic/hydrophobic material to form a red color filter R in the recess portion therein (FIG. 31C).

Figure 32A:
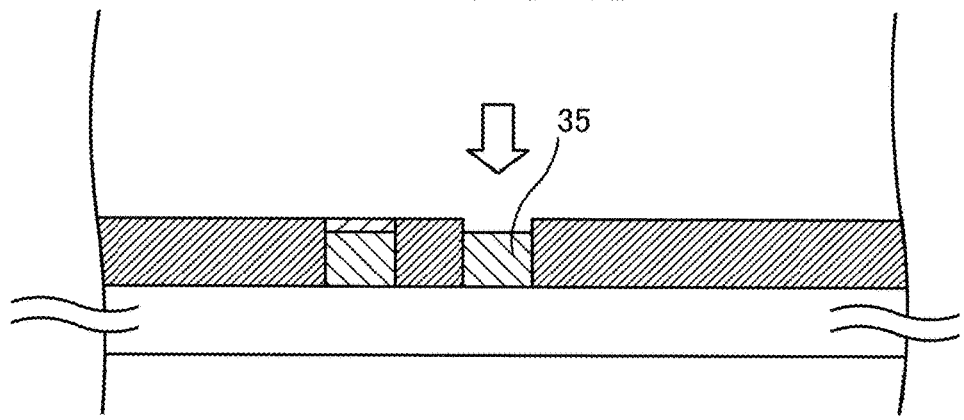
FIG. 32A to FIG. 32C are a cross-sectional view illustrating the method for manufacturing the color filter according to the seventh embodiment of the present invention.
Figure 32B:
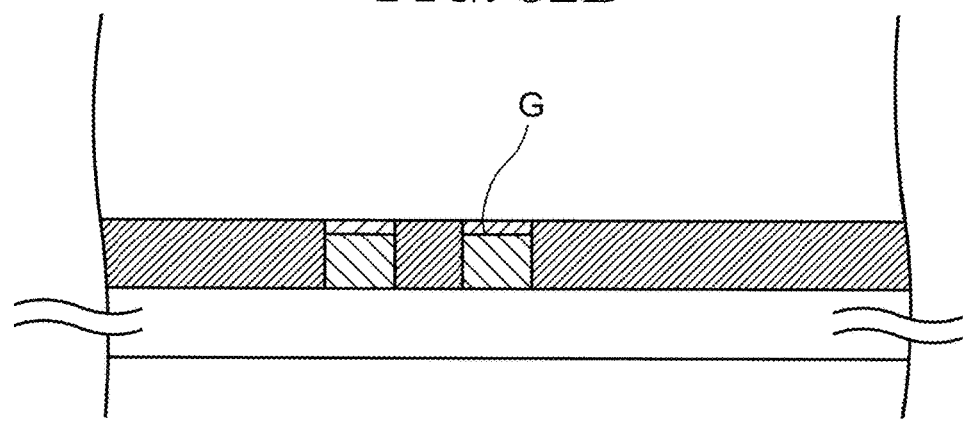

Next, a predetermined region 35 which is a pixel region adjacent to a pixel having the red color filter R formed therein and in which a green color filter is to be formed is irradiated with energy to make the region lyophilic and form a recess portion therein (FIG. 32A). Subsequently, a solution containing a green color ink is applied onto the hydrophilic/hydrophobic material to form a green color filter G in the recess portion (FIG. 32B).

Figure 32C:
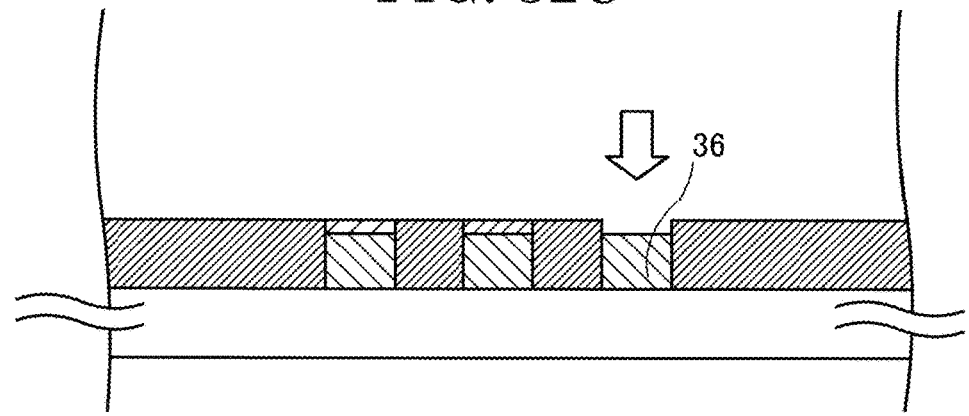
Figure 33:
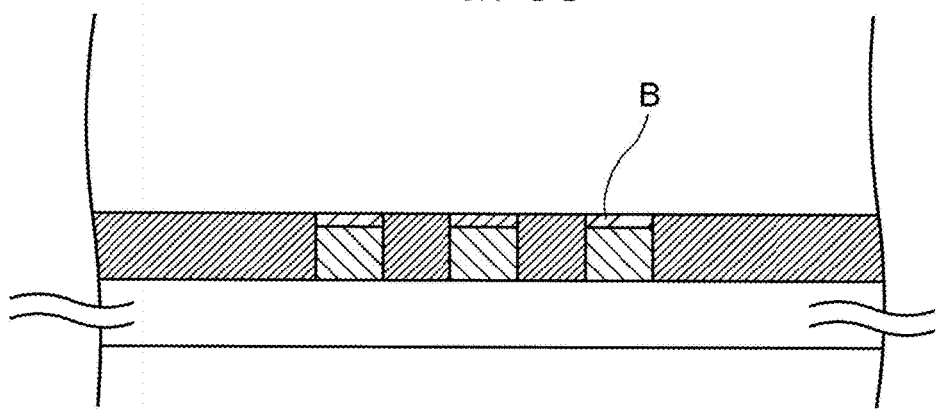
FIG. 33 is a cross-sectional view illustrating the method for manufacturing the color filter according to the seventh embodiment of the present invention.

Next, a predetermined region 36 which is a pixel region adjacent to a pixel having the green color filter G formed therein and in which a blue color filter is to be formed is irradiated with energy to make the region lyophilic and form a recess portion therein (FIG. 32C). Subsequently, a solution containing a blue color ink is applied onto the hydrophilic/hydrophobic material to form a blue color filter B in the recess portion (FIG. 33).

As a modification of the present embodiment, there may be added the step of forming a hydrophilic/hydrophobic material after the formation of each of the color filters as illustrated in FIG. 34A, FIG. 34B, FIG. 34C, FIG. 35A, FIG. 35B, FIG. 35C and FIG. 36.

Figure 34A:
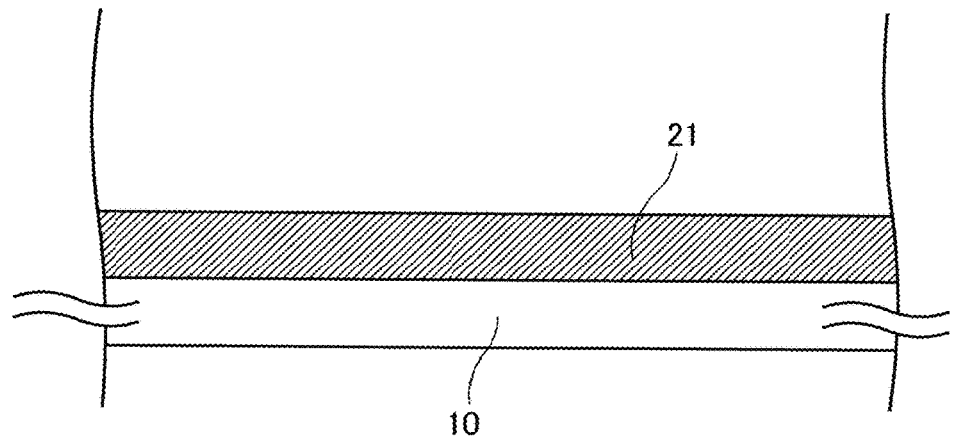
FIG. 34A to FIG. 34C are a cross-sectional view illustrating a modification of the method for manufacturing the color filter according to the seventh embodiment of the present invention.
Figure 34B:
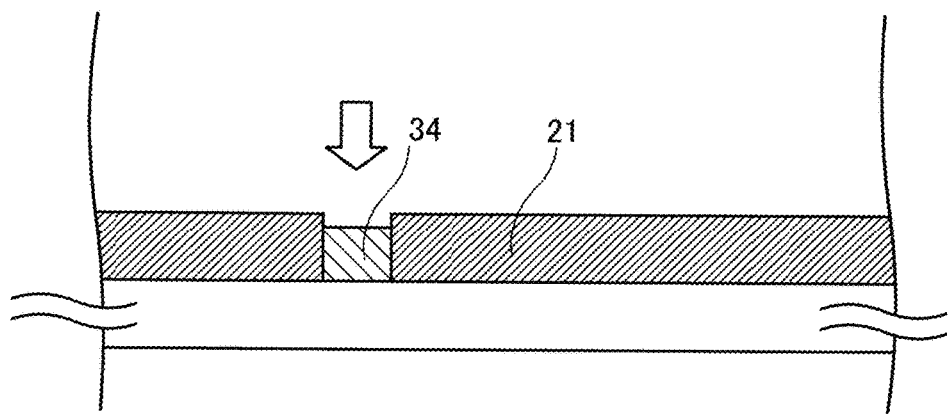
Figure 34C:
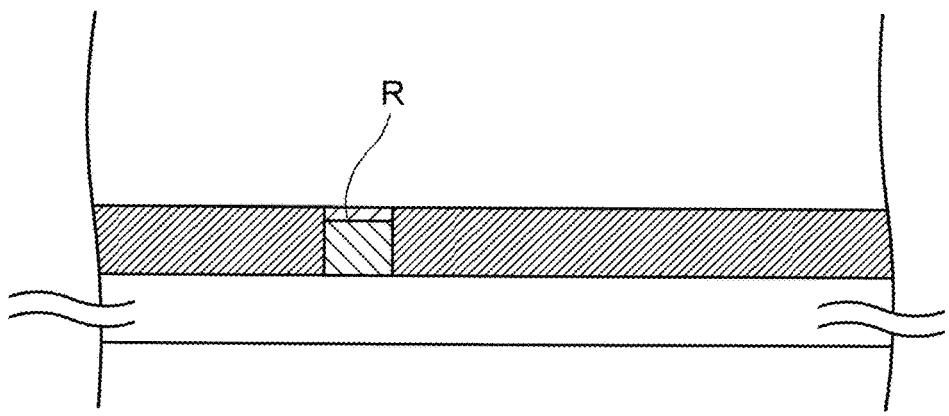

Specifically, as illustrated in FIG. 34A to FIG. 34C, a red color filter R is formed through the above-described step.

Figure 35A:
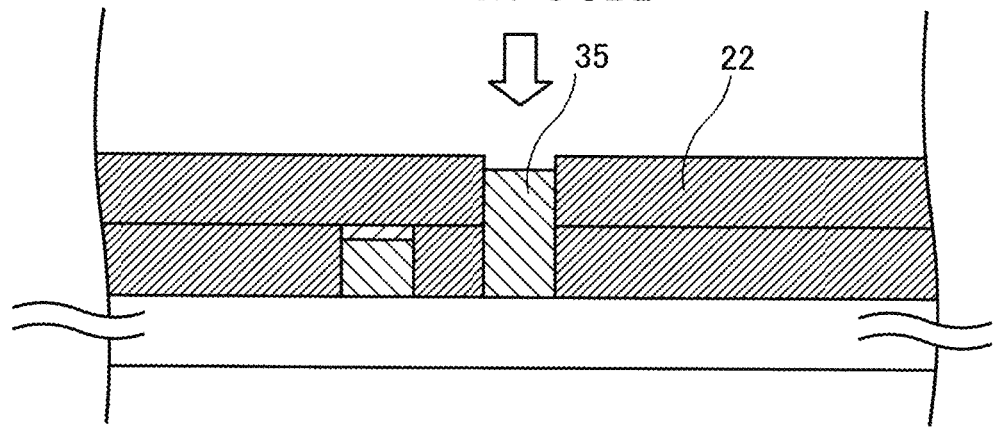
FIG. 35A to FIG. 35C are a cross-sectional view illustrating the modification of the method for manufacturing the color filter according to the seventh embodiment of the present invention.
Figure 35B:
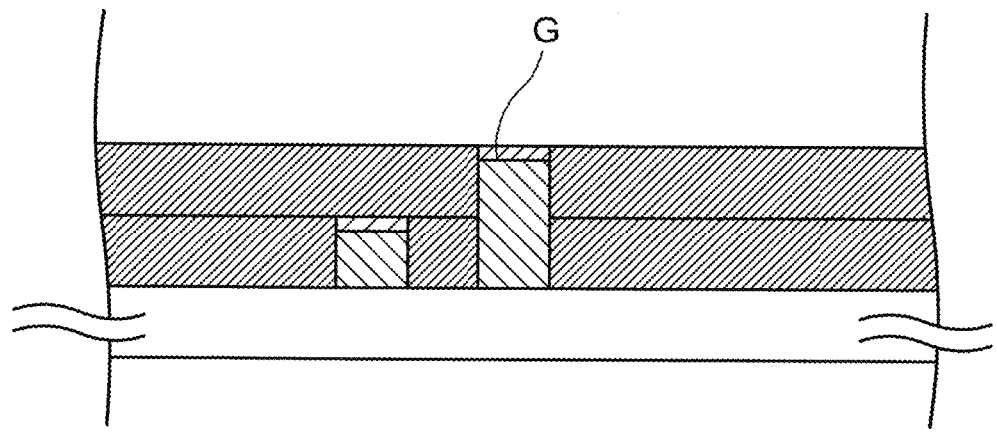

Next, a hydrophilic/hydrophobic material 22 is formed on an entire surface of the substrate 10 so as to cover the red color filter R, and a region 35 in which a green color filter G is to be formed is irradiated with energy to make the region lyophilic and form a recess portion therein (FIG. 35A). Subsequently, a solution containing a green color ink is applied onto the hydrophilic/hydrophobic material 22 to form a green color filter G in the recess portion (FIG. 35B).

Figure 35C:
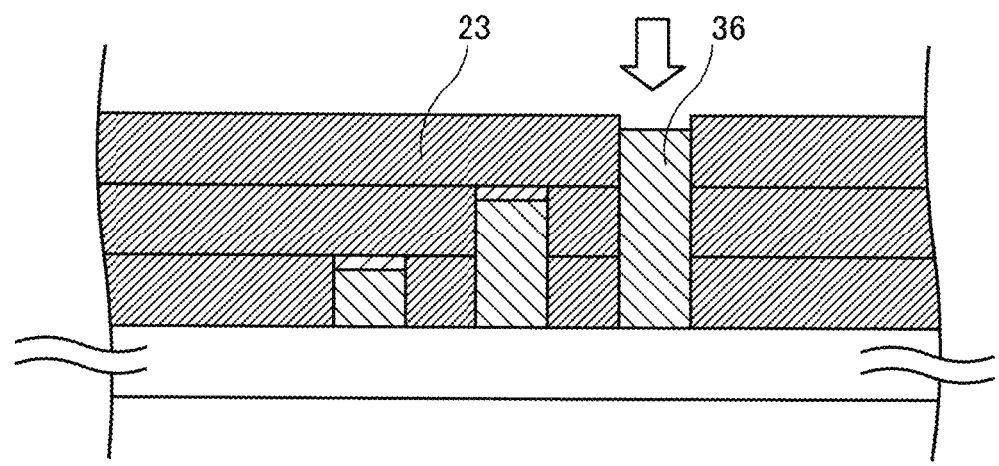
Figure 36:
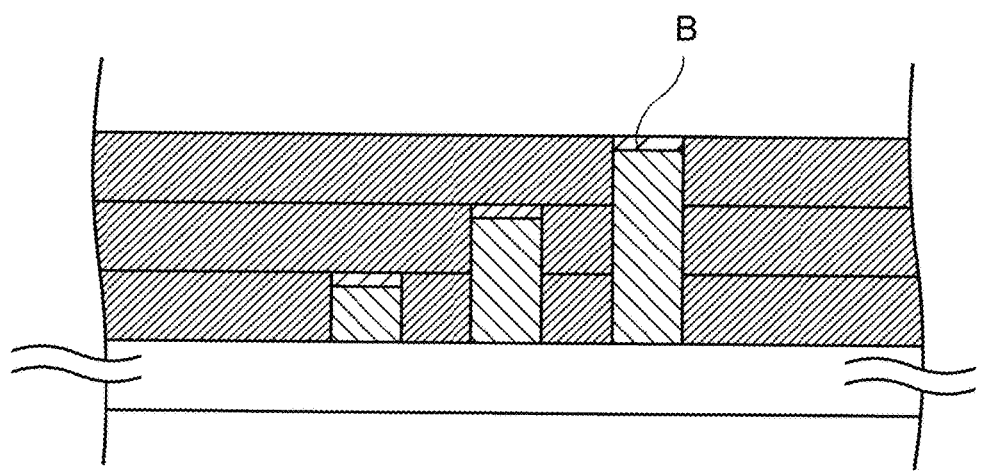
FIG. 36 is a cross-sectional view illustrating the modification of the method for manufacturing the color filter according to the seventh embodiment of the present invention.

Next, a hydrophilic/hydrophobic material 23 is formed on an entire surface of the substrate 10 so as to cover the green color filter G, and a region 36 in which a blue color filter B is to be formed is irradiated with energy to make the region lyophilic and form a recess portion therein (FIG. 35C). Subsequently, a solution containing a blue color ink is applied onto the hydrophilic/hydrophobic material 23 to form a green color filter B in the recess portion (FIG. 36).

Although not illustrated, in the above-described modification, after the formation of each of the hydrophilic/hydrophobic materials, an entire surface of the substrate 10 may be irradiated with energy to make each of the hydrophilic/hydrophobic materials lyophilic and thinner. Thus, even if, for example, ultraviolet rays leak into the color filter from the outside after the completion of steps, the hydrophilic/hydrophobic materials neither change their properties nor become thinner due to the ultraviolet rays, and thus, the obtained color filter has higher stability.

The process for forming the color filter is not limited to the above-described process, and the procedure and regions for ink spraying may be modified in various ways in accordance with the convenience of the process.

The color filters that exhibit their respective colors may be formed in various regions. As illustrated, the red color filter R, the green color filter G, and the blue color filter B may be formed at equal intervals, or may be formed so as to have different thicknesses in accordance with the characteristics of each of the color filters.

In the present invention, the use of the hydrophilic/hydrophobic material having a lyophilic recess portion formed therein allows a color filter to be formed without using a well-known photolithographic step. Thus, the number of production steps can be reduced.

Eighth Embodiment

Figure 37:
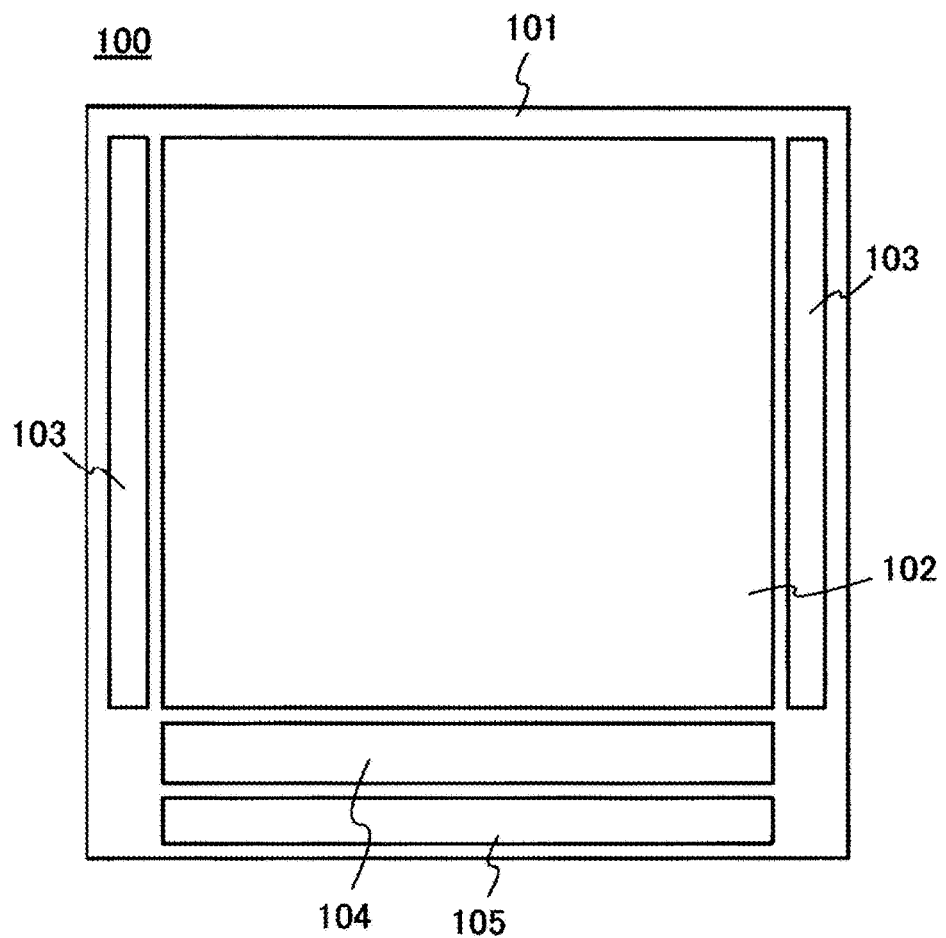
FIG. 37 is a diagram illustrating the entire configuration of a display device according to an eighth embodiment of the present invention.

The thin film transistor according to the present invention is applied also to a display device including a thin film transistor. Examples of the display device include liquid crystal displays and organic EL displays. FIG. 37 is a diagram illustrating the entire configuration of a display device 100 according to an eighth embodiment of the present invention. The display device 100 comprises a pixel unit (display region) 102, a scanning line driving circuit 103, a data line driving circuit 104, and a driver IC 105, each being formed on a substrate 101. The driver IC functions as a control unit that gives a signal to the scanning line driving circuit 103 and the data line driving circuit 104.

In the pixel unit 102 illustrated in FIG. 37, a plurality of pixels is arranged in the form of a matrix. Each of the pixels is given a data signal corresponding to image data from the data line driving circuit 104. When the data signal is given to a pixel electrode via a switching element provided in each of the pixels, an image corresponding to the image data can be displayed. As the switching element, the thin film transistor according to the present invention can be used.

Furthermore, in the case where the thin film transistor according to the present invention is a thin film transistor that uses a semiconductor, such as an oxide semiconductor or polycrystalline silicon, having a higher mobility than amorphous silicon, the thin film transistor according to the present invention can be applied also as a thin film transistor to be provided in a peripheral circuit, such as the scanning line driving circuit 103, the data line driving circuit 104, or the driver IC 105, each being illustrated in FIG. 37. Furthermore, in this case, the thin film transistor to be provided in a peripheral circuit can be formed simultaneously with a thin film transistor provided in a pixel.

Ninth Embodiment

In recent years, channel devices, such as μ-TAS (Micro Total Analysis System), Lab-on-a-chip, and MEMS (Micro Electro Mechanical System), in which techniques for the formation of an element in a semiconductor substrate (semiconductor process) are applied to the formation of a channel (a channel for liquid and gas), have been studied and put to practical use. These channel devices have channels having a width of the order of micrometers inside a substrate (chip) having a size of a few cm square, and have a structure in which such channels join each other or branch off.

A hydrophilic/hydrophobic material can be applied to such channel devices. For the formation of a channel, photolithographic steps have been commonly used. However, when a technique in which a hydrophilic/hydrophobic material is used and irradiated with energy to form a recess portion is applied, a channel can be formed without using a well-known photolithographic step, and accordingly, the number of production steps can be reduced. Furthermore, from the viewpoint of finer patterning, the formation of a pattern having a width of the order of micrometers is feasible as described in the embodiments above.

Hereinabove, there were described the thin film transistors and the method for manufacturing the same, the MOS field effect transistor and the method for manufacturing the same, the process for forming the contact between wirings, and the method for manufacturing the color filters, in which the hydrophilic/hydrophobic material according to the preferred embodiments of the present invention is used. However, the above-described embodiments are merely examples, and the technical scope of the present invention is not limited to these embodiments. Actually, various modifications can be made by those skilled in the art without departing from the scope of the present invention that is disclosed in the claims. Hence, such various modifications must be understood to be within the technical scope of the present invention.

What is claimed is:

1. A MOS field effect transistor, comprising:
an active layer including a diffusion layer;
a gate insulating film provided so as to cover the active layer;
a gate electrode provided on the gate insulating film;
an interlayer insulating film provided so as to cover the gate electrode and the gate insulating film;
a contact opening portion provided in the interlayer insulating film; and
a source electrode and a drain electrode that are provided by filling the contact opening portion with metal,
wherein the interlayer insulating film is formed of a hydrophilic/hydrophobic material, and includes a lyophilic region extending in a thickness direction of the interlayer insulating film and a lyophobic region surrounding the lyophilic region;
wherein a film thickness of the lyophilic region is thinner than a film thickness of the lyophobic region;
wherein the interlayer insulating film has a recess portion in which a surface of the lyophilic region is recessed from a surface of the lyophobic region;
wherein the contact opening portion is provided in the lyophilic region to expose the diffusion layer, and
wherein the source electrode and the drain electrode are in contact with the lyophilic region and provided so as to fill the recess portion.

* * * * *